(12) United States Patent
Meade et al.

(10) Patent No.: US 12,014,962 B2
(45) Date of Patent: Jun. 18, 2024

(54) SYSTEMS AND METHODS FOR WAFER-LEVEL PHOTONIC TESTING

(71) Applicant: Ayar Labs, Inc., Santa Clara, CA (US)

(72) Inventors: Roy Edward Meade, Lafayette, CA (US); Anatol Khilo, Dublin, CA (US); Forrest Sedgwick, Berkeley, CA (US); Alexandra Wright, Oakland, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 18/346,555

(22) Filed: Jul. 3, 2023

(65) Prior Publication Data

US 2023/0343655 A1    Oct. 26, 2023

Related U.S. Application Data

(63) Continuation of application No. 17/079,357, filed on Oct. 23, 2020, now Pat. No. 11,694,935.

(60) Provisional application No. 62/926,388, filed on Oct. 25, 2019.

(51) Int. Cl.
| | |
|---|---|
| H01L 21/66 | (2006.01) |
| G01R 31/3185 | (2006.01) |
| G02B 6/12 | (2006.01) |
| G02B 6/13 | (2006.01) |
| H04B 10/073 | (2013.01) |
| F21V 8/00 | (2006.01) |
| H04B 10/50 | (2013.01) |

(52) U.S. Cl.
CPC ...... *H01L 22/30* (2013.01); *G01R 31/318511* (2013.01); *G02B 6/12* (2013.01); *G02B 6/13* (2013.01); *H04B 10/0731* (2013.01); *G02B 6/0028* (2013.01); *H04B 10/503* (2013.01)

(58) Field of Classification Search
None
See application file for complete search history.

(56) References Cited

U.S. PATENT DOCUMENTS

| | | | | |
|---|---|---|---|---|
| 9,459,177 | B1 * | 10/2016 | Dong | G02B 6/124 |
| 9,690,042 | B2 * | 6/2017 | Kim | H01L 21/762 |
| 10,012,798 | B2 * | 7/2018 | Barwicz | G02B 6/30 |
| 10,145,758 | B2 * | 12/2018 | Traverso | G02B 6/305 |
| 10,330,875 | B2 * | 6/2019 | Fini | G02B 6/4246 |
| 10,359,567 | B2 * | 7/2019 | Novack | G01R 31/308 |

(Continued)

*Primary Examiner* — Jerry Rahll
(74) *Attorney, Agent, or Firm* — Penilla IP, APC

(57) ABSTRACT

A semiconductor wafer includes a semiconductor chip that includes a photonic device. The semiconductor chip includes an optical fiber attachment region in which an optical fiber alignment structure is to be fabricated. The optical fiber alignment structure is not yet fabricated in the optical fiber attachment region. The semiconductor chip includes an in-plane fiber-to-chip optical coupler positioned at an edge of the optical fiber attachment region. The in-plane fiber-to-chip optical coupler is optically connected to the photonic device. A sacrificial optical structure is optically coupled to the in-plane fiber-to-chip optical coupler. The sacrificial optical structure includes an out-of-plane optical coupler configured to receive input light from a light source external to the semiconductor chip. At least a portion of the sacrificial optical structure extends through the optical fiber attachment region.

20 Claims, 25 Drawing Sheets

(56) References Cited

U.S. PATENT DOCUMENTS

| | | | |
|---|---|---|---|
| 10,845,555 B2* | 11/2020 | Fini | G02B 6/4216 |
| 11,137,548 B2* | 10/2021 | Fini | G02B 6/30 |
| 11,163,120 B2* | 11/2021 | Ardalan | G02B 6/43 |
| 2014/0346532 A1* | 11/2014 | Kim | H01L 21/762 |
| | | | 438/24 |
| 2016/0290891 A1* | 10/2016 | Feng | H01L 22/10 |
| 2017/0082799 A1* | 3/2017 | Novack | G01R 31/308 |
| 2018/0003898 A1* | 1/2018 | Barwicz | G02B 6/34 |
| 2020/0033533 A1* | 1/2020 | Khanna | G02B 6/30 |

* cited by examiner (View A-A)

(View A-A)

(View A-A)

US 12,014,962 B2

SYSTEMS AND METHODS FOR WAFER-LEVEL PHOTONIC TESTING

CLAIM OF PRIORITY

This application is a continuation application under 35 U.S.C. 120 of prior U.S. Non-Provisional patent application Ser. No. 17/079,357, filed on Oct. 23, 2020, which claims priority under 35 U.S.C. 119(e) to U.S. Provisional Patent Application No. 62/926,388, filed on Oct. 25, 2019. The disclosure of each above-mentioned patent application is incorporated herein by reference in its entirety for all purposes.

BACKGROUND

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient photonic devices manufactured within semiconductor chips at different nodes within the optical data network. In this regard, it is necessary to test photonic devices and associated electronic devices within the semiconductor chips prior to deploying the semiconductor chips for use in the optical data network. It is within this context that the present invention arises.

SUMMARY

In an example embodiment, a semiconductor wafer is disclosed. The semiconductor wafer includes a semiconductor chip that includes a photonic device. The semiconductor chip includes an optical fiber attachment region in which an optical fiber alignment structure is to be fabricated. The optical fiber alignment structure is not yet fabricated in the optical fiber attachment region. The semiconductor chip includes an in-plane fiber-to-chip optical coupler positioned at an edge of the optical fiber attachment region. The in-plane fiber-to-chip optical coupler is optically connected to the photonic device. The semiconductor wafer also includes a sacrificial optical structure optically coupled to the in-plane fiber-to-chip optical coupler. The sacrificial optical structure includes an out-of-plane optical coupler configured to receive input light from a light source external to the semiconductor chip. At least a portion of the sacrificial optical structure extends through the optical fiber attachment region.

In an example embodiment, a method is disclosed for fabricating a semiconductor chip. The method includes fabricating a semiconductor chip on a semiconductor wafer. The semiconductor chip includes a photonic device. The semiconductor chip also includes an optical fiber attachment region in which an optical fiber alignment structure is to be fabricated. The semiconductor chip also includes an in-plane fiber-to-chip optical coupler positioned at an edge of the optical fiber attachment region. The in-plane fiber-to-chip optical coupler is optically connected to the photonic device. The method also includes fabricating a sacrificial optical structure on the semiconductor wafer. The sacrificial optical structure is optically coupled to the in-plane fiber-to-chip optical coupler. The sacrificial optical structure includes an out-of-plane optical coupler configured to receive input light from a light source external to the semiconductor chip. At least a portion of the sacrificial optical structure extends through the optical fiber attachment region. The sacrificial optical structure is fabricated on the semiconductor wafer before the optical fiber alignment structure is fabricated in the optical fiber attachment region.

Other aspects and advantages of the invention will become more apparent from the following detailed description, taken in conjunction with the accompanying drawings, illustrating by way of example the present invention.

DETAILED DESCRIPTION

Figure 1A:
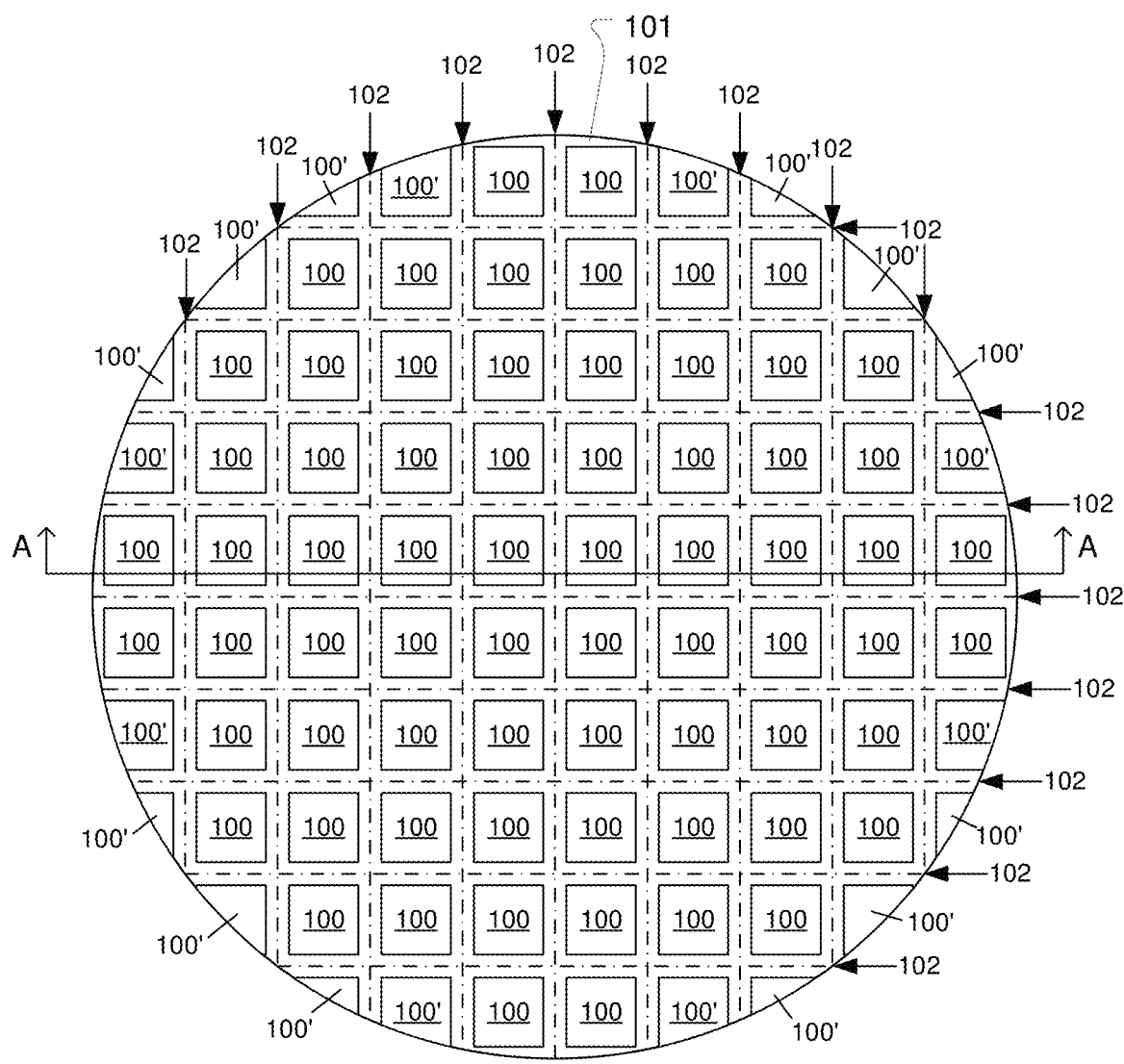
FIG. 1A shows a top view of an example wafer, in accordance with some embodiments.

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

Systems and associated methods are disclosed herein for enabling and performing wafer-level optical/photonic testing of a semiconductor chip within an intact semiconductor wafer before the intact semiconductor wafer is singulated/diced to release the semiconductor chips that are fabricated within the semiconductor wafer. The term "semiconductor chip" or "chip," as used herein, refers to any type of semiconductor chip (or semiconductor die), including thin-BOX SOI chips, thick-BOX SOI chips, and/or bulk CMOS chips, among other types of semiconductor chips. In various embodiments, the chip referred to herein is an integrated circuit chip/die, and/or essentially any other electronic chip/die, and/or a photonic chip/die, and/or an electro-optical chip/die, and/or any other photonic-equipped chip/die to which one or more optical fibers is/are intended to be optically coupled upon packaging and or installation of the chip to provide for transmission of light from the optical fiber(s) to the chip, and/or vice-versa. The optical coupling of optical fiber(s) to the chip is referred to herein as fiber-to-chip coupling. It should be understood that the term chip, as used herein, refers to both a semiconductor chip and a semiconductor die. Also, in various embodiments the chip referred to herein includes electrical devices, optical devices, electro-optical devices, and/or thermo-optical devices, and corresponding electrical and optical circuitry.

Also, for ease of description, the term "semiconductor wafer" or "wafer," as used herein, refers to any type of semiconductor wafer or semiconductor panel within which one or more chip(s) is/are manufactured. It should be understood that in various embodiments the wafer can include different numbers of chips. Also, in various embodiments, the wafer can have various geometric shapes, such as a circular disc shape or a rectangular slab shape, among others.

Also, the term "light," as used herein, refers to electromagnetic radiation within a portion of the electromagnetic spectrum that is usable by optical data communication systems. The term "wavelength," as used herein, refers to the wavelength of electromagnetic radiation. In some embodiments, the portion of the electromagnetic spectrum that is usable by optical data communication systems includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum referred to herein as light can include wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum.

It should be understood that light may be confined to propagate in an optical waveguide, such as (but not limited to) an optical fiber and/or an optical waveguide within a planar lightwave circuit (PLC) of photonic device and/or photonic circuit within a chip. In some embodiments, the light is polarized. In some embodiments, the light is not polarized. In some embodiments, the light is continuous wave light, such as light generated by a laser. In some embodiments, the light is modulated light that conveys a digital data. In some embodiments, the light has a single wavelength, where the single wavelength refers to either essentially one wavelength or a narrow band of wavelengths that can be identified and processed by an optical data communication system as if it were a single wavelength.

In various silicon photonic devices used in the silicon photonics industry for optical data communication, one or more optical fiber(s) is/are coupled to a chip so that light (continuous wave (CW) light and/or modulated light) can be transmitted from the one or more optical fiber(s) to integrated photonic devices within the chip and/or transmitted from integrated photonic devices within the chip into the one or more optical fiber(s). The integrated photonic devices, e.g., silicon photonic devices, among others, that are fabricated in chips within wafers need to be tested. Embodiments are disclosed herein for enabling wafer-level photonic testing, which is required to enable Known-Good-Die (KGD) determination. KGD is required for both Single Die Packages and Multi-Chip Packaging. Optical grating couplers and associated optical waveguides to enable light input/output to/from the integrated photonic devices are provided to enable photonic testing of semiconductor chips during the wafer fabrication process. The optical grating couplers are configured to not interfere with the operation of the integrated photonic devices once the wafer is singulated and the chips are packaged. More specifically, example embodiments are disclosed herein for implementing sacrificial optical vertical grating couplers and associated optical waveguides for use in testing photonic circuits of integrated photonic devices during the wafer fabrication process. Once the integrated photonic device testing and fabrication processes are complete, the sacrificial optical vertical grating couplers and associated sacrificial optical waveguides are removed and/or modified so that photonic circuits within the chips can use optical edge coupling in their corresponding package.

Two common ways to couple light between an optical fiber and an integrated photonic circuit of a chip are (1) to use an in-plane (edge) optical fiber coupler, and (2) to use an out-of-plane optical fiber coupler. To use the in-plane (edge) optical fiber coupler, the optical fiber is oriented parallel to the surface of the chip, and the light beam from the optical fiber is directed at an optical waveguide structure close to the edge of the chip. To use the out-of-plane optical fiber coupler, the optical fiber is oriented at an angle to the surface of the chip, and the light beam from the optical fiber is pointed at an optical structure on the chip which redirects the light into an optical waveguide within the chip. In some embodiments, out-of-plane optical fiber couplers are implemented as optical grating couplers. It should be understood, however, that the embodiments disclosed herein are not limited to implementation of out-of-plane optical fiber couplers as optical grating couplers. For example, in some embodiments, other types out-of-plane optical fiber couplers can be used, such as prism couplers, among others. For chips which use the in-plane (edge) optical fiber coupling approach, wafer-level photonic testing can be problematic because the edges of the chip are not accessible until the chip is singulated from the wafer as an individual chip.

Various embodiments are disclosed herein for structures and methods to enable wafer-level photonic testing of integrated photonic circuits in chips that use the in-plane (edge) optical coupling approach with corresponding in-plane (edge) optical fiber couplers during normal operation. In some embodiments, one or more sacrificial optical structures are formed within the wafer for use in coupling light into and/or out of integrated photonic circuit(s) of the chip fabricated on the wafer while the wafer is still intact (before singulation of the wafer to release the individual chips). The sacrificial optical structures are formed and positioned on the wafer so that they can be removed and/or modified during further processing of the wafer after wafer-level photonic testing of the chip is completed. In this manner, the sacrificial optical structures do not interfere with normal functioning of the chip after the chip is singulated from the wafer. Also, in some embodiments, the sacrificial optical structures are formed and positioned on the wafer to enable wafer-level photonic testing of a chip that uses in-plane (edge) optical fiber couplers during normal operation, such that when the wafer-level photonic testing is completed and the chip is singulated from the wafer, the sacrificial optical structures are removed and/or modified and the chip is configured for in-plane (edge) optical fiber coupling.

Figure 1B:
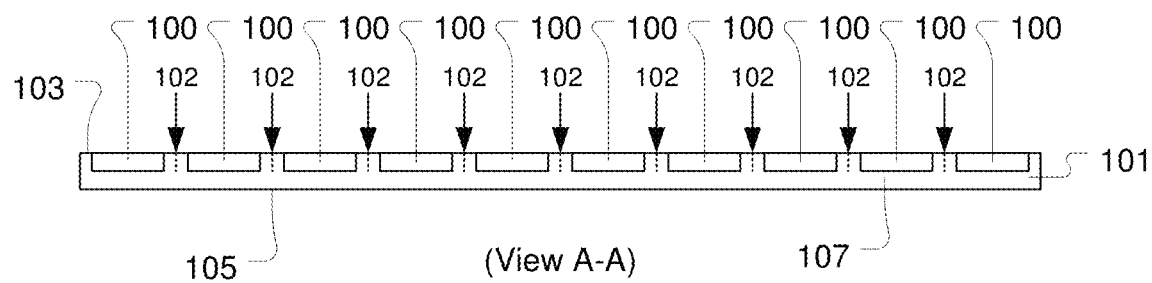
FIG. 1B shows a vertical cross-section of the wafer, corresponding to View A-A as referenced in FIG. 1A, in accordance with some embodiments.

FIG. 1A shows a top view of an example wafer 101, in accordance with some embodiments. The wafer 101 includes an array of chips 100. Each chip 100 is fabricated within the vertical thickness of the wafer 101 corresponding to a footprint of the chip 100 on the wafer 101. The chips 100 are separated from each other by scribe line regions, also referred to as kerf regions and/or dicing channels, which are present along the dashed lines 102. There are also a number of partially formed chips 100' located at and around the radial periphery of the wafer 101. FIG. 1B shows a vertical cross-section of the wafer 101, corresponding to View A-A as referenced in FIG. 1A, in accordance with some embodiments. The wafer 101 has a top surface 103 and a bottom surface 105. The wafer 101 includes a substrate 107 (or handle in some embodiments) upon which the chips 100 and partial chips 100' are fabricated. The portion of the substrate 107 below a given chip 100 belongs to the given chip 100. Also, the portion of the substrate 107 below a given partial chip 100' belongs to the given partial chip 100'.

FIG. 1A represents the wafer 101 in an intact state in which the substrate 107 is unbroken/uncut across the wafer 101. For ease of description, the wafer 101 in the intact state is referred to as an intact wafer. After fabrication of the chips 100 is complete, the wafer 100 is diced/singulated/cut/broken/etched along the scribe line regions corresponding to the dashed lines 102, to obtain the individual chips 100 as physically separate structures. For ease of description, dicing/singulating/cutting/breaking/etching of the wafer 101 along the scribe line regions to release the individual chips 100 from the intact wafer 101 is referred to as singulation of the chips 100 from the wafer 101. Various example embodiments are disclosed herein for fabricating sacrificial optical structures within the wafer 101 to enable wafer-level photonic testing of the photonic devices/circuits within the chips 100 with the wafer 101 in the intact state. In the various embodiments, the sacrificial optical structures are optically accessible through the top surface 103 of the wafer 101.

Figure 2A:
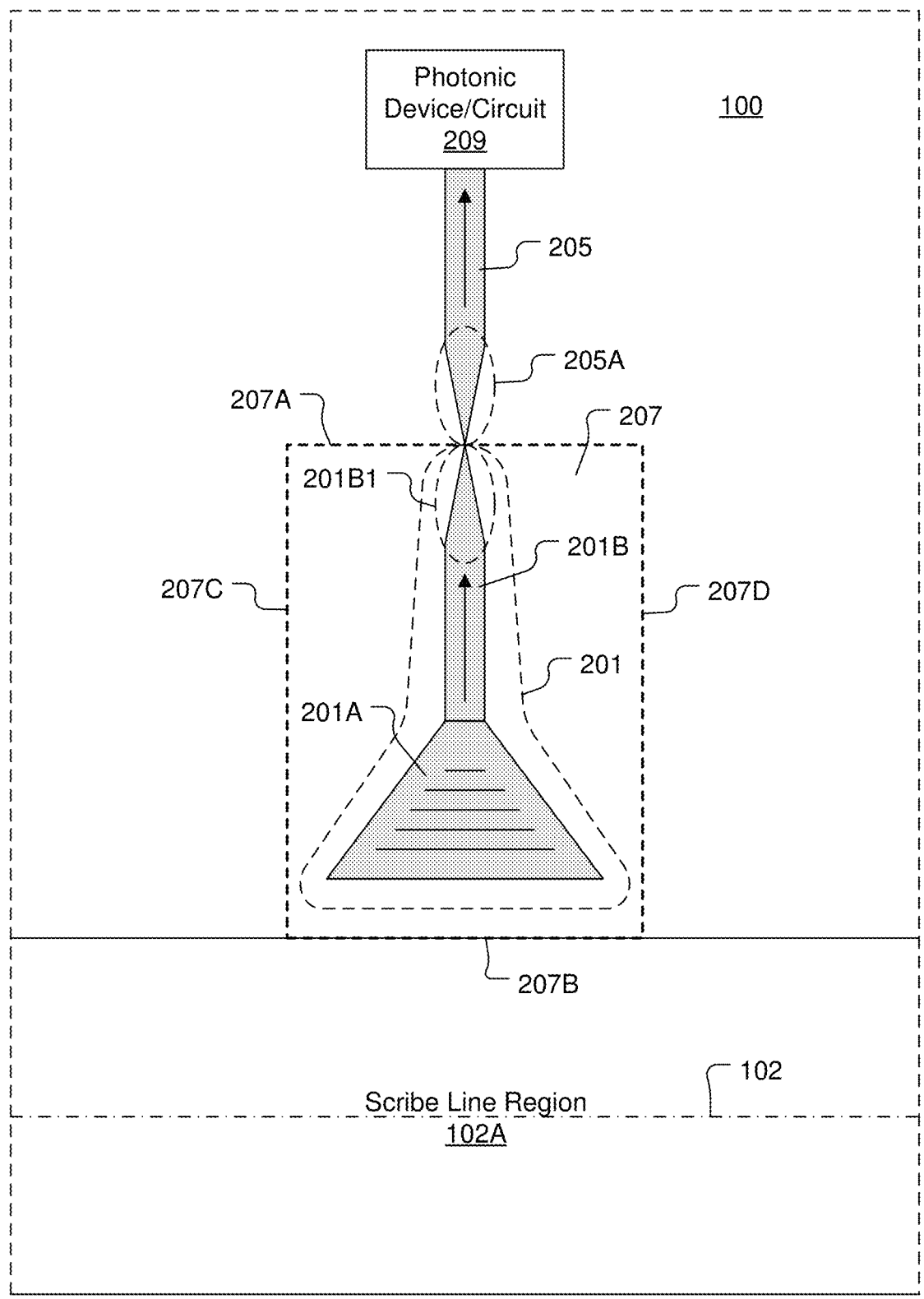
FIG. 2A shows an example implementation of a sacrificial optical structure on a chip within the wafer in the intact state to enable wafer-level photonic testing of the chip, in accordance with some embodiments.

FIG. 2A shows an example implementation of a sacrificial optical structure 201 on a chip 100 within the wafer 101 in the intact state to enable wafer-level photonic testing of the chip 100, in accordance with some embodiments. The sacrificial optical structure 201 is optically coupled to an in-plane (edge) fiber-to-chip optical coupler 205. The sacrificial optical structure 201 includes an out-of-plane fiber-to-chip optical coupler 201A and a corresponding optical waveguide 201B. The out-of-plane optical coupler 201A is configured to receive input light from a light source external to the semiconductor chip 100, i.e., external to the wafer 101. The optical waveguide 201B is positioned and configured to optically connect to the in-plane (edge) fiber-to-chip optical coupler 205 formed within the chip 100. Therefore, the sacrificial optical structure 201 is configured to couple light into the in-plane (edge) fiber-to-chip optical coupler 205 of the chip 100, with the chip 100 existing within the intact wafer 101. The optical waveguide 201B extends through the optical fiber attachment region 207 from the out-of-plane optical coupler 201A to the in-plane (edge) fiber-to-chip optical coupler 205. Light that is coupled into the out-of-plane fiber-to-chip optical coupler 201A of the sacrificial optical structure 201 is directed through the optical waveguide 201B and into the in-plane (edge) fiber-to-chip optical coupler 205, which is connected to one or more photonic circuit(s) and/or photonic circuit(s) 209 within the chip 100.

Figure 2B:
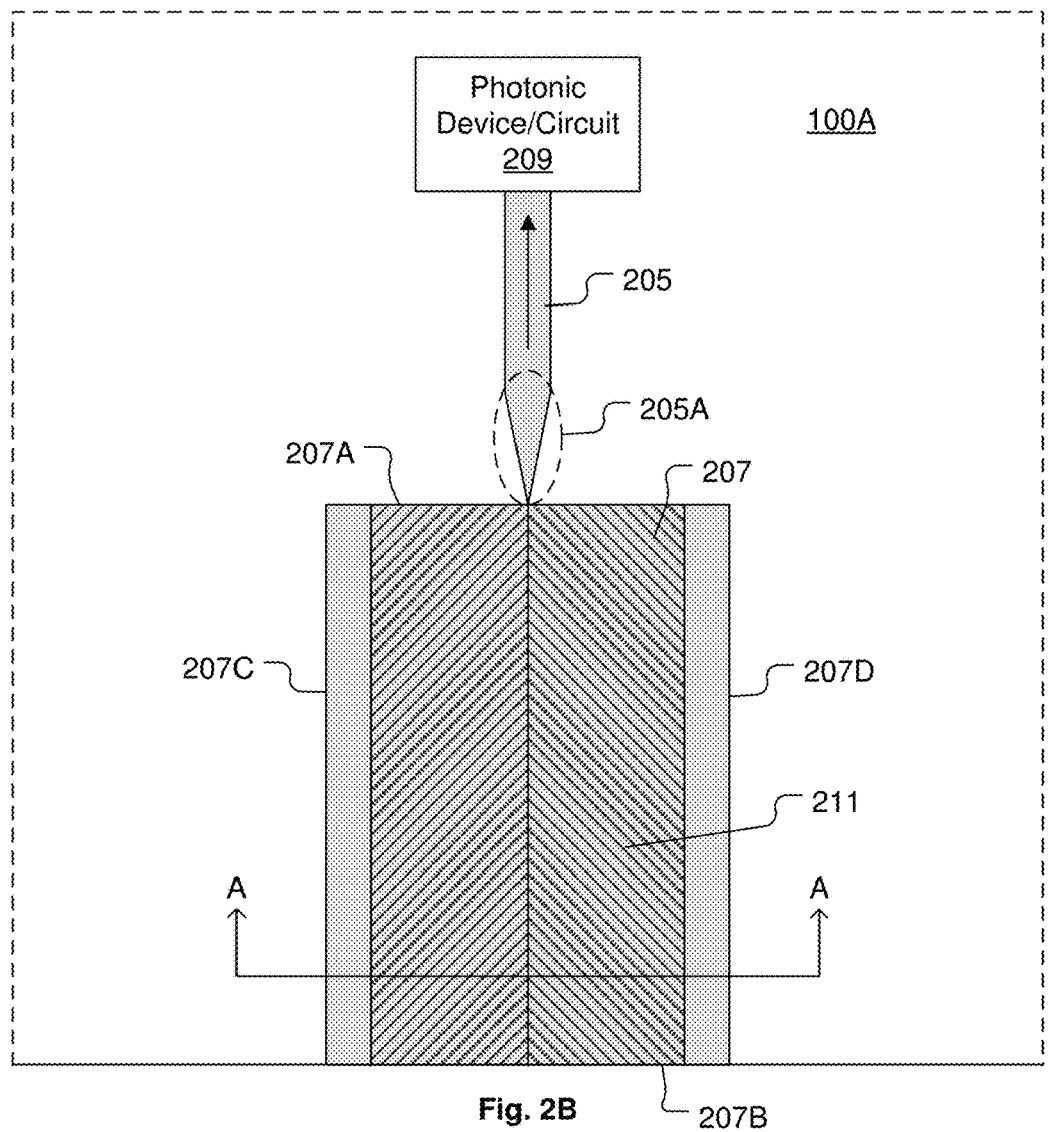
FIG. 2B shows the chip of FIG. 2A after formation of the optical alignment structure and singulation of the chip from the wafer, in accordance with some embodiments.

FIG. 2B shows a singulated chip 100A corresponding to the chip 100 after singulation of chip 100 from the wafer 101, in accordance with some embodiments. The sacrificial optical structure 201 is formed within an optical fiber attachment region 207 of the chip 100 in which an optical fiber alignment structure 211 is to be later fabricated. The optical fiber attachment region 207 of the chip 100 includes an interior edge 207A, an exterior edge 207B, a first lateral edge 207C, and a second lateral edge 207D. The in-plane (edge) fiber-to-chip optical coupler 205 of the chip 100 is positioned at the interior edge 207A of the optical fiber attachment region 207. The exterior edge 207B of the optical fiber attachment region 207 is adjacent to a scribe line region 102A of the wafer 101. The first lateral edge 207C of the optical fiber attachment region 207 extends between a first end of the interior edge 207A and a first end of the exterior edge 207B. The second lateral edge 207D of the optical fiber attachment region 207 extends between a second end of the interior edge 207A and a second end of the exterior edge 207B. It should be understood that at least a portion of the sacrificial optical structure 201 extends through the optical fiber attachment region 207. In the example embodiment of FIG. 2A, an entirety of the sacrificial optical structure 201 is formed within the optical fiber attachment region 207.

Figure 2C:
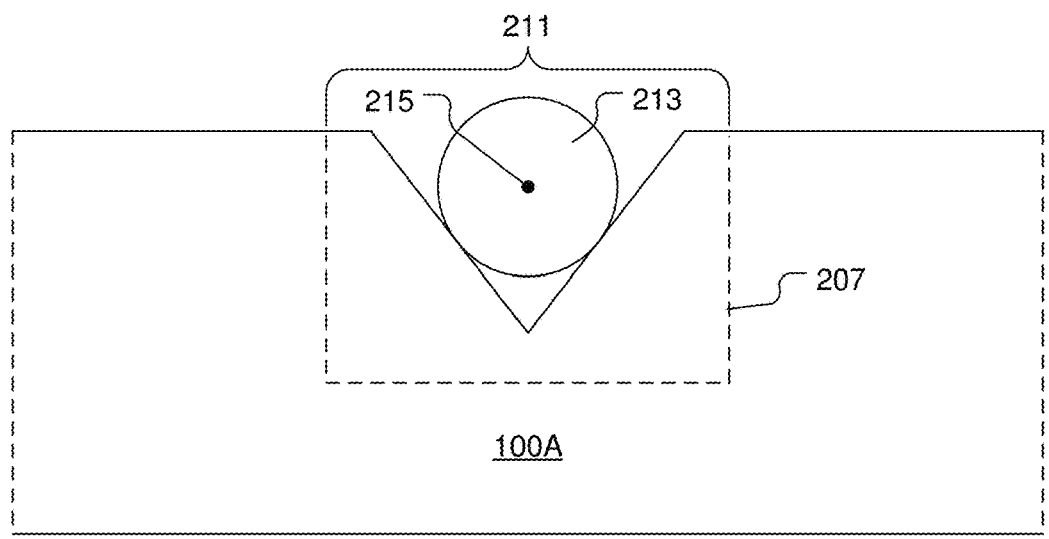
FIG. 2C shows a vertical cross-section view through the optical fiber alignment structure of the singulated chip, referenced as View A-A in FIG. 2B, in accordance with some embodiments.

FIG. 2C shows a vertical cross-section view through the optical fiber alignment structure 211, referenced as View A-A in FIG. 2B, of the singulated chip 100A, in accordance with some embodiments. The optical fiber alignment structure 211 is formed to facilitate positioning, alignment, and connection of an optical fiber 213 to the chip 100 after the chip 100 is singulated from the wafer 101, such that when the optical fiber 213 is properly positioned within the optical fiber alignment structure 211, a core 215 of the optical fiber 213 is optically edge coupled to the in-plane (edge) fiber-to-chip optical coupler 205. In this manner, light can be coupled from the optical fiber 213 into the in-plane (edge) fiber-to-chip optical coupler 205, and vice-versa. In some embodiments, the optical fiber alignment structure 211 (and other optical fiber alignment structures disclosed herein) is configured as a v-groove structure or other type of alignment structure, such as a channel, having a shape, size, and orientation that facilitates positioning, alignment, and connection of an optical fiber 213 to the chip 100. It should be understood that the sacrificial optical structure 201 is formed within the optical fiber attachment region 207 on the chip 100 before the optical fiber alignment structure 211 is formed on the chip 100. And, the sacrificial optical structure 201 is formed such that the sacrificial optical structure 201 is removed from the chip 100 when the optical fiber alignment structure 211 is formed on the chip 100.

The sacrificial optical structure 201 is used to perform wafer-level photonic testing on the chip 100. It should be understood that wafer-level photonic testing refers to photonic testing of one or more photonic circuit(s) 209 on one or more chip(s) 100 on the wafer 101 while the wafer 101 is in an intact (non-singulated) state. After the wafer-level photonic testing of the chip 100 is completed, the optical fiber alignment structure 211 is formed within the optical fiber attachment region 207 of the chip 100. It should be understood that the fabrication process(es) that form the optical fiber alignment structure 211 effectively remove the sacrificial optical structure 201 from the chip 100. In some embodiments, after the optical fiber alignment structure 211 is formed and fabrication of the chip 100 on the wafer 101 is completed, the chip 100 is singulated from the wafer 101 to obtain the singulated chip 100A. In some embodiments, the chip 100 is singulated from the wafer 101 prior to formation of the optical fiber alignment structure 211. In some embodiments, the chip 100 is singulated from the wafer 101 after formation of the optical fiber alignment structure 211. In the example embodiment of FIGS. 2B and 2C, the optical fiber alignment structure 211 is formed as a v-groove structure shaped to receive the optical fiber 213 that has the optical core 215.

To reduce optical loss, the sacrificial optical structure 201 that is removed during fabrication of the optical fiber alignment structure 211 (e.g., during etching of the optical fiber alignment structure 211 into the optical fiber attachment region 207 of the chip 100) is designed to: (1) have low optical loss for light transmission from the out-of-plane fiber-to-chip optical coupler 201A to the in-plane (edge) fiber-to-chip optical coupler 205 within the chip 100, and (2) allow efficient edge fiber-to-chip coupling after the sacrificial optical structure 201 is removed during the optical fiber alignment structure 211 fabrication process(es). In some embodiments, inverse optical waveguide tapers are used to reduce optical loss as mentioned above. For example, the in-plane (edge) fiber-to-chip optical coupler 205 within the chip 100/100A includes an inverse optical waveguide taper 205A, as shown in FIG. 2A. The inverse optical waveguide taper 205A is configured to improve optical coupling efficiency from the optical fiber 213 positioned with the optical fiber alignment structure 211 to the in-plane (edge) fiber-to-chip optical coupler 205 within the singulated chip 100A.

Also, when a first inverse optical waveguide taper is positioned in an optically coupled manner with a second first inverse optical waveguide taper, light can be transmitted between the first and second inverse optical waveguide tapers without significant loss. In the example embodiment of FIG. 2A, the optical waveguide 201B of the sacrificial optical structure 201 is formed to have an inverse optical waveguide taper 201B1 that is positioned in an optically coupled manner with the inverse optical waveguide taper 205A of the in-plane (edge) fiber-to-chip optical coupler 205. The configuration of the inverse optical waveguide taper 201B1 and the inverse optical waveguide taper 205A is referred to as a back-to-back inverse taper configuration. The back-to-back inverse taper is formed at the interface between the optical waveguide 201B and the in-plane (edge) fiber-to-chip optical coupler 205. Due to the back-to-back inverse taper configuration, light can be transmitted between the inverse optical waveguide taper 201B1 and the inverse optical waveguide taper 205A without significant loss.

It should be understood that during use of the sacrificial optical structure 201 for wafer-level photonic testing of the chip 100, the back-to-back inverse taper configuration of the inverse optical waveguide taper 201B1 and the inverse optical waveguide taper 205A provides for transmission of light from the out-of-plane fiber-to-chip optical coupler 201A through the in-plane (edge) fiber-to-chip optical coupler 205 to the photonic device(s)/circuit(s) 209 within the chip 100 without substantial optical loss. Also, after the sacrificial optical structure 201 is removed during fabrication of the optical fiber alignment structure 211, the inverse optical waveguide taper 205A functions as an efficient fiber-to-chip edge optical coupler.

Figure 3A:
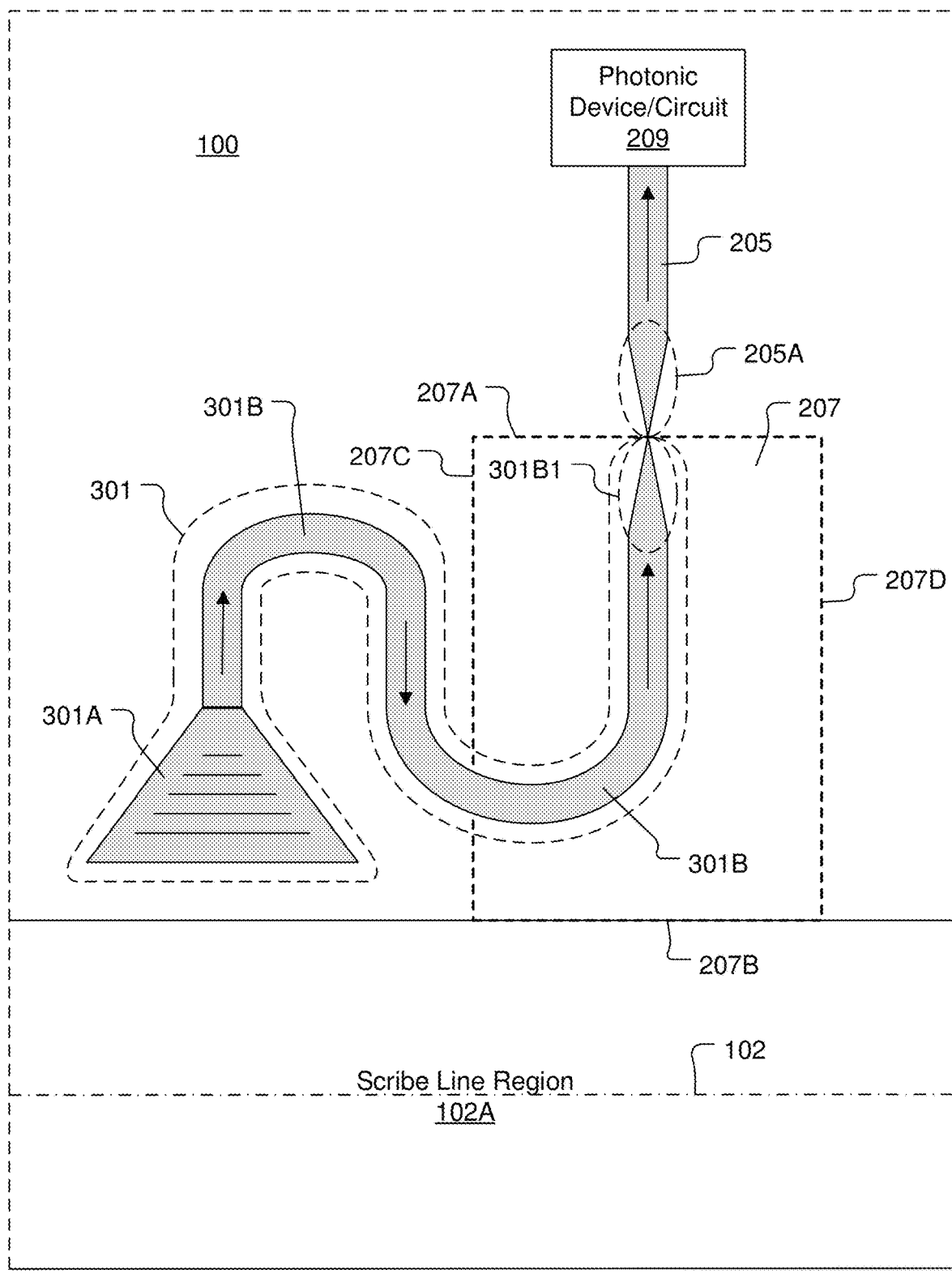
FIG. 3A shows the chip that includes a sacrificial optical structure formed at least partially within a region of the chip that is not designated for fabrication of the optical fiber alignment structure, in accordance with some embodiments.

In some embodiments, it may be beneficial to have at least a portion of the sacrificial optical structure formed within a region of the chip 100 that is not designated for fabrication of the optical fiber alignment structure 211. FIG. 3A shows the chip 100 that includes a sacrificial optical structure 301 formed at least partially within a region of the chip 100 that is not designated for fabrication of the optical fiber alignment structure 211, in accordance with some embodiments. The sacrificial optical structure 301 includes an out-of-plane fiber-to-chip optical coupler 301A and a corresponding optical waveguide 301B. The optical waveguide 301B is positioned and configured to optically connect to the in-plane (edge) fiber-to-chip optical coupler 205 formed with the chip 100. In some embodiments, the optical waveguide 301B of the sacrificial optical structure 301 is formed to have an inverse optical waveguide taper 301B1 that is positioned in an optically coupled manner with the inverse optical waveguide taper 205A of the in-plane (edge) fiber-to-chip optical coupler 205. Therefore, the sacrificial optical structure 301 is configured to couple light into the in-plane (edge) fiber-to-chip optical coupler 205 of the chip 100, with the chip 100 existing within the intact wafer 101. Light that is coupled into the out-of-plane fiber-to-chip optical coupler 301A of the sacrificial optical structure 301 is directed through the optical waveguide 301B and into the in-plane (edge) fiber-to-chip optical coupler 205, which is connected to the one or more photonic device(s)/circuit(s) 209 within the chip 100.

The sacrificial optical structure 301 is formed within a portion of the chip 100 that is outside the optical fiber attachment region 207 of the chip 100 designated to eventually have the optical fiber alignment structure 211 to facilitate positioning, alignment, and connection of the optical fiber 213 to the chip 100. It should be understood that the sacrificial optical structure 301 is formed and exists on the chip 100 before the optical fiber alignment structure 211 is formed on the chip 100. The sacrificial optical structure 301 is formed so that the optical waveguide 301B extends through a lateral edge (207C or 207D) of the optical fiber attachment region 207 of the chip 100 designated to eventually have the optical fiber alignment structure 211. The sacrificial optical structure 301 is formed such that the portion of the optical waveguide 301B that is within the optical fiber attachment region 207 of the chip 100 designated to eventually have the optical fiber alignment structure 211 is removed from the chip 100 when the optical fiber alignment structure 211 is formed on the chip 100. Also, the sacrificial optical structure 301 is formed such that the out-of-plane fiber-to-chip optical coupler 301A and the portion of the optical waveguide 301B that is not within the optical fiber attachment region 207 of the chip 100 will remain on the chip 100 after the optical fiber alignment structure 211 is formed on the chip 100.

Figure 3B:
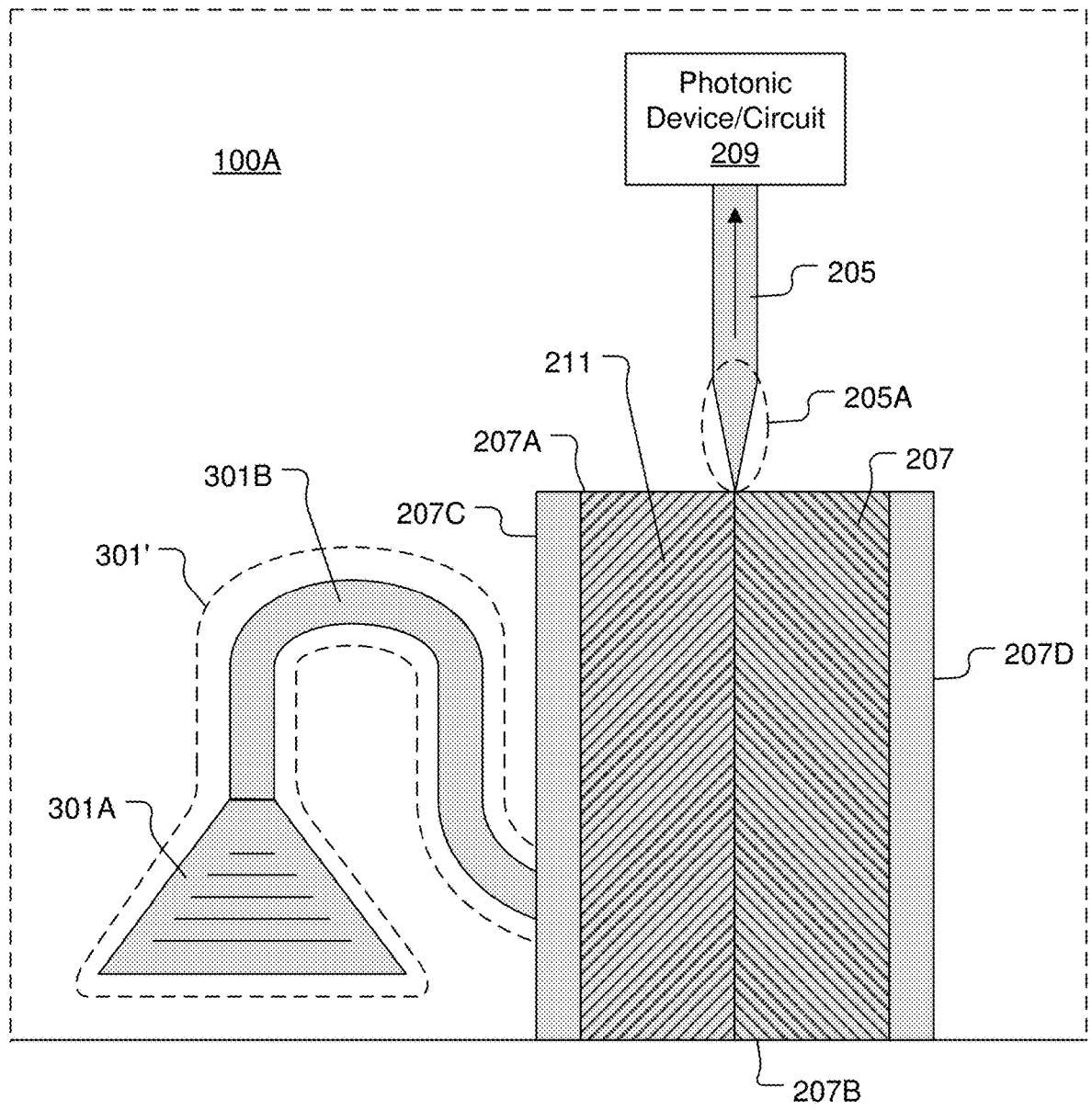
FIG. 3B shows the singulated chip corresponding to the chip of FIG. 3A after formation of the optical fiber alignment structure and singulation of the chip from the wafer, in accordance with some embodiments.

The sacrificial optical structure 301 is used to perform wafer-level photonic testing on the chip 100. After the wafer-level photonic testing of the chip 100 is completed, optical fiber alignment structure 211 is formed within the optical fiber attachment region 207 of the chip 100. FIG. 3B shows the singulated chip 100A corresponding to the chip 100 of FIG. 3A after formation of the optical fiber alignment structure 211 and singulation of the chip 100 from the wafer 101, in accordance with some embodiments. Formation of the optical fiber alignment structure 211 exposes the inverse optical waveguide taper 205A of the in-plane (edge) fiber-to-chip optical coupler 205. It should be understood that the fabrication processes that form the optical fiber alignment structure 211 removes the portion of the optical waveguide 301B that is located within the optical fiber attachment region 207 of the chip 100. Therefore, after the optical fiber alignment structure 211 is formed on the chip 100/100A, a portion 301' of the sacrificial optical structure 301 remains on the chip 100/100A. In some embodiments, after the optical fiber alignment structure 211 is formed and fabrication of the chip 100 on the wafer is completed, the chip 100 is singulated from the wafer 101 to obtain the singulated chip 100A. In some embodiments, the chip 100 is singulated from the wafer 101 to obtain the singulated chip 100A prior to formation of the optical fiber alignment structure 211. Again, the optical fiber alignment structure 211 is formed to facilitate positioning, alignment, and connection of the optical fiber 213 to the singulated chip 100A, such that when the optical fiber 213 is properly positioned with the optical fiber alignment structure 211, the core 215 of the optical fiber 213 is optically edge coupled to the in-plane (edge) fiber-to-chip optical coupler 205 of the singulated chip 100A.

Figure 4A:
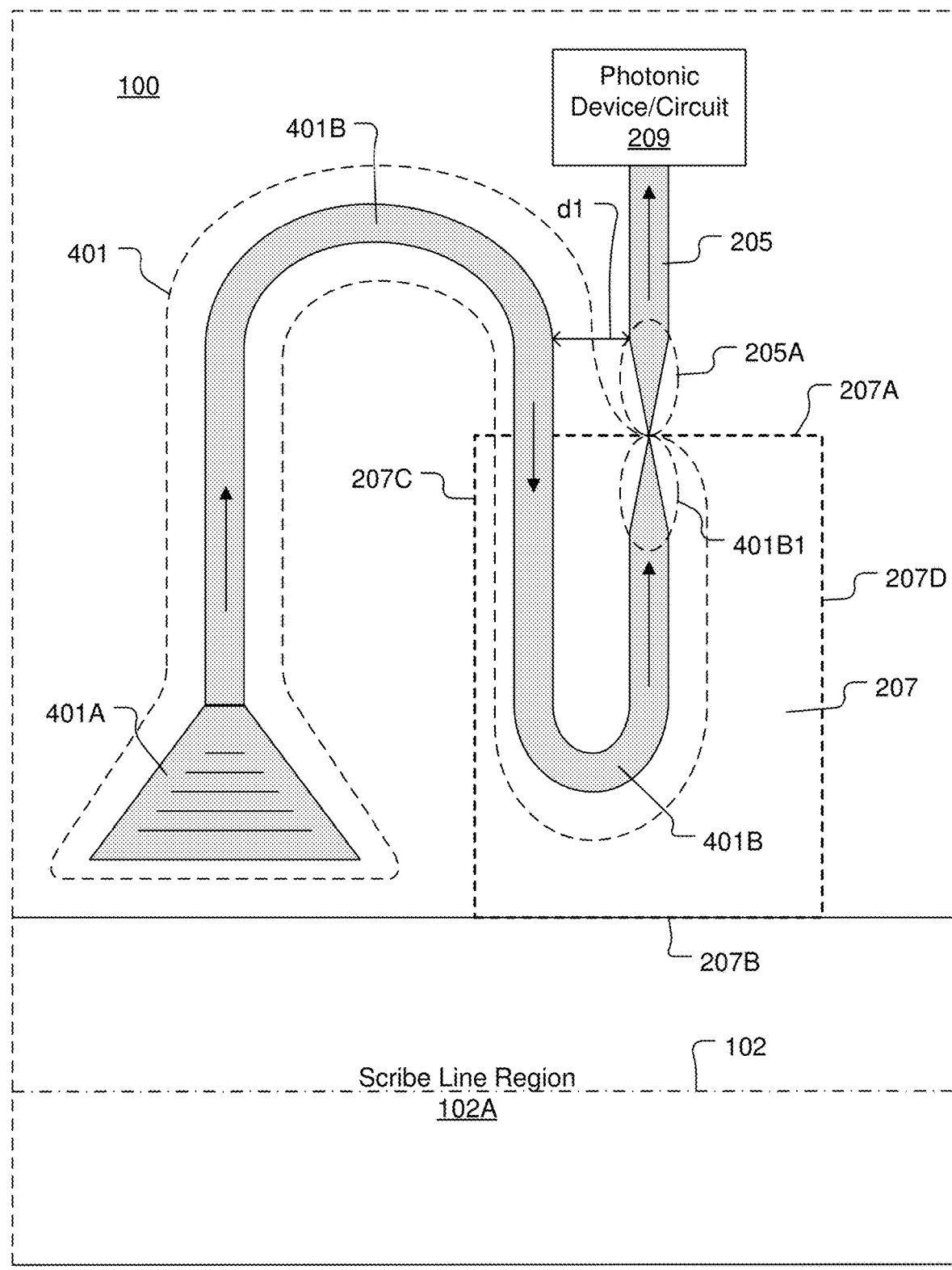
FIG. 4A shows the chip that includes a sacrificial optical structure formed at least partially within a region of the chip that is not designated for fabrication of the optical fiber alignment structure, in accordance with some embodiments.

FIG. 4A shows the chip 100 that includes a sacrificial optical structure 401 formed at least partially within a region of the chip 100 that is not designated for fabrication of the optical fiber alignment structure 211, in accordance with some embodiments. The sacrificial optical structure 401 includes an out-of-plane fiber-to-chip optical coupler 401A and a corresponding optical waveguide 401B. The optical waveguide 401B extends across the interior edge 207A of the optical fiber attachment region 207. Also, the optical waveguide 401B does not extend across the exterior edge 207B of the optical fiber attachment region 207. Also, the optical waveguide 401B does not extend across the first lateral edge 207C of the optical fiber attachment region 207. Also, the optical waveguide 401B does not extend across the second lateral edge 207D of the optical fiber attachment region 207. The optical waveguide 4001B is positioned and configured to optically connect to the in-plane (edge) fiber-to-chip optical coupler 205 formed with the chip 100. In some embodiments, the optical waveguide 401B of the sacrificial optical structure 401 is formed to have an inverse optical waveguide taper 401B1 that is positioned in an optically coupled manner with the inverse optical waveguide taper 205A of the in-plane (edge) fiber-to-chip optical coupler 205. Therefore, the sacrificial optical structure 401 is configured to couple light into the in-plane (edge) fiber-to-chip optical coupler 205 of the chip 100, with the chip 100 existing within the intact wafer 101. Light that is coupled into the out-of-plane fiber-to-chip optical coupler 401A of the sacrificial optical structure 401 is directed through the optical waveguide 401B and into the in-plane (edge) fiber-to-chip optical coupler 205, which is connected to one or more photonic device(s)/circuit(s) 209 within the chip 100.

The sacrificial optical structure 401 is formed within a portion of the chip 100 that is outside the optical fiber attachment region 207 of the chip 100 designated to eventually have the optical fiber alignment structure 211 to facilitate positioning, alignment, and connection of the optical fiber to the chip 100. It should be understood that the sacrificial optical structure 401 is formed and exists on the chip 100 before optical fiber alignment structure 211 is formed on the chip 100. The sacrificial optical structure 401 is formed so that the optical waveguide 401B extends across the interior edge 207A of the optical fiber attachment region 207 (through an interior end of the optical fiber attachment region 207) of the chip 100 designated to eventually have the optical fiber alignment structure 211, where the in-plane (edge) fiber-to-chip optical coupler 205 is to be exposed at the interior edge 207A of the optical fiber attachment region 207 of the chip 100 during formation of the optical fiber alignment structure 211. In some embodiments, the optical waveguide 401B extends across the interior edge 207A of the optical fiber attachment region 207 of the chip 100 at a location close to the in-plane (edge) fiber-to-chip optical coupler 205. For example, in some embodiments, the optical waveguide 401B extends across the interior edge 207A of the optical fiber attachment region 207 of the chip 100 at a distance d1 from the in-plane (edge) fiber-to-chip optical coupler 205 that is within a range extending from about 1 micrometer to about 100 micrometers. The sacrificial optical structure 401 is formed such that the portion of the optical waveguide 401B that is within the optical fiber attachment region 207 of the chip 100 is removed from the chip 100 when the optical fiber alignment structure 211 is formed on the chip 100. Also, the sacrificial optical structure 401 is formed such that the out-of-plane fiber-to-chip optical coupler 401A and the portion of the optical waveguide 401B that is not within the optical fiber attachment region 207 of the chip 100 remains on the chip 100 after the optical fiber alignment structure 211 is formed on the chip 100.

Figure 4B:
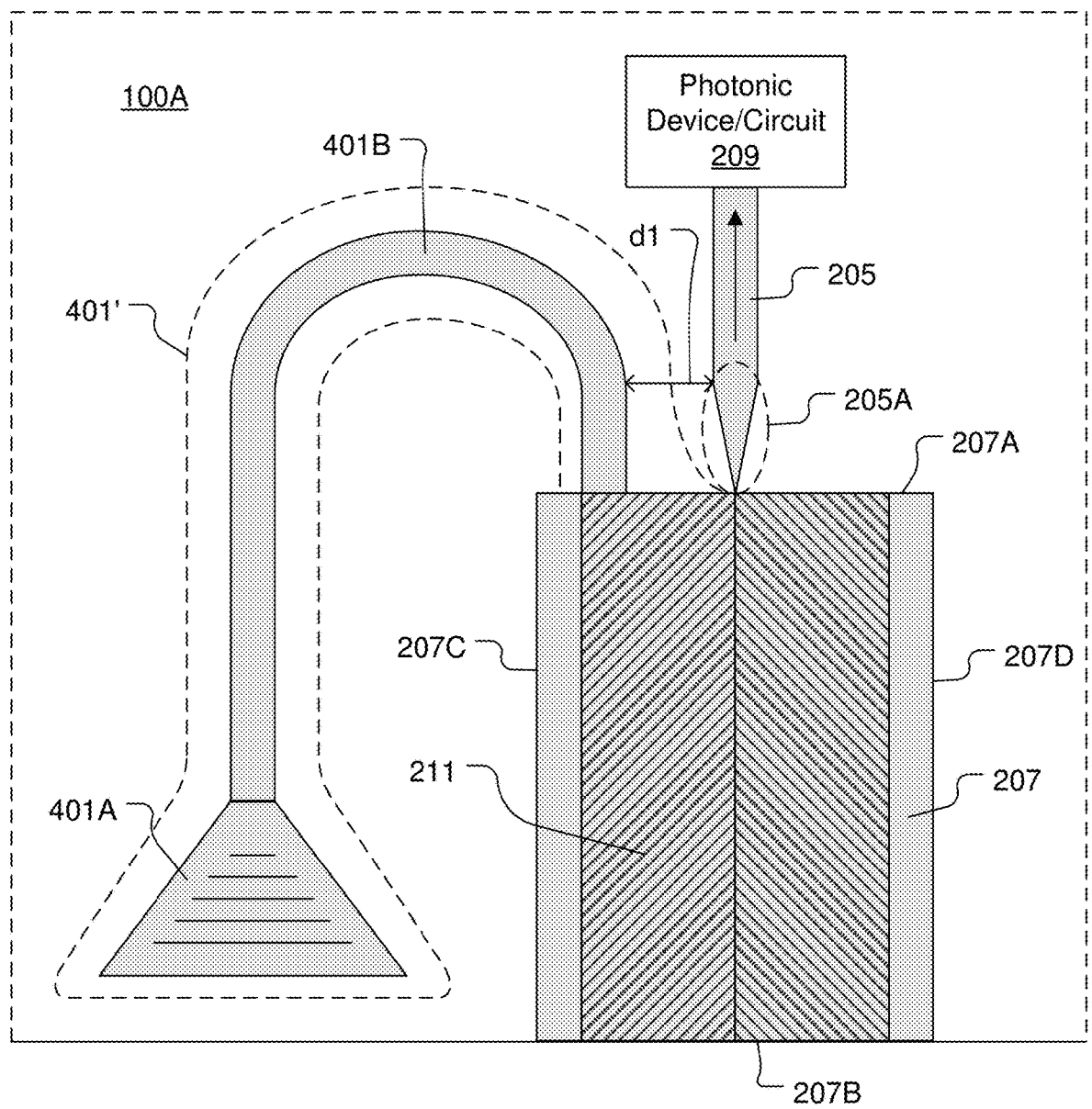
FIG. 4B shows the singulated chip corresponding to the chip of FIG. 4A after formation of the optical fiber alignment structure and singulation of the chip from the wafer, in accordance with some embodiments.

The sacrificial optical structure 401 is used to perform wafer-level photonic testing of the photonic device(s)/circuit(s) 209 on the chip 100. After the wafer-level photonic testing of the chip 100 is completed, the optical fiber alignment structure 211 is formed within the optical fiber attachment region 207 of the chip 100. FIG. 4B shows the singulated chip 100A corresponding to the chip 100 of FIG. 4A after formation of the optical fiber alignment structure 211 and singulation of the chip 100 from the wafer 101, in accordance with some embodiments. Formation of the optical fiber alignment structure 211 exposes the inverse optical waveguide taper 205A of the in-plane (edge) fiber-to-chip optical coupler 205. It should be understood that the fabrication process(es) that form the optical fiber alignment structure 211 effectively remove the portion of the optical waveguide 401B that is located within the optical fiber attachment region 207 of the chip 100/100A within which the optical fiber alignment structure 211 is formed. Therefore, after the optical fiber alignment structure 211 is formed on the chip 100/100A, a portion 401' of the sacrificial optical structure 401 remains on the chip 100/100A. In some embodiments, after the optical fiber alignment structure 211 is formed and fabrication of the chip 100 on the wafer 101 is completed, the chip 100 is singulated from the wafer 101 to obtain the singulated chip 100A. In some embodiments, the chip 100 is singulated from the wafer 101 to obtain the singulated chip 100A prior to formation of the optical fiber alignment structure 211. Again, the optical fiber alignment structure 211 is formed to facilitate positioning, alignment, and connection of the optical fiber 213 to the singulated chip 100A, such that when the optical fiber 213 is properly positioned with the optical fiber alignment structure 211, the core 215 of the optical fiber 213 is optically edge coupled to the in-plane (edge) fiber-to-chip optical coupler 205 of the singulated chip 100A.

In some embodiments, at least a portion of the sacrificial optical structure is formed within a region of the wafer 101 outside the boundaries of the chips 100 formed on the wafer 101. For example, in some embodiments, at least a portion of the sacrificial optical structure for one or more chip(s) 100 on the wafer 101 is formed within the scribe line region 102A (also referred to as kerf region or street region) on the wafer 101, where the scribe line region 102A extends along a side of the chip 100. In some embodiments, the individual chips 100 are singulated from the wafer 101 by cutting and/or etching and/or breaking the wafer 101 along the scribe line regions 102A on the wafer as indicated by the dashed lines 102 in FIG. 1A. It should be understood that the scribe line regions 102A extend both horizontally and vertically between adjacent chips 100 and around each of the chips 100 within the wafer 101.

Figure 5A:
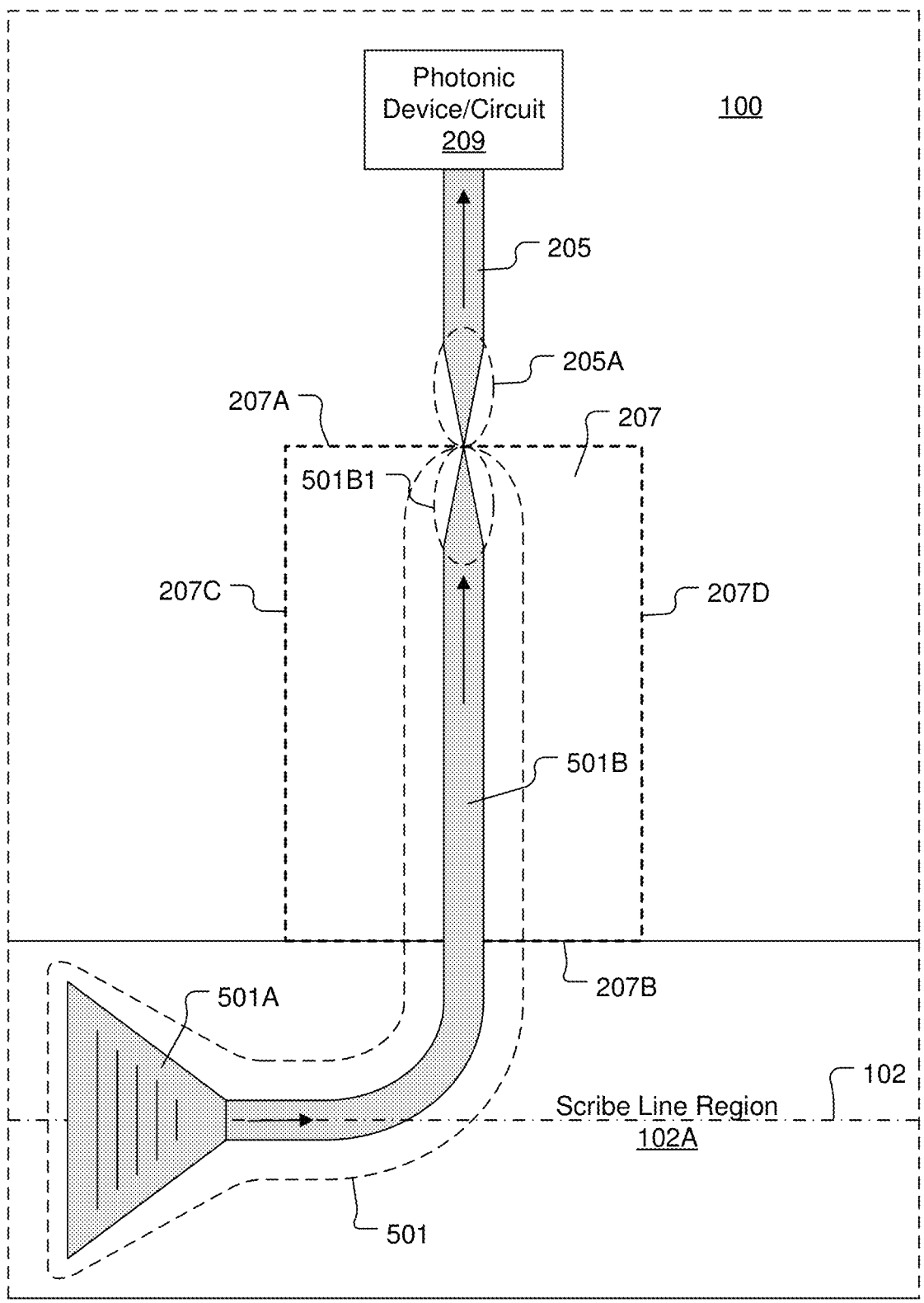
FIG. 5A shows an example implementation of a sacrificial optical structure at least partially within the scribe line region on the wafer to enable wafer-level photonic testing of the photonic device(s)/circuit(s) on the chip, in accordance with some embodiments.

FIG. 5A shows an example implementation of a sacrificial optical structure 501 at least partially within the scribe line region 102A on the wafer 101 to enable wafer-level photonic testing of the photonic device(s)/circuit(s) 209 on the chip 100, in accordance with some embodiments. The sacrificial optical structure 501 includes an out-of-plane fiber-to-chip optical coupler 501A and a corresponding optical waveguide 501B. The out-of-plane optical coupler 501A is formed within the scribe line region 102A of the semiconductor wafer 101. The optical waveguide 501B is positioned and configured to optically connect to the in-plane (edge) fiber-to-chip optical coupler 205 formed with the chip 100. The optical waveguide 501B extends across the exterior edge 207B of the optical fiber attachment region 207. The optical waveguide 501B does not extend across either the first lateral edge 207C or the second lateral edge 207D of the optical fiber attachment region 207. The optical waveguide 501B also does not extend across the interior edge 207A of the optical fiber attachment region 207. In some embodiments, the optical waveguide 501B of the sacrificial optical structure 501 is formed to have an inverse optical waveguide taper 501B1 that is positioned in an optically coupled manner with the inverse optical waveguide taper 205A of the in-plane (edge) fiber-to-chip optical coupler 205. Therefore, the sacrificial optical structure 501 is configured to couple light into the in-plane (edge) fiber-to-chip optical coupler 205 of the chip 100, with the chip 100 existing within the intact wafer 101.

Light that is coupled into the out-of-plane fiber-to-chip optical coupler 501A of the sacrificial optical structure 501 is directed through the optical waveguide 501B and into the in-plane (edge) fiber-to-chip optical coupler 205, which is connected to one or more photonic device(s)/circuit(s) 209 within the chip 100. The out-of-plane fiber-to-chip optical coupler 501A and a portion of the optical waveguide 501B are formed within the scribe line region 102A. A remaining portion of the optical waveguide 501B is formed within the optical fiber attachment region 207 of the chip 100 designated to eventually have the optical fiber alignment structure 211 fabricated therein to facilitate positioning, alignment, and connection of the optical fiber 213 to the chip 100.

It should be understood that the sacrificial optical structure 501 is formed and exists on the wafer 101 and on the chip 100 before the optical fiber alignment structure 211 is formed on the chip 100. The sacrificial optical structure 501 is formed such that the portion of the optical waveguide 501B that is within the optical fiber attachment region 207 of the chip 100 designated to eventually have the optical fiber alignment structure 211 is removed from the chip 100 when the optical fiber alignment structure 211 is formed on the chip 100. Also, the sacrificial optical structure 501 is formed such that the out-of-plane fiber-to-chip optical coupler 501A and the portion of the optical waveguide 501B that is not within the optical fiber attachment region 207 of the chip 100 designated to eventually have the optical fiber alignment structure 211 is eliminated when the wafer 101 is singulated to obtain the singulated chip 100A in individual form.

Figure 5B:
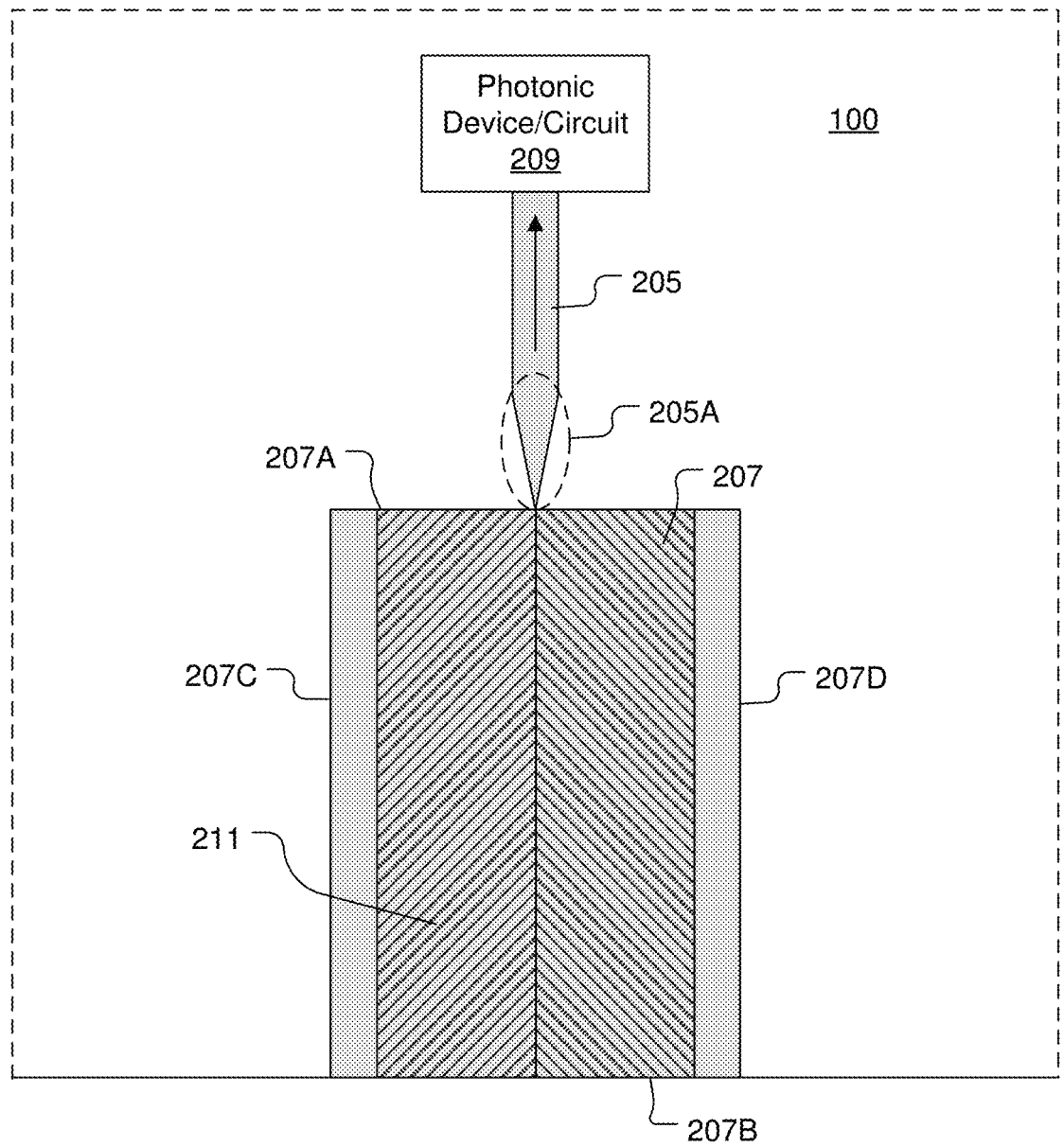
FIG. 5B shows the singulated chip corresponding to the chip of FIG. 5A after formation of the optical fiber alignment structure and singulation of the chip from the wafer, in accordance with some embodiments.

The sacrificial optical structure 501 is used to perform wafer-level photonic testing on the chip 100. After the wafer-level photonic testing of the chip 100 is completed, the optical fiber alignment structure 211 is formed within the optical fiber attachment region 207 of the chip 100. FIG. 5B shows the singulated chip 100A corresponding to the chip 100 of FIG. 5A after formation of the optical fiber alignment structure 211 and singulation of the chip 100 from the wafer 101, in accordance with some embodiments. Formation of the optical fiber alignment structure 211 exposes the inverse optical waveguide taper 205A of the in-plane (edge) fiber-to-chip optical coupler 205. It should be understood that the fabrication process(es) that form the optical fiber alignment structure 211 effectively remove the portion of the optical waveguide 501B that is located within the optical fiber attachment region 207 of the chip 100 within which the optical fiber alignment structure 211 In some embodiments, after the optical fiber alignment structure 211 is formed and fabrication of the chip 100 on the wafer 101 is completed, the chip 100 is singulated from the wafer 101 by cutting and/or etching and/or breaking the wafer 101 along the scribe line region 102A to obtain the singulated chip 100A. In some embodiments, the chip 100 is singulated from the wafer 101 prior to formation of the optical fiber alignment structure 211. Therefore, as shown in FIG. 5B, after the wafer 101 is singulated, the out-of-plane fiber-to-chip optical coupler 501A and the portion of the optical waveguide 501B that are formed within the scribe line region 102A are eliminated. Again, the optical fiber alignment structure 211 is formed to facilitate positioning, alignment, and connection of the optical fiber 213 to the singulated chip 100A, such that when the optical fiber 213 is properly positioned with the optical fiber alignment structure 211, the core 215 of the optical fiber 213 is optically edge coupled to the in-plane (edge) fiber-to-chip optical coupler 205 of the singulated chip 100A.

In some embodiments, to simplify wafer-level photonic testing, a same out-of-plane fiber-to-chip optical coupler can be used to simultaneously couple light into multiple photonic devices/circuits on the same chip 100. In these embodiments, after light is coupled into the out-of-plane fiber-to-chip optical coupler, the light is split into multiple optical waveguides which are respectively routed to the multiple photonic devices/circuits (or to different parts of the same photonic circuit) on the chip 100.

Figure 6A:
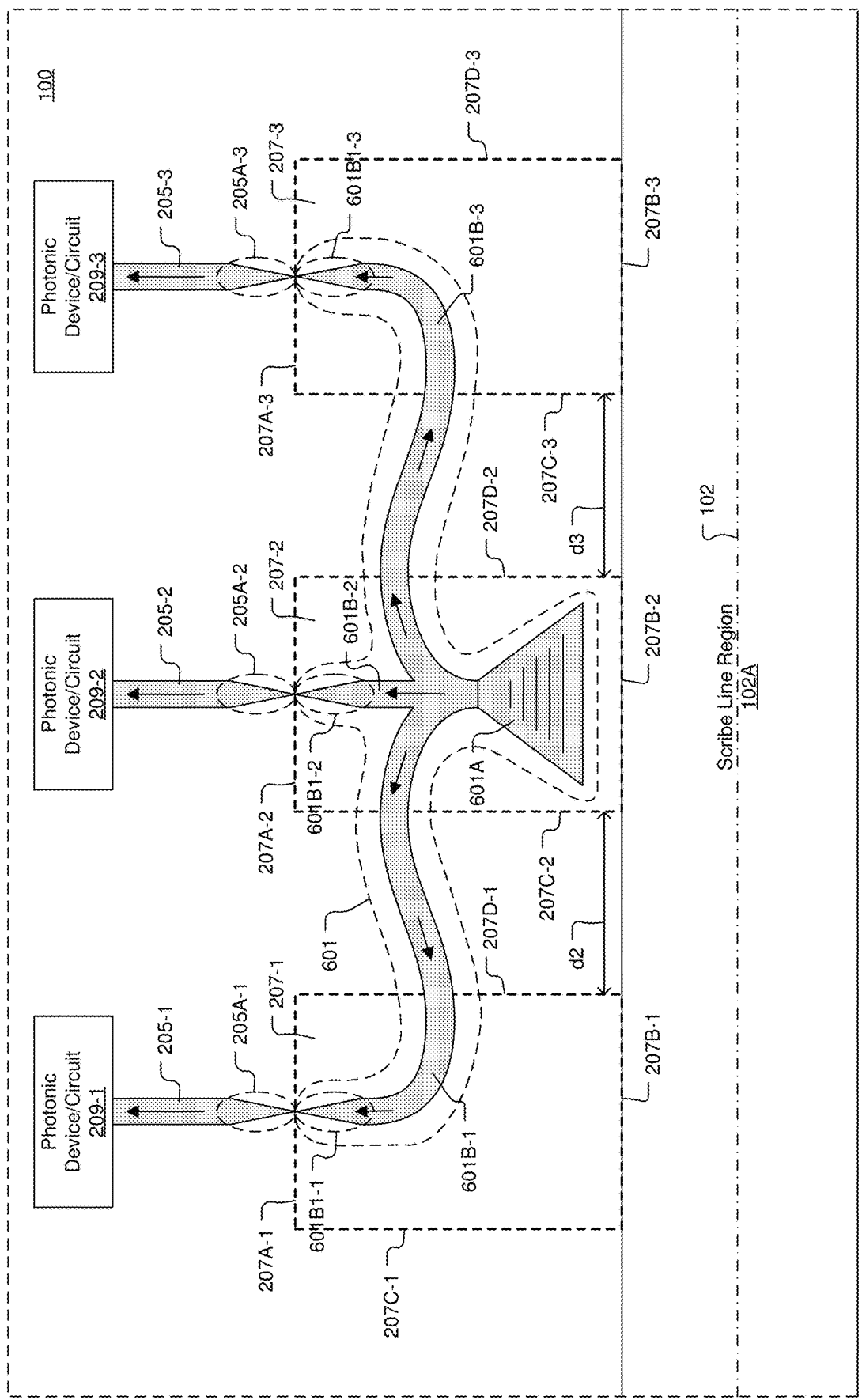
FIG. 6A shows an example implementation of a sacrificial optical structure on a chip to enable wafer-level photonic testing of photonic device(s)/circuit(s) on the chip, where the sacrificial optical structure includes a single out-of-plane fiber-to-chip optical coupler optically connected to multiple optical waveguides, in accordance with some embodiments.

FIG. 6A shows an example implementation of a sacrificial optical structure 601 on a chip 100 to enable wafer-level photonic testing of photonic device(s)/circuit(s) 209-1, 209-2, 209-3 on the chip 100, where the sacrificial optical structure 601 includes a single out-of-plane fiber-to-chip optical coupler 601A optically connected to optical waveguides 601B-1, 601B-2, and 601B-3, in accordance with some embodiments. Each of the optical waveguides 601B-1, 601B-2, 601B-3 is optically connected to the same out-of-plane fiber-to-chip optical coupler 601A. In some embodiments, the optical waveguides 601B-1, 601B-2, 601B-3 are formed as separate parts of a continuous optical waveguide, such that the optical waveguides 601B-1, 601B-2, 601B-3 are integrally formed together. In some embodiments, one or more of the optical waveguides 601B-1, 601B-2, 601B-3 is/are formed as a separate optical waveguide. Light from the out-of-plane fiber-to-chip optical coupler 601A is distributed to each of the optical waveguides 601B-1, 601B-2, 601B-3. In some embodiments, the multiple optical waveguides 601B-1, 601B-2, 601B-3 are formed physically separate from each other, but close enough to each other so that light will evanescently couple between the optical waveguides 601B-1, 601B-2, 601B-3. The optical waveguides 601B-1, 601B-2, 601B-3 are configured to extend from the out-of-plane fiber-to-chip optical coupler 601A across multiple optical fiber attachment regions 207-1, 207-2, and 207-3 of the chip 100 designated to eventually have the optical fiber alignment structures 211-1, 211-2, and 211-3 fabricated therein, respectively, to facilitate positioning, alignment, and connection of optical fibers to the chip 100.

The optical waveguide 601B-1 is positioned and configured to optically connect to an in-plane (edge) fiber-to-chip optical coupler 205-1 formed with the chip 100. In some embodiments, the optical waveguide 601B-1 is formed to have an inverse optical waveguide taper 601B1-1 that is positioned in an optically coupled manner with the inverse optical waveguide taper 205A-1 of the in-plane (edge) fiber-to-chip optical coupler 205-1. Therefore, the sacrificial optical structure 601 is configured to couple light into the in-plane (edge) fiber-to-chip optical coupler 205-1 of the chip 100, with the chip 100 existing within the intact wafer 101. A portion of the light that is coupled into the out-of-plane fiber-to-chip optical coupler 601A of the sacrificial optical structure 601 is directed through the optical waveguide 601B-1 and into the in-plane (edge) fiber-to-chip optical coupler 205-1, which is connected to one or more photonic device(s)/circuit(s) 209-1 within the chip 100.

Similarly, the optical waveguide 601B-2 is positioned and configured to optically connect to an in-plane (edge) fiber-to-chip optical coupler 205-2 formed with the chip 100. In some embodiments, the optical waveguide 601B-2 is formed to have an inverse optical waveguide taper 601B1-2 that is positioned in an optically coupled manner with an inverse optical waveguide taper 205A-2 of the in-plane (edge) fiber-to-chip optical coupler 205-2. Therefore, the sacrificial optical structure 601 is configured to couple light into the in-plane (edge) fiber-to-chip optical coupler 205-2 of the chip 100, with the chip 100 existing within the intact wafer 101. A portion of the light that is coupled into the out-of-plane fiber-to-chip optical coupler 601A of the sacrificial optical structure 601 is directed through the optical waveguide 601B-2 and into the in-plane (edge) fiber-to-chip optical coupler 205-2, which is connected to one or more photonic device(s)/circuit(s) 209-2 within the chip 100.

Also, the optical waveguide 601B-3 is positioned and configured to optically connect to an in-plane (edge) fiber-to-chip optical coupler 205-3 formed with the chip 100. In some embodiments, the optical waveguide 601B-3 is formed to have an inverse optical waveguide taper 601B1-3 that is positioned in an optically coupled manner with an inverse optical waveguide taper 205A-3 of the in-plane (edge) fiber-to-chip optical coupler 205-3. Therefore, the sacrificial optical structure 601 is configured to couple light into the in-plane (edge) fiber-to-chip optical coupler 205-3 of the chip 100, with the chip 100 existing within the intact wafer 101. A portion of the light that is coupled into the out-of-plane fiber-to-chip optical coupler 601A of the sacrificial optical structure 601 is directed through the optical waveguide 601B-3 and into the in-plane (edge) fiber-to-chip optical coupler 205-3, which is connected to one or more photonic device(s)/circuit(s) 209-3 within the chip 100.

The light that is coupled into the out-of-plane fiber-to-chip optical coupler 601A of the sacrificial optical structure 601 is split into the multiple optical waveguides 601B-1, 601B-2, and 601B-3, such that portions of the light are respectively routed to the in-plane (edge) fiber-to-chip optical couplers 205-1, 205-2, and 205-3 to provide for photonic testing of the photonic circuit(s)/device(s) 209-1, 209-2, and 209-3 that are optically coupled to the in-plane (edge) fiber-to-chip optical couplers 205-1, 205-2, and 205-3 within the chip 100. In some embodiments, the sacrificial optical structure 601 is configured such that a substantially equal portion of the light that is coupled into the out-of-plane fiber-to-chip optical coupler 601A is directed into each of the multiple optical waveguides 601B-1, 601B-2, and 601B-3. In some embodiments, the sacrificial optical structure 601 is configured such that prescribed portions of the light that is coupled into the out-of-plane fiber-to-chip optical coupler 601A are directed into the multiple optical waveguides 601B-1, 601B-2, and 601B-3, respectively. In some embodiments, the sacrificial optical structure 601 is configured such that different amounts of incoming light (the light that is coupled into the out-of-plane fiber-to-chip optical coupler 601A) are directed into different ones of the multiple optical waveguides 601B-1, 601B-2, and 601B-3. It should be understood that the sacrificial optical structure 601 enables wafer-level photonic testing of multiple photonic circuit(s)/device(s) 209-1, 209-2, and 209-3 on the chip 100 by coupling of light into the same out-of-plane fiber-to-chip optical coupler 601A.

Similar to the sacrificial optical structure 201 of FIG. 2A, out-of-plane fiber-to-chip optical coupler 601A of the sacrificial optical structure 601 is formed within an optical fiber attachment region 207-2 of the chip 100 that is designated to eventually have an optical fiber alignment structure 211-2 fabricated therein to facilitate positioning, alignment, and connection of an optical fiber 213-2 to the chip 100. Also, the optical waveguide 601B-2 is formed within the optical fiber attachment region 207-2 of the chip 100 to extend from the out-of-plane fiber-to-chip optical coupler 601A to the in-plane (edge) fiber-to-chip optical coupler 205-2. The optical fiber attachment region 207-2 of the chip 100 includes an interior edge 207A-2, an exterior edge 207B-2, a first lateral edge 207C-2, and a second lateral edge 207D-2. The in-plane (edge) fiber-to-chip optical coupler 205-2 of the chip 100 is positioned at the interior edge 207A-2 of the optical fiber attachment region 207-2. The exterior edge 207B-2 of the optical fiber attachment region 207-2 is adjacent to the scribe line region 102A of the wafer 101. The first lateral edge 207C-2 of the optical fiber attachment region 207-2 extends between a first end of the interior edge 207A-2 and a first end of the exterior edge 207B-2. The second lateral edge 207D-2 of the optical fiber attachment region 207-2 extends between a second end of the interior edge 207A-2 and a second end of the exterior edge 207B-2.

The optical waveguide 601B-1 is formed to extend from the out-of-plane fiber-to-chip optical coupler 601A to the in-plane (edge) fiber-to-chip optical coupler 205-1. The optical waveguide 601B-1 is configured to extend into and though an optical fiber attachment region 207-1 of the chip 100 that is designated to eventually have an optical fiber alignment structure 211-1 fabricated therein to facilitate positioning, alignment, and connection of an optical fiber 213-1 to the chip 100. The optical fiber attachment region 207-1 of the chip 100 includes an interior edge 207A-1, an exterior edge 207B-1, a first lateral edge 207C-1, and a second lateral edge 207D-1. The in-plane (edge) fiber-to-chip optical coupler 205-1 of the chip 100 is positioned at the interior edge 207A-1 of the optical fiber attachment region 207-1. The exterior edge 207B-1 of the optical fiber attachment region 207-1 is adjacent to the scribe line region 102A of the wafer 101. The first lateral edge 207C-1 of the optical fiber attachment region 207-1 extends between a first end of the interior edge 207A-1 and a first end of the exterior edge 207B-1. The second lateral edge 207D-1 of the optical fiber attachment region 207-1 extends between a second end of the interior edge 207A-1 and a second end of the exterior edge 207B—1. The optical waveguide 601B-1 extends across lateral edges 207C-2 and 207D-1 of the multiple optical fiber attachment regions 207-2 and 207-1, respectively, of the chip 100.

The optical waveguide 601B-3 is formed to extend from the out-of-plane fiber-to-chip optical coupler 601A to the in-plane (edge) fiber-to-chip optical coupler 205-3. The optical waveguide 601B-3 is configured to extend into and though an optical fiber attachment region 207-3 of the chip 100 that is designated to eventually have an optical fiber alignment structure 211-3 fabricated therein to facilitate positioning, alignment, and connection of an optical fiber 213-3 to the chip 100. The optical fiber attachment region 207-3 of the chip 100 includes an interior edge 207A-3, an exterior edge 207B-3, a first lateral edge 207C-3, and a second lateral edge 207D-3. The in-plane (edge) fiber-to-chip optical coupler 205-3 of the chip 100 is positioned at the interior edge 207A-3 of the optical fiber attachment region 207-3. The exterior edge 207B-3 of the optical fiber attachment region 207-3 is adjacent to the scribe line region 102A of the wafer 101. The first lateral edge 207C-3 of the optical fiber attachment region 207-3 extends between a first end of the interior edge 207A-3 and a first end of the exterior edge 207B-3. The second lateral edge 207D-3 of the optical fiber attachment region 207-3 extends between a second end of the interior edge 207A-3 and a second end of the exterior edge 207B-3. The optical waveguide 601B-3 extends across lateral edges 207D-2 and 207C-3 of the multiple optical fiber attachment regions 207-2 and 207-3, respectively, of the chip 100.

In some embodiments. the optical fiber attachment region 207-2 is separated from the optical fiber attachment region 207-1 by a distance d2 that is greater than zero, such that the optical waveguide 601B-1 traverses the distance d2 to extend between the optical fiber attachment region 207-2 and the optical fiber attachment region 207-1. In some embodiments. the optical fiber attachment region 207-2 is separated from the optical fiber attachment region 207-3 by a distance d3 that is greater than zero, such that the optical waveguide 601B-3 traverses the distance d3 to extend between the optical fiber attachment region 207-2 and the optical fiber attachment region 207-3.

Figure 6B:
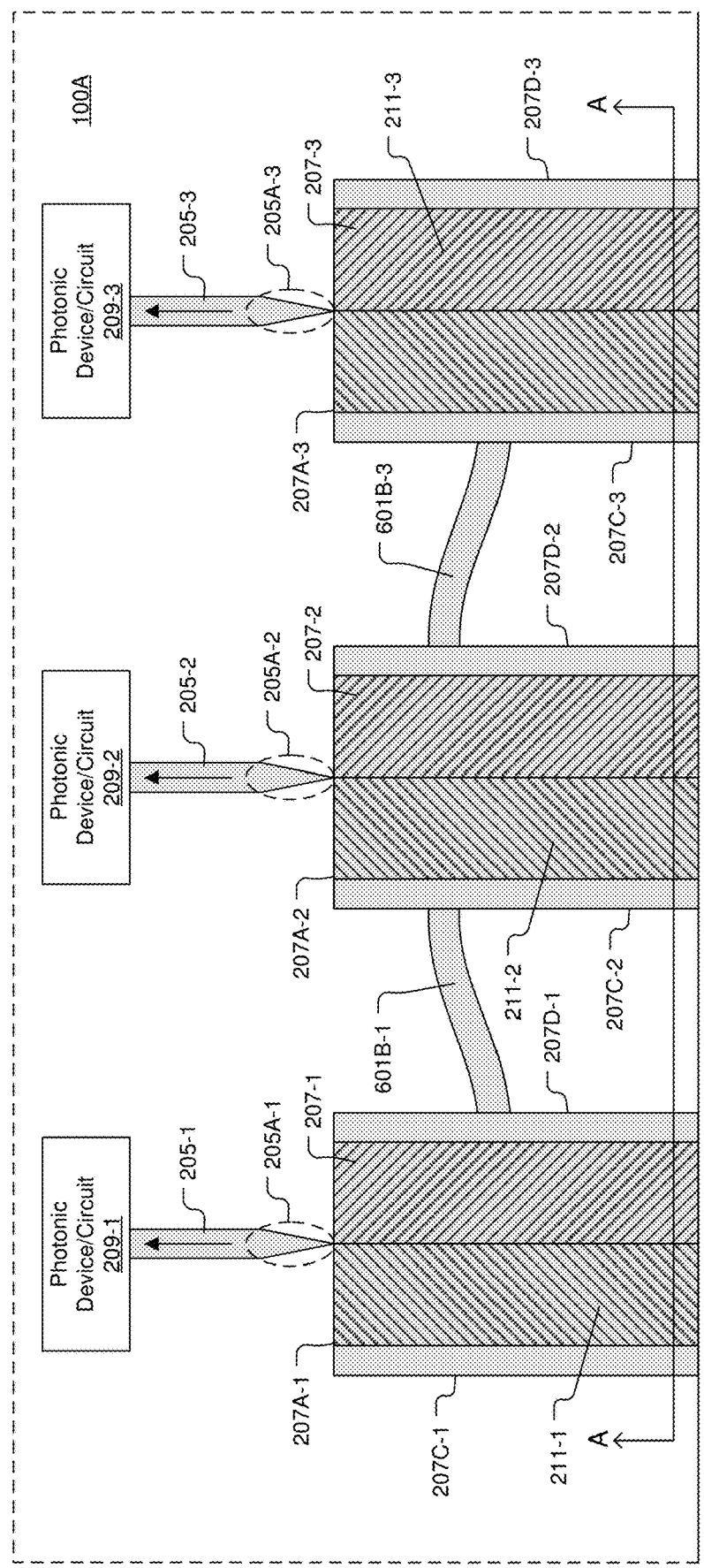
FIG. 6B shows the singulated chip corresponding to the chip of FIG. 6A after formation of the optical fiber alignment structures and singulation of the chip from the wafer, in accordance with some embodiments.

FIG. 6B shows the singulated chip 100A corresponding to the chip 100 of FIG. 6A after formation of the optical fiber alignment structures 211-1, 211-2, and 211-3, and singulation of the chip 100 from the wafer 101, in accordance with some embodiments. It should be understood that the sacrificial optical structure 601 is formed and exists on the chip 100 before the optical fiber alignment structures 211-1, 211-2, and 211-3 are formed on the chip 100. Also, the sacrificial optical structure 601 is formed such that the parts of the sacrificial optical structure 601 that are located in the optical fiber attachment regions 207-1, 207-2, and 207-3 of the chip 100 are removed from the chip 100 when the optical fiber alignment structures 211-1, 211-2, and 211-3 are formed on the chip 100. It should be understood that while the example embodiment of FIG. 6A shows the out-of-plane fiber-to-chip optical coupler 601A of the sacrificial optical structure 601 formed within the optical fiber attachment region 207-2 of the chip 100, in other embodiments, the out-of-plane fiber-to-chip optical coupler 601A of the sacrificial optical structure 401 can be formed within either of the optical fiber attachment regions 207-1 and 207-3 of the chip 100, with the optical waveguides 601B-1, 601B-2, and 601B-3 configured and connected to the out-of-plane fiber-to-chip optical coupler 601A as needed.

The sacrificial optical structure 601 is used to perform wafer-level photonic testing of photonic device(s)/circuit(s) 209-1, 209-2, 209-3 on the chip 100. After the wafer-level photonic testing of the chip 100 is completed, the optical fiber alignment structures 211-1, 211-2, and 211-3 are formed within the optical fiber attachment regions 207-1, 207-2, and 207-3, respectively, of the chip 100. It should be understood that the fabrication process(es) that form the optical fiber alignment structures 211-1, 211-2, and 211-3 effectively remove most of the sacrificial optical structure 601 from the chip 100. In some embodiments, after the optical fiber alignment structures 211-1, 211-2, and 211-3 are formed and fabrication of the chip 100 on the wafer 101 is completed, the chip 100 is singulated from the wafer 101 to obtain the singulated chip 100A. In some embodiments, the chip 100 is singulated from the wafer 101 prior to formation of the optical fiber alignment structures 211-1, 211-2, and 211-3.

Figure 6C:
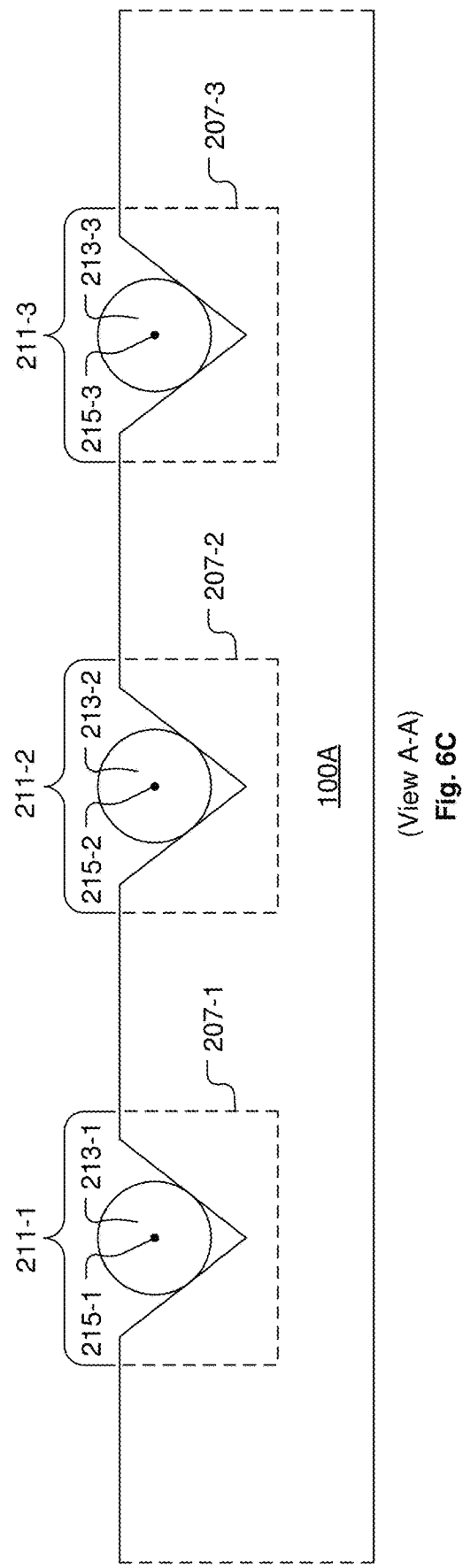
FIG. 6C shows a vertical cross-section view through the optical fiber alignment structures of the singulated chip, referenced as View A-A in FIG. 6B, in accordance with some embodiments.

FIG. 6C shows a vertical cross-section view through the optical fiber alignment structures 211-1, 211-2, 211-3, referenced as View A-A in FIG. 6B, of the singulated chip 100A, in accordance with some embodiments. Again, the optical fiber alignment structures 211-1, 211-2, and 211-3 are formed to facilitate positioning, alignment, and connection of optical fibers 213-1, 213-2, 213-3 to the singulated chip 100A, such that when the optical fibers 213-1, 213-2, 213-3 are properly positioned with the optical fiber alignment structures 211-1, 211-2, and 211-3, the cores 215-1, 215-2, 215-3 of the optical fibers 213-1, 213-2, 213-3 are respectively optically edge coupled to the in-plane (edge) fiber-to-chip optical couplers 205-1, 205-2, 205-3 of the singulated chip 100A. In this manner, light can be coupled from the optical fibers 213-1, 213-2, 213-3 into the in-plane (edge) fiber-to-chip optical couplers 205-1, 205-2, 205-3, and/or vice-versa.

It should be understood that the configuration of the optical waveguides 601B-1, 601B-2, and 601B-3 to connect the out-of-plane fiber-to-chip optical coupler 601A to three in-plane (edge) fiber-to-chip optical couplers 205-1, 205-2, 205-3, as shown in FIG. 6A, is provided by way of example. In various embodiments, the sacrificial optical structure 601 can be configured to include a configuration of optical waveguides that optically connect the out-of-plane fiber-to-chip optical coupler 601A to any number, e.g., 1, 2, 3, 4, or more, of in-plane (edge) fiber-to-chip optical couplers, where each optical waveguide in the configuration of the optical waveguides extends through a corresponding optical fiber attachment region in route to a corresponding in-plane (edge) fiber-to-chip optical coupler.

Figure 7A:
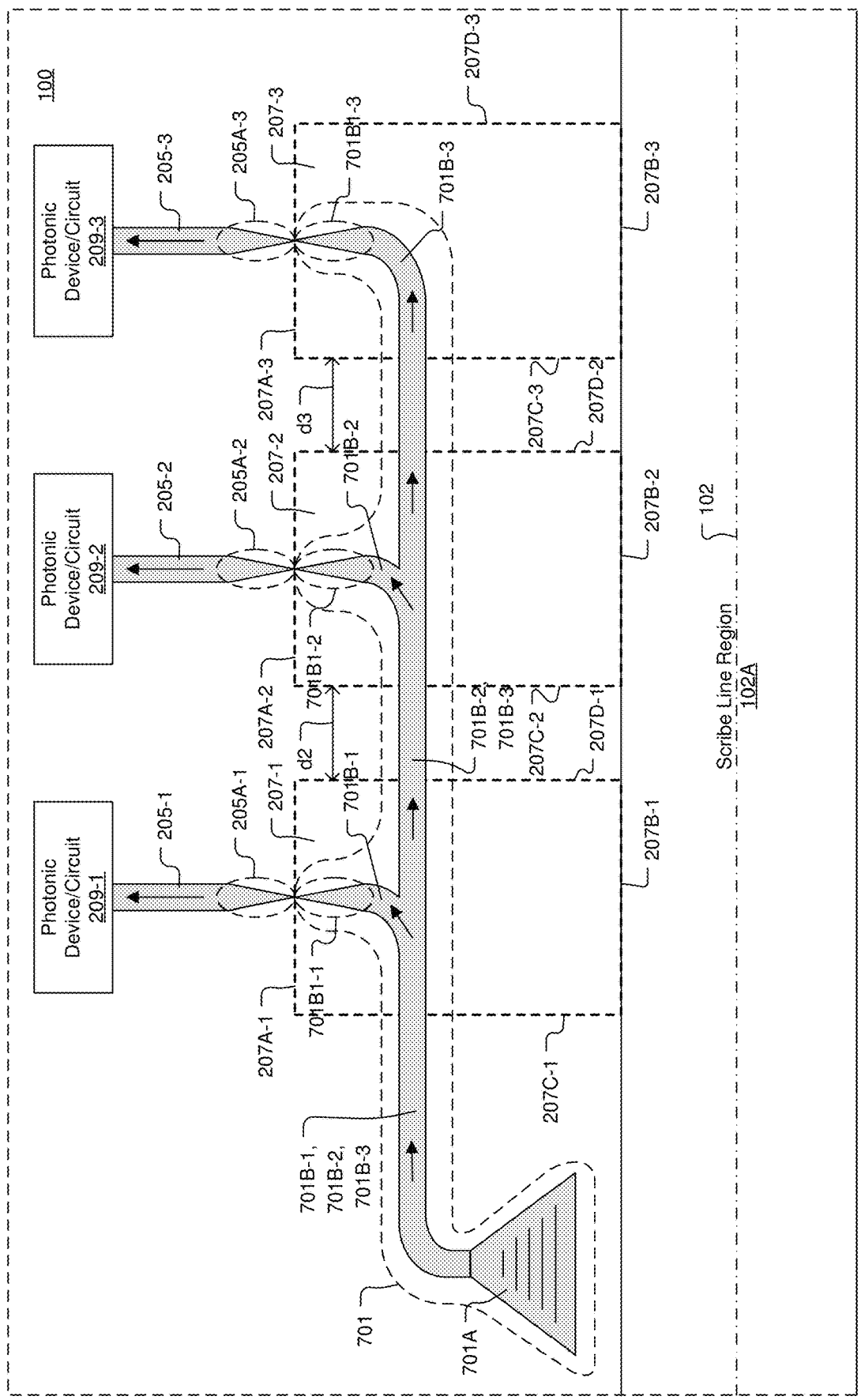
FIG. 7A shows a variation of the embodiment of FIG. 6A in which a sacrificial optical structure includes an out-of-plane fiber-to-chip optical coupler that is formed within a region of the chip that is not designated for fabrication of the optical fiber alignment structure, in accordance with some embodiments.

FIG. 7A shows a variation of the embodiment of FIG. 6A in which a sacrificial optical structure 701 includes an out-of-plane fiber-to-chip optical coupler 701A that is formed within a region of the chip 100 that is not designated for fabrication of the optical fiber alignment structure 211, in accordance with some embodiments. The sacrificial optical structure 701 enables wafer-level photonic testing of the chip 100. The sacrificial optical structure 701 includes the single out-of-plane fiber-to-chip optical coupler 701A optically connected to optical waveguides 701B-1, 701B-2, 701B-3. Each of the optical waveguides 701B-1, 701B-2, 701B-3 is optically connected to the same out-of-plane fiber-to-chip optical coupler 701A. In some embodiments, the optical waveguides 701B-1, 701B-2, 701B-3 are formed as separate parts of a continuous optical waveguide, such that the optical waveguides 701B-1, 701B-2, 701B-3 are integrally formed together. In some embodiments, one or more of the optical waveguides 701B-1, 701B-2, 701B-3 is/are formed as a separate optical waveguide. Light from the out-of-plane fiber-to-chip optical coupler 701A is distributed to each of the optical waveguides 701B-1, 701B-2, 701B-3. In some embodiments, the multiple optical waveguides 701B-1, 701B-2, 701B-3 are formed physically separate from each other, but close enough to each other so that light will evanescently couple between the optical waveguides 701B-1, 701B-2, 701B-3. The optical waveguides 701B-1, 701B-2, 701B-3 are configured to extend from the out-of-plane fiber-to-chip optical coupler 701A across multiple optical fiber attachment regions 207-1, 207-2, and 207-3 of the chip 100 designated to eventually have the optical fiber alignment structures 211-1, 211-2, and 211-3 fabricated therein, respectively, to facilitate positioning, alignment, and connection of optical fibers to the chip 100. In the example embodiment of FIG. 7A, the primary optical waveguides 701B-1, 701B-2, 701B-3 extends across lateral edges 207C-1, 207D-1, 207C-2, 207D-2, 207C-3 of the multiple optical fiber attachment regions 207-1, 207-2, and 207-3 of the chip 100.

The optical waveguide 701B-1 is positioned and configured to optically connect to the in-plane (edge) fiber-to-chip optical coupler 205-1 formed with the chip 100. In some embodiments, the optical waveguide 701B-1 is formed to have an inverse optical waveguide taper 701B1-1 that is positioned in an optically coupled manner with the inverse optical waveguide taper 205A-1 of the in-plane (edge) fiber-to-chip optical coupler 205-1. Therefore, the sacrificial optical structure 701 is configured to couple light into the in-plane (edge) fiber-to-chip optical coupler 205-1 of the chip 100, with the chip 100 existing within the intact wafer 101. A portion of the light that is coupled into the out-of-plane fiber-to-chip optical coupler 701A of the sacrificial optical structure 701 is directed through the optical waveguide 701B-1 and into the in-plane (edge) fiber-to-chip optical coupler 205-1, which is connected to one or more photonic device(s)/circuit(s) 209-1 within the chip 100.

Similarly, the optical waveguide 701B-2 is positioned and configured to optically connect to the in-plane (edge) fiber-to-chip optical coupler 205-2 formed with the chip 100. In some embodiments, the optical waveguide 701B-2 is formed to have an inverse optical waveguide taper 701B1-2 that is positioned in an optically coupled manner with an inverse optical waveguide taper 205A-2 of the in-plane (edge) fiber-to-chip optical coupler 205-2. Therefore, the sacrificial optical structure 701 is configured to couple light into the in-plane (edge) fiber-to-chip optical coupler 205-2 of the chip 100, with the chip 100 existing within the intact wafer 101. A portion of the light that is coupled into the out-of-plane fiber-to-chip optical coupler 701A of the sacrificial optical structure 701 is directed through the optical waveguide 701B-2 and into the in-plane (edge) fiber-to-chip optical coupler 205-2, which is connected to one or more photonic device(s)/circuit(s) 209-2 within the chip 100.

Also, the optical waveguide 701B-3 is positioned and configured to optically connect to the in-plane (edge) fiber-to-chip optical coupler 205-3 formed with the chip 100. In some embodiments, the optical waveguide 701B-3 is formed to have an inverse optical waveguide taper 701B1-3 that is positioned in an optically coupled manner with an inverse optical waveguide taper 205A-3 of the in-plane (edge) fiber-to-chip optical coupler 205-3. Therefore, the sacrificial optical structure 701 is configured to couple light into the in-plane (edge) fiber-to-chip optical coupler 205-3 of the chip 100, with the chip 100 existing within the intact wafer 101. A portion of the light that is coupled into the out-of-plane fiber-to-chip optical coupler 701A of the sacrificial optical structure 701 is directed through the optical waveguide 701B-3 and into the in-plane (edge) fiber-to-chip optical coupler 205-3, which is connected to one or more photonic device(s)/circuit(s) 209-3 within the chip 100.

The light that is coupled into the out-of-plane fiber-to-chip optical coupler 701A of the sacrificial optical structure 701 is split into the optical waveguides 701B-1, 701B-2, 701B-3, such that portions of the light are respectively routed to the in-plane (edge) fiber-to-chip optical couplers 205-1, 205-2, 205-3 to provide for photonic testing of the photonic circuit(s)/device(s) 209-1, 209-2, 209-3 that are optically coupled to the in-plane (edge) fiber-to-chip optical couplers 205-1, 205-2, 205-3 within the chip 100. In some embodiments, the sacrificial optical structure 701 is configured such that a substantially equal portion of the light that is coupled into the out-of-plane fiber-to-chip optical coupler 701A is directed into each of the optical waveguides 701B-1, 701B-2, 701B-3. In some embodiments, the sacrificial optical structure 701 is configured such that prescribed portions of the light that is coupled into the out-of-plane fiber-to-chip optical coupler 701A are directed into the optical waveguides 701B-1, 701B-2, 701B-3, respectively. In some embodiments, the sacrificial optical structure 701 is configured such that different amounts of incoming light (the light that is coupled into the out-of-plane fiber-to-chip optical coupler 701A) are directed into different ones of the optical waveguides 701B-1, 701B-2, 701B-3. It should be understood that the sacrificial optical structure 701 enables wafer-level photonic testing of multiple photonic circuit(s)/device(s) 209-1, 209-2, 209-3 on the chip 100 by coupling of light into the same out-of-plane fiber-to-chip optical coupler 701A.

The out-of-plane fiber-to-chip optical coupler 701A of the sacrificial optical structure 701 is formed at least partially within a region of the chip 100 that is not designated for fabrication of an optical fiber alignment structure. However, the optical waveguides 701B-1, 701B-2, 701B-3 are formed to extend through one or more of the optical fiber attachment regions 207-1, 207-2, and 207-3 that are designated for formation of respective optical fiber alignment structures 211-1, 211-2, 211-3 to facilitate positioning, alignment, and connection of an optical fibers to the chip 100. It should be understood that the sacrificial optical structure 701 is formed and exists on the chip 100 before the optical fiber alignment structures 211-1, 211-2, 211-3 are formed on the chip 100. Also, the sacrificial optical structure 701 is formed such that the parts of the sacrificial optical structure 701 that are located in the optical fiber attachment regions 207-1, 207-2, and 207-3 of the chip 100 are removed from the chip 100 when the optical fiber alignment structures 211-1, 211-2, 211-3 are formed on the chip 100. It should be understood that while the example embodiment of FIG. 7A shows the out-of-plane fiber-to-chip optical coupler 701A of the sacrificial optical structure 501 formed beside the optical fiber attachment region 207-1 of the chip 100, in other embodiments, the out-of-plane fiber-to-chip optical coupler 701A of the sacrificial optical structure 701 can be formed essentially anywhere on the chip 100, with the optical waveguides 701B-1, 701B-2, 701B-3 connected to the out-of-plane fiber-to-chip optical coupler 701A as needed.

Figure 7B:
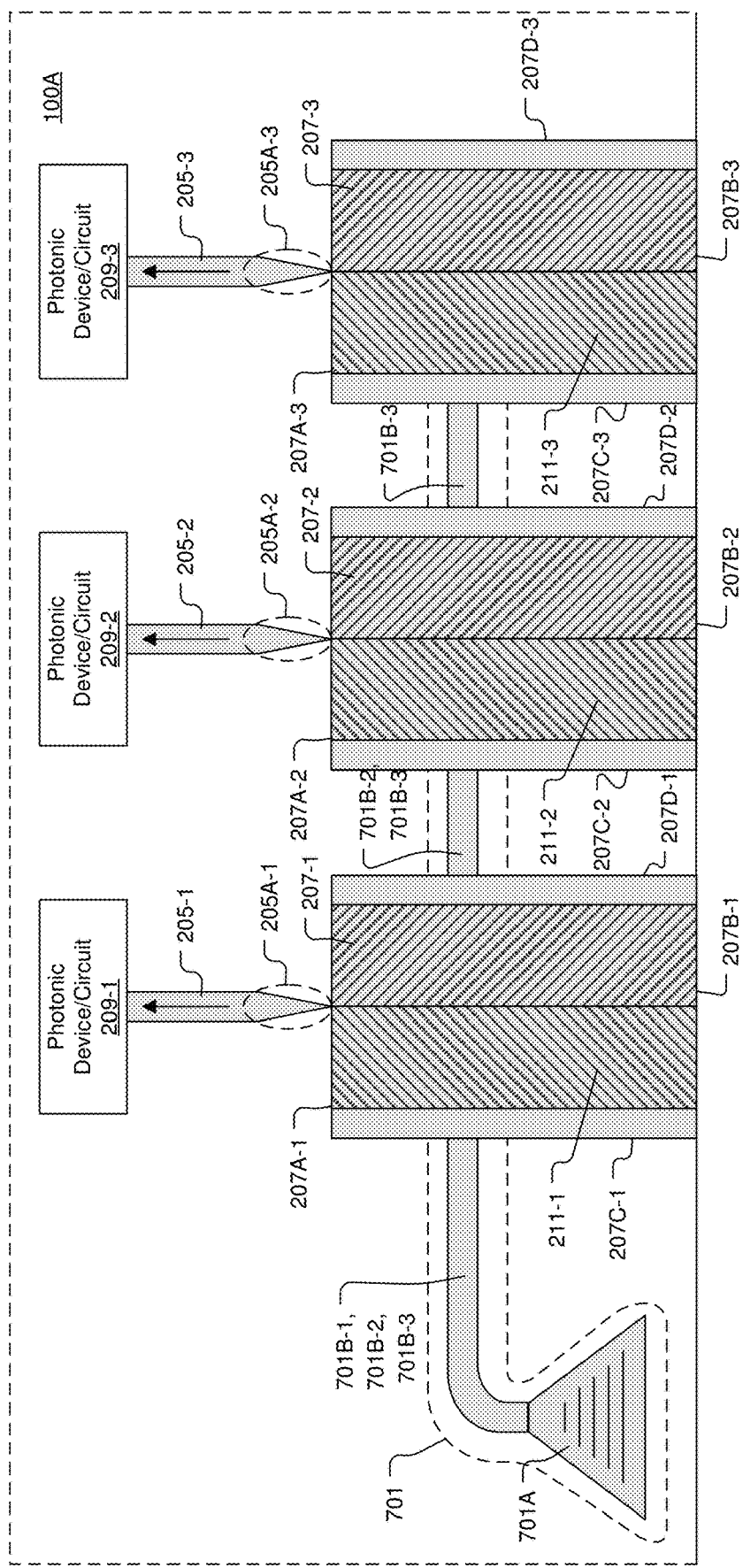
FIG. 7B shows the singulated chip corresponding to the chip of FIG. 7A after formation of the optical fiber alignment structures and singulation of the chip from the wafer, in accordance with some embodiments.

The sacrificial optical structure 701 is used to perform wafer-level photonic testing on the chip 100. After the wafer-level photonic testing of the chip 100 is completed, the optical fiber alignment structures 211-1, 211-2, 211-3 are formed within the optical fiber attachment regions 207-1, 207-2, and 207-3, respectively, of the chip 100. FIG. 7B shows the singulated chip 100A corresponding to the chip 100 of FIG. 7A after formation of the optical fiber alignment structures 211-1, 211-2, and 211-3, and singulation of the chip 100 from the wafer 101, in accordance with some embodiments. It should be understood that the fabrication processes that form the optical fiber alignment structures 211-1, 211-2, and 211-3 remove portions of the optical waveguides 701B-1, 701B-2, 701B-3 so as to disable the optical waveguides 701B-1, 701B-2, 701B-3. In some embodiments, after the optical fiber alignment structures 211-1, 211-2, and 211-3 are formed and fabrication of the chip 100 on the wafer 101 is completed, the chip 100 is singulated from the wafer 101 to obtain the singulated chip 100A. In some embodiments, the chip 100 is singulated from the wafer 101 prior to formation of the optical fiber alignment structures 211-1, 211-2, and 211-3. Again, the optical fiber alignment structures 211-1, 211-2, and 211-3 are formed to facilitate positioning, alignment, and connection of optical fibers to the singulated chip 100A, such as shown in FIG. 6C, such that when the optical fibers are properly positioned with the optical fiber alignment structures 211-1, 211-2, and 211-3, the cores of the optical fibers are respectively optically edge coupled to the in-plane (edge) fiber-to-chip optical couplers 205-1, 205-2, 205-3 of the singulated chip 100A. In this manner, light can be coupled from the optical fibers into the in-plane (edge) fiber-to-chip optical couplers 205-1, 205-2, 205-3, and/or vice-versa.

It should be understood that the configuration of the optical waveguides 701B-1, 701B-2, and 701B-3 to connect the out-of-plane fiber-to-chip optical coupler 701A to three in-plane (edge) fiber-to-chip optical couplers 205-1, 205-2, 205-3, as shown in FIG. 7A, is provided by way of example. In various embodiments, the sacrificial optical structure 701 can be configured to include a configuration of optical waveguides that optically connect the out-of-plane fiber-to-chip optical coupler 701A to any number, e.g., 1, 2, 3, 4, or more, of in-plane (edge) fiber-to-chip optical couplers, where each optical waveguide in the configuration of the optical waveguides extends through a corresponding optical fiber attachment region in route to a corresponding in-plane (edge) fiber-to-chip optical coupler.

Figure 8A:
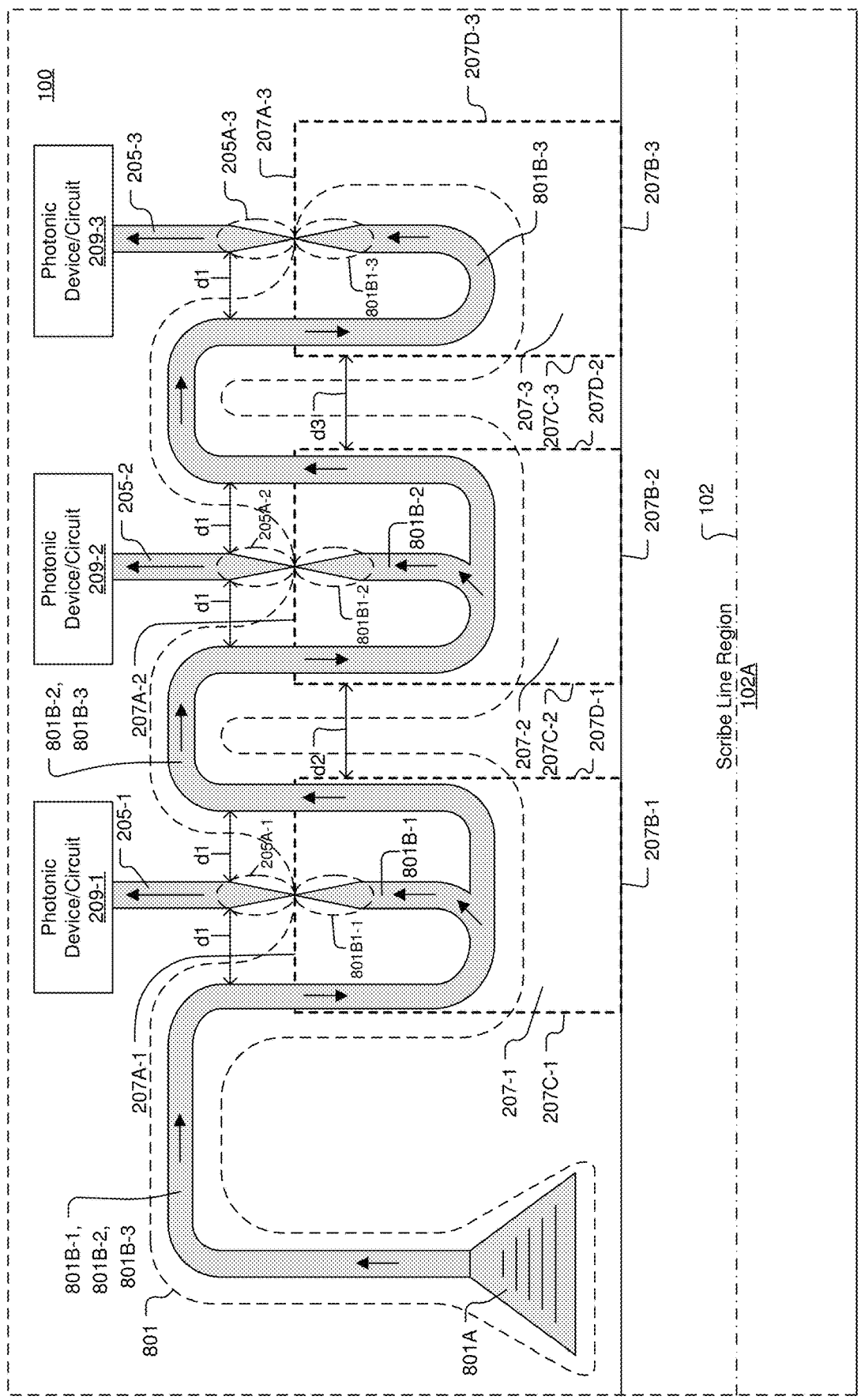
FIG. 8A shows the chip that includes a sacrificial optical structure that includes an out-of-plane fiber-to-chip optical coupler formed within a region of the chip that is not designated for fabrication of an optical fiber alignment structure, in accordance with some embodiments.

FIG. 8A shows the chip 100 that includes a sacrificial optical structure 801 that includes an out-of-plane fiber-to-chip optical coupler 801A formed within a region of the chip 100 that is not designated for fabrication of an optical fiber alignment structure, in accordance with some embodiments. The sacrificial optical structure 801 enables wafer-level photonic testing of the chip 100. The sacrificial optical structure 801 includes the single out-of-plane fiber-to-chip optical coupler 801A optically connected to optical waveguides 801B-1, 801B-2, 801B-3. Each of the optical waveguides 801B-1, 801B-2, 801B-3 is optically connected to the same out-of-plane fiber-to-chip optical coupler 801A. In some embodiments, the optical waveguides 801B-1, 801B-2, 801B-3 are formed as separate parts of a continuous optical waveguide, such that the optical waveguides 801B-1, 801B-2, 801B-3 are integrally formed together. In some embodiments, one or more of the optical waveguides 801B-1, 801B-2, 801B-3 is/are formed as a separate optical waveguide.

Light from the out-of-plane fiber-to-chip optical coupler 801A is distributed to each of the optical waveguides 801B-1, 801B-2, 801B-3. In some embodiments, the multiple optical waveguides 801B-1, 801B-2, 801B-3 are formed physically separate from each other, but close enough to each other so that light will evanescently couple between the optical waveguides 801B-1, 801B-2, 801B-3. The optical waveguides 801B-1, 801B-2, 801B-3 are configured to extend from the out-of-plane fiber-to-chip optical coupler 801A across multiple optical fiber attachment regions 207-1, 207-2, and 207-3 of the chip 100 designated to eventually have the optical fiber alignment structures 211-1, 211-2, and 211-3 fabricated therein, respectively, to facilitate positioning, alignment, and connection of optical fibers to the chip 100. In the example embodiment of FIG. 8A, the optical waveguides 801B-1, 801B-2, 801B-3 extend across interior edges 207A-1, 207A-2, 207A-3 of the multiple optical fiber attachment regions 207-1, 207-2, and 207-3 of the chip 100. In the example embodiment of FIG. 8A, the optical waveguides 801B-1, 801B-2, 801B-3 do not extend across the lateral edges 207C-1, 207D1, 207C-2, 207D-2, 207C-3, 207D-3 of the multiple optical fiber attachment regions 207-1, 207-2, and 207-3 of the chip 100. In the example embodiment of FIG. 8A, the optical waveguides 801B-1, 801B-2, 801B-3 do not extend across exterior edges 207B-1, 207B-2, 207B-3 of the multiple optical fiber attachment regions 207-1, 207-2, and 207-3 of the chip 100. In some embodiments, the optical waveguides 801B-1, 801B-2, 801B-3 extend across the interior edges of the optical fiber attachment regions 207-1, 207-2, 207-3 at the distance d1 from the in-plane (edge) fiber-to-chip optical coupler 205-1, 205-2, 205-3 of the corresponding optical fiber attachment regions 207-1, 207-2, 207-3.

The optical waveguide 801B-1 is positioned and configured to optically connect to the in-plane (edge) fiber-to-chip optical coupler 205-1 formed with the chip 100. In some embodiments, the optical waveguide 801B-1 is formed to have an inverse optical waveguide taper 801B1-1 that is positioned in an optically coupled manner with the inverse optical waveguide taper 205A-1 of the in-plane (edge) fiber-to-chip optical coupler 205-1. Therefore, the sacrificial optical structure 801 is configured to couple light into the in-plane (edge) fiber-to-chip optical coupler 205-1 of the chip 100, with the chip 100 existing within the intact wafer 101. A portion of the light that is coupled into the out-of-plane fiber-to-chip optical coupler 801A of the sacrificial optical structure 801 is directed through the optical waveguide 801B-1 and into the in-plane (edge) fiber-to-chip optical coupler 205-1, which is connected to one or more photonic device(s)/circuit(s) 209-1 within the chip 100.

Similarly, the optical waveguide 801B-2 is positioned and configured to optically connect to the in-plane (edge) fiber-to-chip optical coupler 205-1 formed with the chip 100. In some embodiments, the optical waveguide 801B-2 is formed to have an inverse optical waveguide taper 801B1-2 that is positioned in an optically coupled manner with the inverse optical waveguide taper 205A-2 of the in-plane (edge) fiber-to-chip optical coupler 205-2. Therefore, the sacrificial optical structure 801 is configured to couple light into the in-plane (edge) fiber-to-chip optical coupler 205-2 of the chip 100, with the chip 100 existing within the intact wafer 101. A portion of the light that is coupled into the out-of-plane fiber-to-chip optical coupler 801A of the sacrificial optical structure 801 is directed through the optical waveguide 801B-2 and into the in-plane (edge) fiber-to-chip optical coupler 205-2, which is connected to one or more photonic device(s)/circuit(s) 209-2 within the chip 100.

Also, the optical waveguide 801B-3 is positioned and configured to optically connect to the in-plane (edge) fiber-to-chip optical coupler 205-3 formed with the chip 100. In some embodiments, the optical waveguide 801B-3 is formed to have an inverse optical waveguide taper 801B1-3 that is positioned in an optically coupled manner with the inverse optical waveguide taper 205A-3 of the in-plane (edge) fiber-to-chip optical coupler 205-3. Therefore, the sacrificial optical structure 801 is configured to couple light into the in-plane (edge) fiber-to-chip optical coupler 205-3 of the chip 100, with the chip 100 existing within the intact wafer 101. A portion of the light that is coupled into the out-of-plane fiber-to-chip optical coupler 801A of the sacrificial optical structure 801 is directed through the optical waveguide 801B-3 and into the in-plane (edge) fiber-to-chip optical coupler 205-3, which is connected to one or more photonic device(s)/circuit(s) 209-3 within the chip 100.

The light that is coupled into the out-of-plane fiber-to-chip optical coupler 801A of the sacrificial optical structure 801 is split into the optical waveguides 801B-1, 801B-2, 801B-3, such that portions of the light are respectively routed to the in-plane (edge) fiber-to-chip optical couplers 205-1, 205-2, 205-3 to provide for photonic testing of the photonic circuit(s)/device(s) 209-1, 209-2, 209-3 that are optically coupled to the in-plane (edge) fiber-to-chip optical couplers 205-1, 205-2, 205-3 within the chip 100. In some embodiments, the sacrificial optical structure 801 is configured such that a substantially equal portion of the light that is coupled into the out-of-plane fiber-to-chip optical coupler 801A is directed into each of the optical waveguides 801B-1, 801B-2, 801B-3. In some embodiments, the sacrificial optical structure 801 is configured such that prescribed portions of the light that is coupled into the out-of-plane fiber-to-chip optical coupler 801A are directed into the optical waveguides 801B-1, 801B-2, 801B-3, respectively. In some embodiments, the sacrificial optical structure 801 is configured such that different amounts of incoming light (the light that is coupled into the out-of-plane fiber-to-chip optical coupler 801A) are directed into different ones of the optical waveguides 801B-1, 801B-2, 801B-3. It should be understood that the sacrificial optical structure 801 enables wafer-level photonic testing of multiple photonic circuit(s)/device(s) 209-1, 209-2, 209-3 on the chip 100 by coupling of light into the same out-of-plane fiber-to-chip optical coupler 801A.

The out-of-plane fiber-to-chip optical coupler 801A of the sacrificial optical structure 511 is formed at least partially within a region of the chip 100 that is not designated for fabrication of an optical fiber alignment structure. However, the optical waveguides 801B-1, 801B-2, 801B-3 are formed to extend through one or more of the optical fiber attachment regions 207-1, 207-2, and 207-3 that are designated for formation of respective optical fiber alignment structures 211-1, 211-2, 211-3 to facilitate positioning, alignment, and connection of an optical fibers to the chip 100. It should be understood that the sacrificial optical structure 801 is formed and exists on the chip 100 before the optical fiber alignment structures 211-1, 211-2, 211-3 are formed on the chip 100. Also, the sacrificial optical structure 801 is formed such that the parts of the sacrificial optical structure 801 that are located in the optical fiber attachment regions 207-1, 207-2, and 207-3 of the chip 100 are removed from the chip 100 when the optical fiber alignment structures 211-1, 211-2, 211-3 are formed on the chip 100. It should be understood that while the example embodiment of FIG. 8A shows the out-of-plane fiber-to-chip optical coupler 801A of the sacrificial optical structure 801 formed beside the optical fiber attachment region 207-1 of the chip 100, in other embodiments, the out-of-plane fiber-to-chip optical coupler 801A of the sacrificial optical structure 801 can be formed essentially anywhere on the chip 100, with the optical waveguides 801B-1, 801B-2, 801B-3 connected to the out-of-plane fiber-to-chip optical coupler 801A as needed.

Figure 8B:
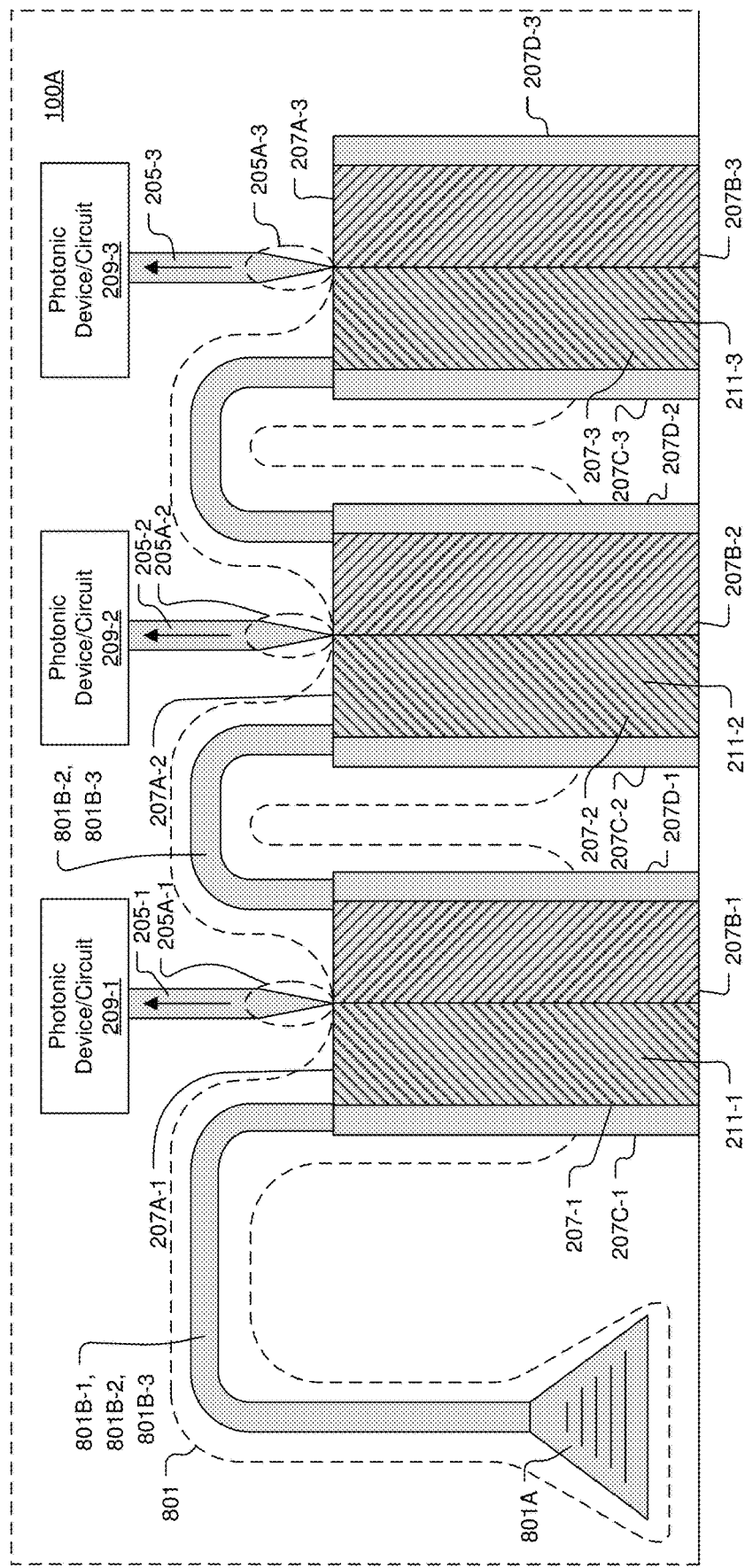
FIG. 8B shows the singulated chip corresponding to the chip of FIG. 8A after formation of the optical fiber alignment structures and singulation of the chip from the wafer, in accordance with some embodiments.

The sacrificial optical structure 801 is used to perform wafer-level photonic testing on the chip 100. After the wafer-level photonic testing of the chip 100 is completed, the optical fiber alignment structures 211-1, 211-2, 211-3 are formed within the optical fiber attachment regions 207-1, 207-2, and 207-3, respectively, of the chip 100. FIG. 8B shows the singulated chip 100A corresponding to the chip 100 of FIG. 8A after formation of the optical fiber alignment structures 211-1, 211-2, and 211-3, and singulation of the chip 100 from the wafer 101, in accordance with some embodiments. It should be understood that the fabrication processes that form the optical fiber alignment structures 211-1, 211-2, and 211-3 remove portions of the optical waveguides 801B-1, 801B-2, 801B-3 so as to disable the optical waveguides 801B-1, 801B-2, 801B-3. In some embodiments, after the optical fiber alignment structures 211-1, 211-2, and 211-3 are formed and fabrication of the chip 100 on the wafer 101 is completed, the chip 100 is singulated from the wafer 101 to obtain the singulated chip 100A. In some embodiments, the chip 100 is singulated from the wafer 101 prior to formation of the optical fiber alignment structures 211-1, 211-2, and 211-3. Again, the optical fiber alignment structures 211-1, 211-2, and 211-3 are formed to facilitate positioning, alignment, and connection of optical fibers to the singulated chip 100A, such that when the optical fibers are properly positioned with the optical fiber alignment structures 211-1, 211-2, and 211-3, the cores of the optical fibers are respectively optically edge-coupled to the in-plane (edge) fiber-to-chip optical couplers 205-1, 205-2, 205-3 of the singulated chip 100A. In this manner, light can be coupled from the optical fibers into the in-plane (edge) fiber-to-chip optical couplers 205-1, 205-2, 205-3, and/or vice-versa.

It should be understood that the configuration of the optical waveguides 801B-1, 801B-2, and 801B-3 to connect the out-of-plane fiber-to-chip optical coupler 801A to three in-plane (edge) fiber-to-chip optical couplers 205-1, 205-2, 205-3, as shown in FIG. 8A, is provided by way of example. In various embodiments, the sacrificial optical structure 801 can be configured to include a configuration of optical waveguides that optically connect the out-of-plane fiber-to-chip optical coupler 801A to any number, e.g., 1, 2, 3, 4, or more, of in-plane (edge) fiber-to-chip optical couplers, where each optical waveguide in the configuration of the optical waveguides extends through a corresponding optical fiber attachment region in route to a corresponding in-plane (edge) fiber-to-chip optical coupler.

Figure 9A:
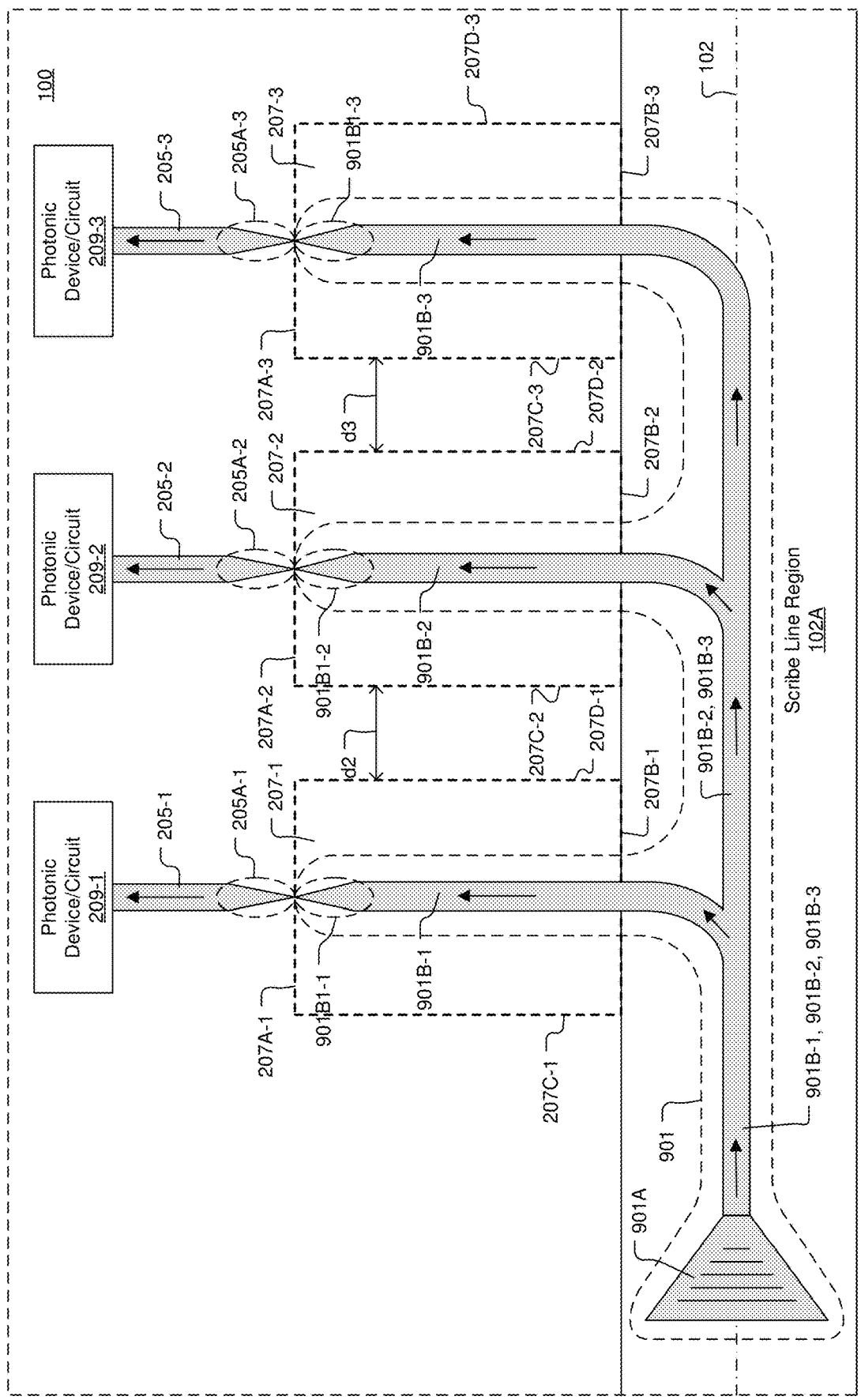
FIG. 9A shows a variation of the embodiment of FIG. 5A in which a sacrificial optical structure includes an out-of-plane fiber-to-chip optical coupler that is formed within the scribe line region, in accordance with some embodiments.

As previously mentioned with regard to FIG. 5A, in some embodiments it may be beneficial to have at least a portion of the sacrificial optical structure formed within the scribe line region 102A on the wafer 101 to enable wafer-level photonic testing of chip(s) 100 formed on the wafer 101. FIG. 9A shows a variation of the embodiment of FIG. 5A in which a sacrificial optical structure 901A includes an out-of-plane fiber-to-chip optical coupler 901A that is formed within the scribe line region 102A, in accordance with some embodiments. Each of the optical waveguides 901B-1, 901B-2, 901B-3 is optically connected to the same out-of-plane fiber-to-chip optical coupler 901A. In some embodiments, the optical waveguides 901B-1, 901B-2, 901B-3 are formed as separate parts of a continuous optical waveguide, such that the optical waveguides 901B-1, 901B-2, 901B-3 are integrally formed together. In some embodiments, one or more of the optical waveguides 901B-1, 901B-2, 901B-3 is/are formed as a separate optical waveguide. Light from the out-of-plane fiber-to-chip optical coupler 901A is distributed to each of the optical waveguides 901B-1, 901B-2, 901B-3. In some embodiments, the multiple optical waveguides 901B-1, 901B-2, 901B-3 are formed physically separate from each other, but close enough to each other so that light will evanescently couple between the optical waveguides 901B-1, 901B-2, 901B-3. The optical waveguides 901B-1, 901B-2, 901B-3 are configured to extend from the out-of-plane fiber-to-chip optical coupler 901A through multiple optical fiber attachment regions 207-1, 207-2, and 207-3 of the chip 100 designated to eventually have the optical fiber alignment structures 211-1, 211-2, and 211-3 fabricated therein, respectively, to facilitate positioning, alignment, and connection of optical fibers to the chip 100. In the example embodiment of FIG. 9A, the optical waveguides 901B-1, 901B-2, 901B-3 extend across exterior edges 207B-1, 207B-2, 207B-3 of the multiple optical fiber attachment regions 207-1, 207-2, and 207-3 of the chip 100.

The optical waveguide 901B-1 is positioned and configured to optically connect to the in-plane (edge) fiber-to-chip optical coupler 205-1 formed with the chip 100. In some embodiments, the optical waveguide 901B-1 is formed to have an inverse optical waveguide taper 901B1-1 that is positioned in an optically coupled manner with the inverse optical waveguide taper 205A-1 of the in-plane (edge) fiber-to-chip optical coupler 205-1. Therefore, the sacrificial optical structure 901 is configured to couple light into the in-plane (edge) fiber-to-chip optical coupler 205-1 of the chip 100, with the chip 100 existing within the intact wafer 101. A portion of the light that is coupled into the out-of-plane fiber-to-chip optical coupler 901A of the sacrificial optical structure 901 is directed through the optical waveguide 901B-1 and into the in-plane (edge) fiber-to-chip optical coupler 205-1, which is connected to one or more photonic device(s)/circuit(s) 209-1 within the chip 100.

Similarly, the optical waveguide 901B-2 is positioned and configured to optically connect to the in-plane (edge) fiber-to-chip optical coupler 205-2 formed with the chip 100. In some embodiments, the optical waveguide 901B-2 is formed to have an inverse optical waveguide taper 901B1-2 that is positioned in an optically coupled manner with an inverse optical waveguide taper 205A-2 of the in-plane (edge) fiber-to-chip optical coupler 205-2. Therefore, the sacrificial optical structure 901 is configured to couple light into the in-plane (edge) fiber-to-chip optical coupler 205-2 of the chip 100, with the chip 100 existing within the intact wafer 101. A portion of the light that is coupled into the out-of-plane fiber-to-chip optical coupler 901A of the sacrificial optical structure 901 is directed through the optical waveguide 901B-2 and into the in-plane (edge) fiber-to-chip optical coupler 205-2, which is connected to one or more photonic device(s)/circuit(s) 209-2 within the chip 100.

Also, the optical waveguide 901B-3 is positioned and configured to optically connect to the in-plane (edge) fiber-to-chip optical coupler 205-3 formed with the chip 100. In some embodiments, the optical waveguide 901B-3 is formed to have an inverse optical waveguide taper 901B1-3 that is positioned in an optically coupled manner with an inverse optical waveguide taper 205A-3 of the in-plane (edge) fiber-to-chip optical coupler 205-3. Therefore, the sacrificial optical structure 901 is configured to couple light into the in-plane (edge) fiber-to-chip optical coupler 205-3 of the chip 100, with the chip 100 existing within the intact wafer 101. A portion of the light that is coupled into the out-of-plane fiber-to-chip optical coupler 901A of the sacrificial optical structure 901 is directed through the optical waveguide 901B-3 and into the in-plane (edge) fiber-to-chip optical coupler 205-3, which is connected to one or more photonic device(s)/circuit(s) 209-3 within the chip 100.

The light that is coupled into the out-of-plane fiber-to-chip optical coupler 901A of the sacrificial optical structure 901 is split into the optical waveguides 901B-1, 901B-2, 901B-3, such that portions of the light are respectively routed to the in-plane (edge) fiber-to-chip optical couplers 205-1, 205-2, 205-3 to provide for photonic testing of the photonic circuit(s)/device(s) 209-1, 209-2, 209-3 that are optically coupled to the in-plane (edge) fiber-to-chip optical couplers 205-1, 205-2, 205-3 within the chip 100. In some embodiments, the sacrificial optical structure 901 is configured such that a substantially equal portion of the light that is coupled into the out-of-plane fiber-to-chip optical coupler 901A is directed into each of the optical waveguides 901B-1, 901B-2, 901B-3. In some embodiments, the sacrificial optical structure 901 is configured such that prescribed portions of the light that is coupled into the out-of-plane fiber-to-chip optical coupler 901A are directed into the optical waveguides 901B-1, 901B-2, 901B-3, respectively. In some embodiments, the sacrificial optical structure 901 is configured such that different amounts of incoming light (the light that is coupled into the out-of-plane fiber-to-chip optical coupler 901A) are directed into different ones of the optical waveguides 901B-1, 901B-2, 901B-3. It should be understood that the sacrificial optical structure 901 enables wafer-level photonic testing of multiple photonic circuit(s)/device(s) 209-1, 209-2, 209-3 on the chip 100 by coupling of light into the same out-of-plane fiber-to-chip optical coupler 901A.

Similar to the sacrificial optical structure 501 of FIG. 5A, the out-of-plane fiber-to-chip optical coupler 901A and portions of the optical waveguides 901B-1, 901B-2, 901B-3 of the sacrificial optical structure 901 are formed within the scribe line region 102A outside of the chip 100 area on the wafer 101. Also, portions of the optical waveguides 901B-1, 901B-2, 901B-3 are formed within corresponding optical fiber attachment regions 207-1, 207-2, 207-3 that are designated for formation of the optical fiber alignment structures 211-1, 211-2, 211-3 to facilitate positioning, alignment, and connection of an optical fibers to the chip 100. It should be understood that the sacrificial optical structure 901 is formed and exists on the chip 100 before the optical fiber alignment structures 211-1, 211-2, 211-3 are formed on the chip 100. Also, the sacrificial optical structure 901 is formed such that the parts of the sacrificial optical structure 901 that are located in the optical fiber attachment regions 207-1, 207-2, 207-3 of the chip 100 are removed from the chip 100 when the optical fiber alignment structures 211-1, 211-2, 211-3 are formed on the chip 100. It should be understood that while the example embodiment of FIG. 9A shows the out-of-plane fiber-to-chip optical coupler 901A of the sacrificial optical structure 901 formed beside the chip 100, in other embodiments, the out-of-plane fiber-to-chip optical coupler 901A of the sacrificial optical structure 901 can be formed within the scribe line region 102A essentially anywhere on the wafer 101, with the optical waveguides 901B-1, 901B-2, 901B-3 routed and connected to the out-of-plane fiber-to-chip optical coupler 901A as needed.

Figure 9B:
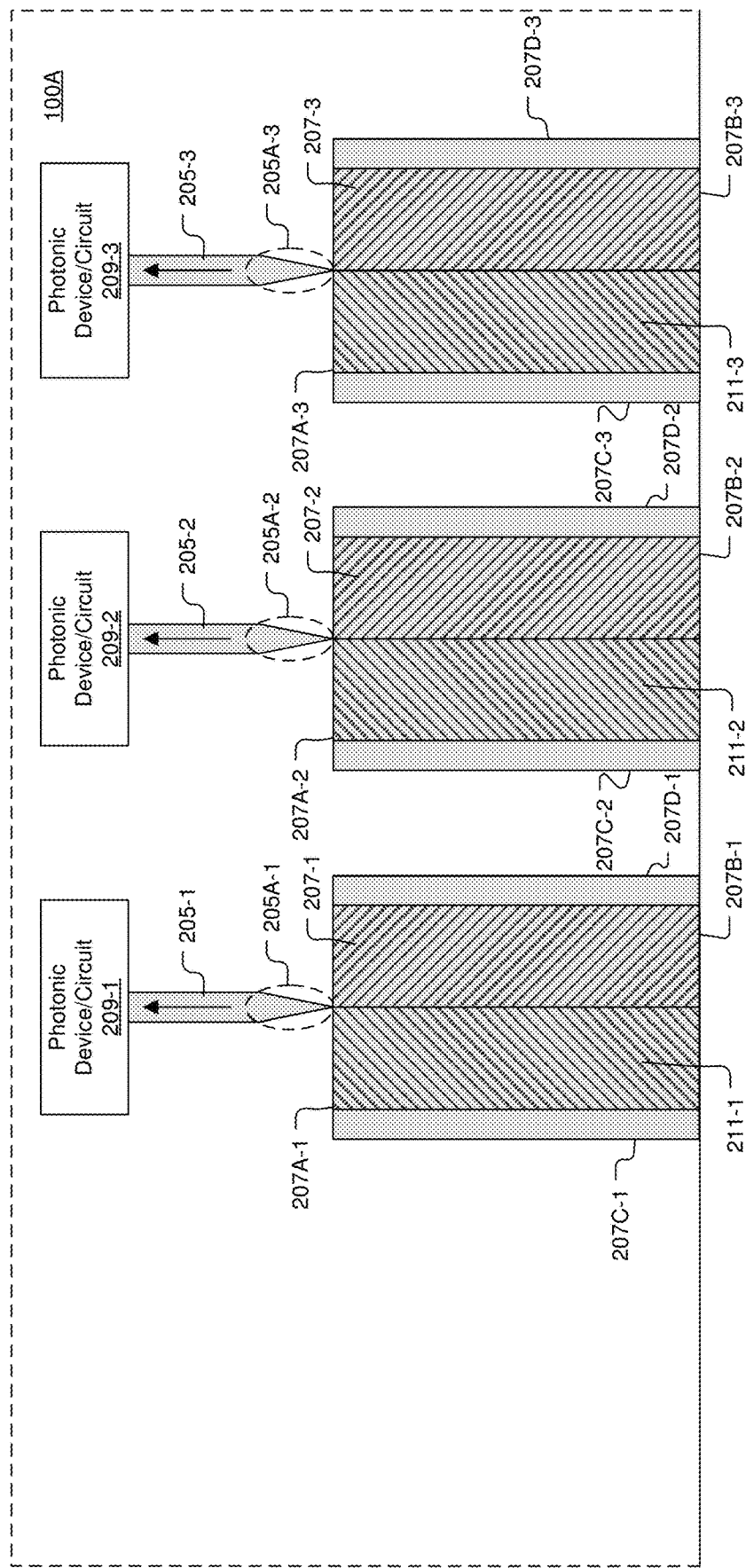
FIG. 9B shows the singulated chip corresponding to the chip of FIG. 9A after formation of the optical fiber alignment structures and singulation of the chip from the wafer, in accordance with some embodiments.

The sacrificial optical structure 901 is used to perform wafer-level photonic testing on the chip 100. After the wafer-level photonic testing of the chip 100 is completed, the optical fiber alignment structures 211-1, 211-2, and 211-3 are formed within the optical fiber attachment regions 207-1, 207-2, and 207-3, respectively, of the chip 100. FIG. 9B shows the singulated chip 100A corresponding to the chip 100 of FIG. 9A after formation of the optical fiber alignment structures 211-1, 211-2, and 211-3, and singulation of the chip 100 from the wafer 101, in accordance with some embodiments. It should be understood that the fabrication process(es) that form the optical fiber alignment structures 211-1, 211-2, and 211-3 and that singulate the chip 100 from the wafer 101 remove/eliminate the sacrificial optical structure 901. In some embodiments, after the optical fiber alignment structures 211-1, 211-2, and 211-3 are formed and fabrication of the chip 100 on the wafer 101 is completed, the chip 101 is singulated from the wafer 101 to obtain the singulated chip 100A. In some embodiments, the chip 100 is singulated from the wafer prior to formation of the optical fiber alignment structures 211-1, 211-2, and 211-3. Singulation of the wafer 101 to obtain the singulated chip 100A includes cutting and/or etching and/or breaking the wafer 101 along the scribe line regions 102A, which eliminates the out-of-plane fiber-to-chip optical coupler 901A and portions of the optical waveguides 901B-1, 901B-2, 901B-3 that exist within the scribe line region 102A. Again, the optical fiber alignment structures 211-1, 211-2, and 211-3 are formed to facilitate positioning, alignment, and connection of optical fibers to the singulated chip 100A, such that when the optical fibers are properly positioned with the optical fiber alignment structures 211-1, 211-2, and 211-3, the cores of the optical fibers are respectively optically edge coupled to the in-plane (edge) fiber-to-chip optical couplers 205-1, 205-2, 205-3 of the singulated chip 100A. In this manner, light can be coupled from the optical fibers into the in-plane (edge) fiber-to-chip optical couplers 205-1, 205-2, 205-3, and/or vice-versa.

It should be understood that the configuration of the optical waveguides 901B-1, 901B-2, and 901B-3 to connect the out-of-plane fiber-to-chip optical coupler 901A to three in-plane (edge) fiber-to-chip optical couplers 205-1, 205-2, 205-3, as shown in FIG. 9A, is provided by way of example. In various embodiments, the sacrificial optical structure 901 can be configured to include a configuration of optical waveguides that optically connect the out-of-plane fiber-to-chip optical coupler 901A to any number, e.g., 1, 2, 3, 4, or more, of in-plane (edge) fiber-to-chip optical couplers, where each optical waveguide in the configuration of the optical waveguides extends through a corresponding optical fiber attachment region in route to a corresponding in-plane (edge) fiber-to-chip optical coupler.

Figure 10A:
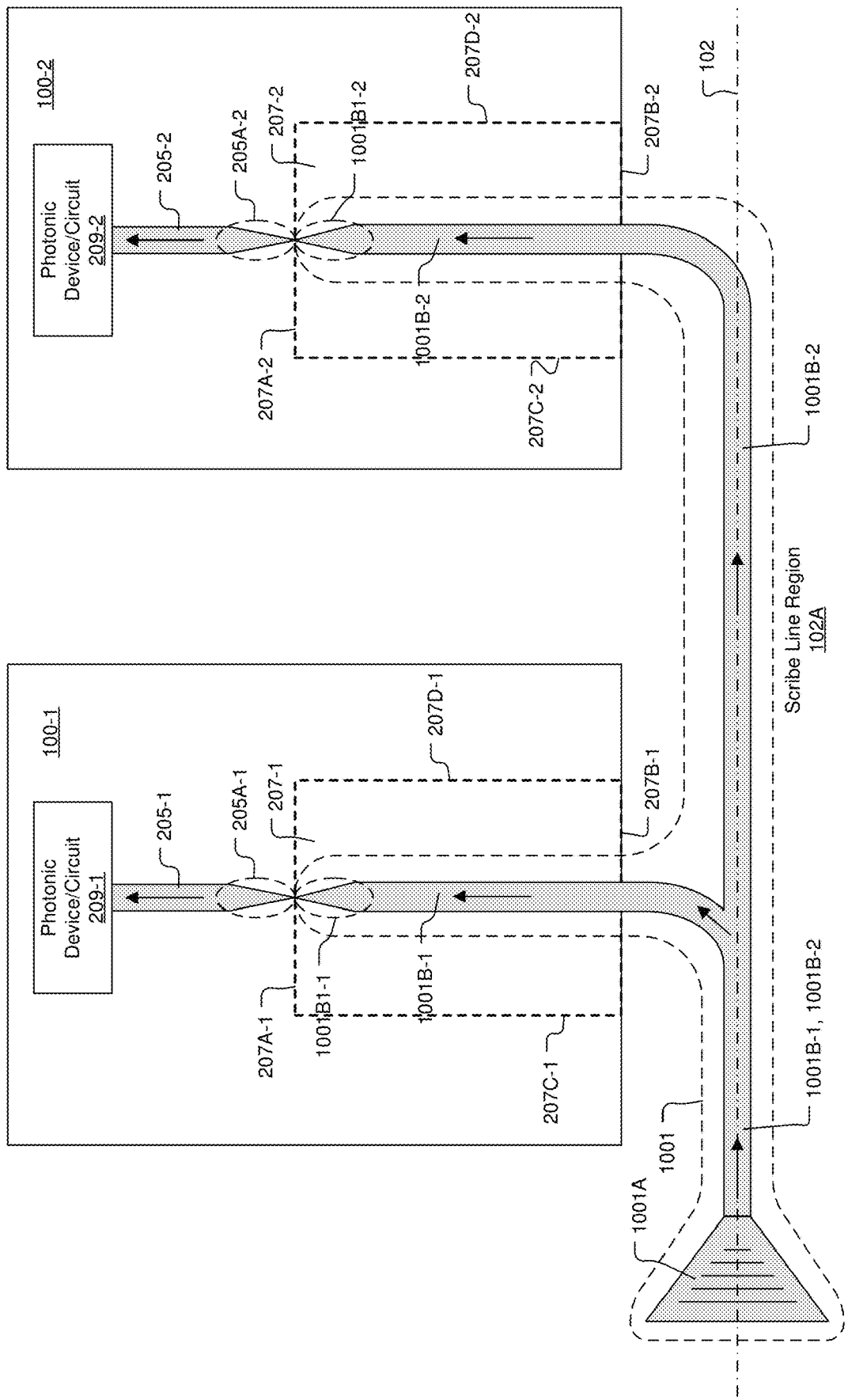
FIG. 10A shows a variation of the embodiment of FIG. 9A in which a sacrificial optical structure includes an out-of-plane fiber-to-chip optical coupler that is formed within the scribe line region and that is connected to couple light into multiple photonic devices/circuits on multiple chips, in accordance with some embodiments.

In some embodiments, to further simplify wafer-level photonic testing, the same out-of-plane fiber-to-chip optical coupler can be used to simultaneously couple light into multiple photonic devices/circuits within multiple chips 100 on the wafer 101. FIG. 10A shows a variation of the embodiment of FIG. 9A in which a sacrificial optical structure 1001 includes an out-of-plane fiber-to-chip optical coupler 1001A that is formed within the scribe line region 102A and that is connected to couple light into multiple photonic devices/circuits on multiple chips 100-1, 100-2, in accordance with some embodiments. The sacrificial optical structure 1001 includes the single out-of-plane fiber-to-chip optical coupler 1001A optically connected to optical waveguides 1001B-1, 1001B-2. Each of the optical waveguides 1001B-1, 1001B-2 is optically connected to the same out-of-plane fiber-to-chip optical coupler 901A. In some embodiments, the optical waveguides 1001B-1, 1001B-2 are formed as separate parts of a continuous optical waveguide, such that the optical waveguides 1001B-1, 1001B-2 are integrally formed together. In some embodiments, one or more of the optical waveguides 1001B-1, 1001B-2 is/are formed as a separate optical waveguide.

Light from the out-of-plane fiber-to-chip optical coupler 901A is distributed to each of the optical waveguides 1001B-1, 1001B-2. In some embodiments, the optical waveguides 1001B-1, 1001B-2 are formed physically separate from each other, but close enough to each other so that light will evanescently couple between the optical waveguides 1001B-1, 1001B-2. The optical waveguides 1001B-1, 1001B-2 are configured to extend from the out-of-plane fiber-to-chip optical coupler 901A through multiple optical fiber attachment regions 207-1, 207-2 of the chip 100 designated to eventually have the optical fiber alignment structures 211-1, 211-2 fabricated therein, respectively, to facilitate positioning, alignment, and connection of optical fibers to the chip 100. In the example embodiment of FIG. 10A, the optical waveguides 1001B-1, 1001B-2 extends across exterior edges 207B-1, 207B-2 of the multiple optical fiber attachment regions 207-1, 207-2 of the chip 100. The sacrificial optical structure 901 enables wafer-level photonic testing of both of the chips 100-1, 100-2.

The optical waveguide 1001B-1 is positioned and configured to optically connect to the in-plane (edge) fiber-to-chip optical coupler 205-1 formed with the chip 100-1. In some embodiments, the optical waveguide 1001B-1 is formed to have an inverse optical waveguide taper 1001B1-1 that is positioned in an optically coupled manner with the inverse optical waveguide taper 205A-1 of the in-plane (edge) fiber-to-chip optical coupler 205-1. Therefore, the sacrificial optical structure 901 is configured to couple light into the in-plane (edge) fiber-to-chip optical coupler 205-1 of the chip 100-1, with the chip 100-1 existing within the intact wafer 101. A portion of the light that is coupled into the out-of-plane fiber-to-chip optical coupler 901A of the sacrificial optical structure 901 is directed through the optical waveguide 1001B-1 and into the in-plane (edge) fiber-to-chip optical coupler 205-1, which is connected to one or more photonic device(s)/circuit(s) 209-1 within the chip 100-1.

Similarly, the optical waveguide 1001B-2 is positioned and configured to optically connect to an in-plane (edge) fiber-to-chip optical coupler 205-2 formed with the chip 100-2. In some embodiments, the optical waveguide 1001B-2 is formed to have an inverse optical waveguide taper 1001B1-2 that is positioned in an optically coupled manner with the inverse optical waveguide taper 205A-2 of the in-plane (edge) fiber-to-chip optical coupler 205-2. Therefore, the sacrificial optical structure 901 is configured to couple light into the in-plane (edge) fiber-to-chip optical coupler 205-2 of the chip 100-2, with the chip 100-2 existing within the intact wafer 101. A portion of the light that is coupled into the out-of-plane fiber-to-chip optical coupler 901A of the sacrificial optical structure 901 is directed through the optical waveguide 1001B-2 and into the in-plane (edge) fiber-to-chip optical coupler 205-2, which is connected to one or more photonic device(s)/circuit(s) 209-2 within the chip 100-2.

The light that is coupled into the out-of-plane fiber-to-chip optical coupler 901A of the sacrificial optical structure 901 is split into the optical waveguides 1001B1, 1001B-2, such that portions of the light are respectively routed to the in-plane (edge) fiber-to-chip optical couplers 205-1, 205-2 to provide for photonic testing of the photonic circuit(s)/device(s) 209-1, 209-2 that are optically coupled to the in-plane (edge) fiber-to-chip optical couplers 205-1, 205-2 within the multiple chips 100-1, 100-2, respectively. In some embodiments, the sacrificial optical structure 901 is configured such that a substantially equal portion of the light that is coupled into the out-of-plane fiber-to-chip optical coupler 901A is directed into each of the optical waveguides 1001B-1, 1001B-2. In some embodiments, the sacrificial optical structure 901 is configured such that prescribed portions of the light that is coupled into the out-of-plane fiber-to-chip optical coupler 901A are directed into the optical waveguides 1001B-1, 1001B-2, respectively. In some embodiments, the sacrificial optical structure 901 is configured such that different amounts of incoming light (the light that is coupled into the out-of-plane fiber-to-chip optical coupler 901A) are directed into different ones of the optical waveguides 1001B-1, 1001B-2. It should be understood that the sacrificial optical structure 901 enables wafer-level photonic testing of multiple photonic circuit(s)/device(s) 209-1, 209-2 on the multiple chips 100-1, 100-2 by coupling of light into the same out-of-plane fiber-to-chip optical coupler 901A.

Similar to the sacrificial optical structure 501 of FIG. 5A, out-of-plane fiber-to-chip optical coupler 901A and portions of the optical waveguides 1001B-1, 1001B-2 of the sacrificial optical structure 901 are formed within the scribe line region 102A outside of the areas occupied by the chips 100-1, 100-2 on the wafer 101. Also, portions of the optical waveguides 1001B-1, 1001B-2 are formed within corresponding optical fiber attachment regions 207-1, 207-2 that are designated for formation of the optical fiber alignment structures 211-1, 211-2 to facilitate positioning, alignment, and connection of an optical fibers to the chips 100-1, 100-2. It should be understood that the sacrificial optical structure 901 is formed and exists on the wafer 101 and the chips 100-1, 100-2 before the optical fiber alignment structures 211-1, 211-2 are formed on the chips 100-1, 100-2, respectively. Also, the sacrificial optical structure 901 is formed such that the parts of the sacrificial optical structure 901 that are located in the optical fiber attachment regions 207-1, 207-2 of the chips 100-1, 100-2, respectively, are removed from the chips 100-1, 100-2 when the optical fiber alignment structures 211-1, 211-2 are formed on the chips 100-1, 100-2. It should be understood that while the example embodiment of FIG. 10A shows the out-of-plane fiber-to-chip optical coupler 901A of the sacrificial optical structure 901 formed beside the chip 100-1, in other embodiments, the out-of-plane fiber-to-chip optical coupler 901A of the sacrificial optical structure 901 can be formed within the scribe line region 102A essentially anywhere on the wafer 101, with the optical waveguides 1001B-1, 1001B-2 routed and connected to the out-of-plane fiber-to-chip optical coupler 901A as needed.

Figure 10B:
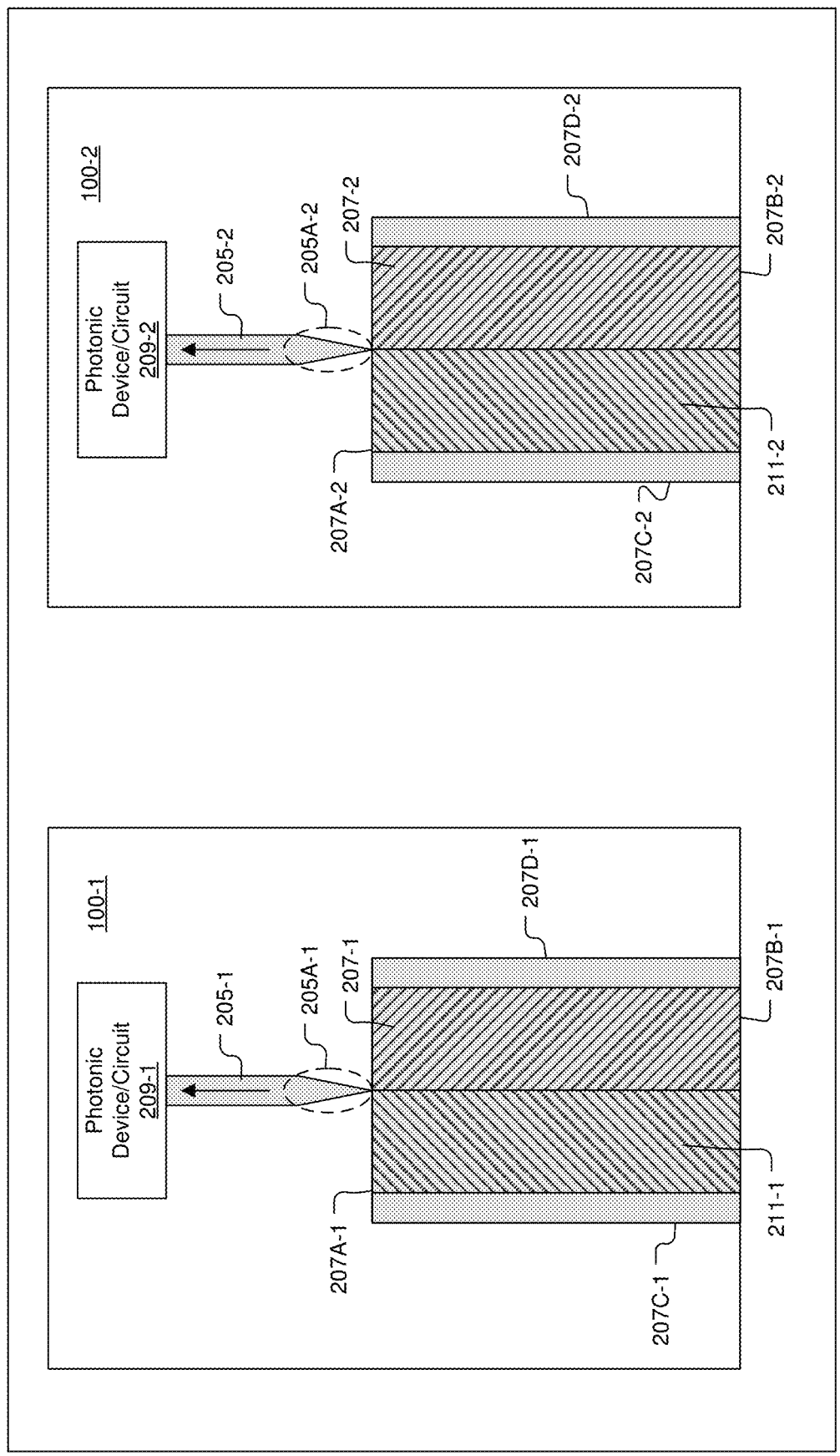
FIG. 10B shows the singulated chips corresponding to the chips of FIG. 10A after formation of the optical fiber alignment structures and singulation of the chips from the wafer, in accordance with some embodiments.

The sacrificial optical structure 901 is used to perform wafer-level photonic testing on each of the multiple chips 100-1, 100-2. After the wafer-level photonic testing of the chips 100-1, 100-2 is completed, the optical fiber alignment structures 211-1, 211-2 are formed within the optical fiber attachment regions 207-1, 207-2, respectively, of the chips 100-1, 100-2. FIG. 10B shows the singulated chips 100A-1, 100A-2 corresponding to the chips 100-1, 100-2, respectively, of FIG. 10A after formation of the optical fiber alignment structures 211-1, 211-2 and singulation of the chips 100-1, 100-2 from the wafer 101, in accordance with some embodiments. It should be understood that the fabrication processes that form the optical fiber alignment structures 211-1, 211-2 and that singulate the chips 100-1, 100-2 from the wafer 101 effectively remove/eliminate the sacrificial optical structure 1001. In some embodiments, after the optical fiber alignment structures 211-1, 211-2 are formed and fabrication of the chips 100-1, 100-2 on the wafer 101 is completed, the chips 100-1, 100-2 are singulated from the wafer 101 to obtain the singulated chips 100-1, 100-2. In some embodiments, the chips 100-1, 100-2 are singulated from the wafer 101 prior to formation of the optical fiber alignment structures 211-1, 211-2. Singulation of the wafer 101 to obtain the singulated chips 100-1, 100-2 includes cutting and/or etching and/or breaking the wafer 101 along the scribe line regions 102A, which eliminates the out-of-plane fiber-to-chip optical coupler 901A and portions of the optical waveguides 1001B-1, 1001B-2 that exist within the scribe line region 102A. Again, the optical fiber alignment structures 211-1, 211-2 are formed to facilitate positioning, alignment, and connection of optical fibers to the singulated chips 100-1, 100-2, respectively, such that when the optical fibers are properly positioned with the optical fiber alignment structures 211-1, 211-2, the cores of the optical fibers are respectively optically edge coupled to the in-plane (edge) fiber-to-chip optical couplers 205-1, 205-2 of the singulated chips 100-1, 100-2, respectively. In this manner, light can be coupled from the optical fibers into the in-plane (edge) fiber-to-chip optical couplers 205-1, 205-2, and/or vice-versa.

It should be understood that the configuration of the optical waveguides 1001B-1 and 1001B-2 to connect the out-of-plane fiber-to-chip optical coupler 1001A to two in-plane (edge) fiber-to-chip optical couplers 205-1, 205-2 in two separate chips 100-1, 100-2, as shown in FIG. 10A, is provided by way of example. In various embodiments, the sacrificial optical structure 1001 can be configured to include a configuration of optical waveguides that optically connect the out-of-plane fiber-to-chip optical coupler 1001A to any number, e.g., 1, 2, 3, 4, or more, of in-plane (edge) fiber-to-chip optical couplers in any number of chips 100 on the wafer 101, where each optical waveguide in the configuration of the optical waveguides extends through a corresponding optical fiber attachment region in route to a corresponding in-plane (edge) fiber-to-chip optical coupler within a corresponding chip 100. Also, in various embodiments, the configuration of the optical waveguides can optically connect the out-of-plane fiber-to-chip optical coupler 1001A to different numbers of in-plane (edge) fiber-to-chip optical couplers in different chips 100 on the wafer 101.

In various embodiments, an optical output of one photonic circuit can be used as an optical input to test another photonic circuit on the same chip 100. For example, while a transmitter photonic circuit on one chip 100 is usually optically connected to communicate with a receiver photonic circuit on a different chip 100, for photonic testing purposes, an optical output of a transmitter photonic circuit can be temporarily directed into an optical input of a receiver photonic circuit on the same chip 100. This can be done by optically connecting the optical output of one photonic circuit to the optical input of another photonic circuit on the same chip 100 through a sacrificial optical waveguide. In some embodiments, such a sacrificial optical waveguide can be routed through one or more portions of the chip 100 designated for subsequent fabrication of an optical fiber alignment structure and/or through one or more scribe line regions 102A on the wafer 101.

Figure 11A:
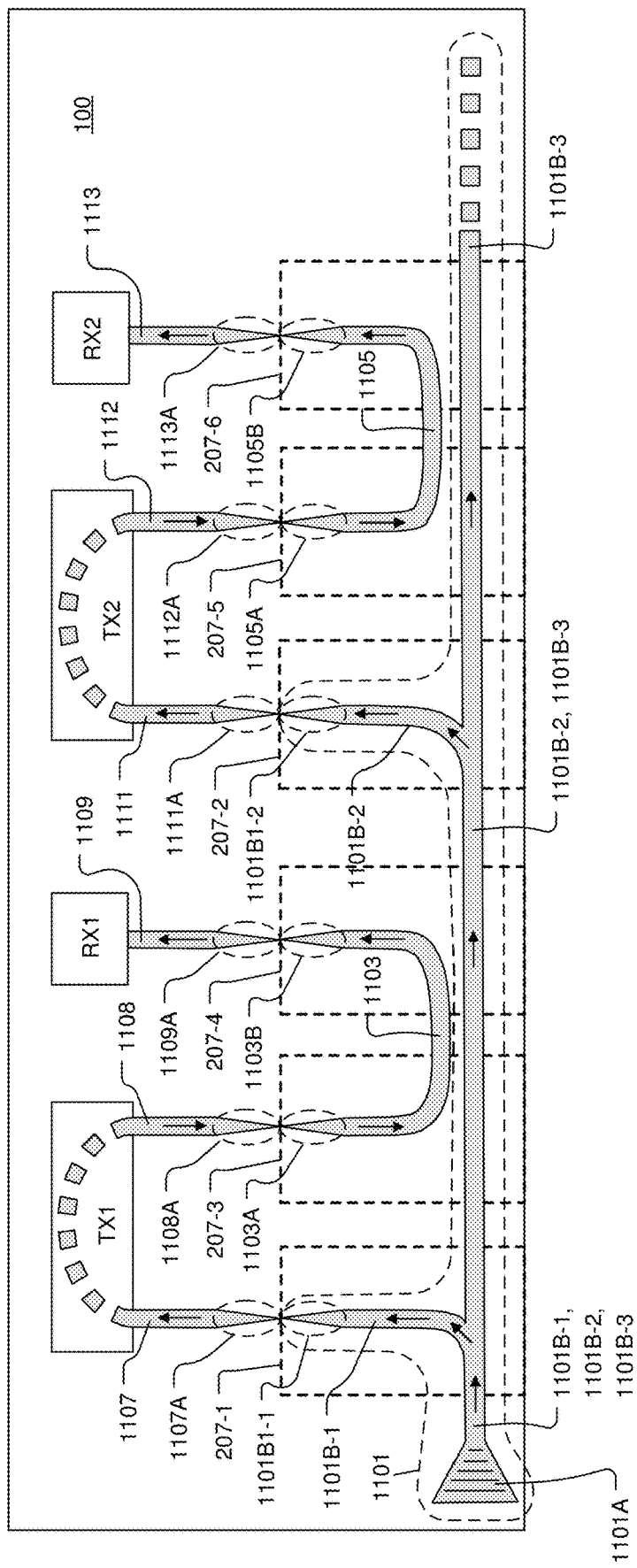
FIG. 11A shows an example chip in which sacrificial optical structures are configured to enable testing of multiple photonic circuits on the same chip, where an optical output of one photonic circuit is used as an optical input to test another photonic circuit, in accordance with some embodiments.

FIG. 11A shows an example chip 100 in which sacrificial optical structures 1101, 1103, 1105 are configured to enable testing of multiple photonic circuits on the same chip 100, where an optical output of one photonic circuit is used as an optical input to test another photonic circuit, in accordance with some embodiments. The example chip 100 of FIG. 11A includes a first transmitter photonic circuit TX1 that has an input optical waveguide 1107 and an output optical waveguide 1108. In some embodiments, the input optical waveguide 1107 includes an inverse optical waveguide taper 1107A. Also, in some embodiments, the output optical waveguide 1108 includes an inverse optical waveguide taper 1108A. The chip 100 also includes a first receiver photonic circuit RX1 that has an input optical waveguide 1109. In some embodiments, the input optical waveguide 1109 includes an inverse optical waveguide taper 1109A.

The chip 100 also includes a second transmitter photonic circuit TX2 that has an input optical waveguide 1111 and an output optical waveguide 1112. In some embodiments, the input optical waveguide 1111 includes an inverse optical waveguide taper 1111A. Also, in some embodiments, the output optical waveguide 1112 includes an inverse optical waveguide taper 1112A. The chip 100 also includes a second receiver photonic circuit RX2 that has an input optical waveguide 1113. In some embodiments, the input optical waveguide 1113 includes an inverse optical waveguide taper 1113A.

The sacrificial optical structure 1101 includes an out-of-plane fiber-to-chip optical coupler 1101A that is formed within a region of the chip 100 that is not designated for fabrication of optical fiber alignment structure. The sacrificial optical structure 1101 enables wafer-level photonic testing of the chip 100. The sacrificial optical structure 1101 includes the single out-of-plane fiber-to-chip optical coupler 1101A optically connected to optical waveguides 1101B-1, 1101B-2, 1101B-3. Each of the optical waveguides 1101B-1, 1101B-2, 1101B-3 is optically connected to the same out-of-plane fiber-to-chip optical coupler 1101A. In some embodiments, the optical waveguides 1101B-1, 1101B-2, 1101B-3 are formed as separate parts of a continuous optical waveguide, such that the optical waveguides 1101B-1, 1101B-2, 1101B-3 are integrally formed together. In some embodiments, one or more of the optical waveguides 1101B-1, 1101B-2, 1101B-3 is/are formed as a separate optical waveguide.

Light from the out-of-plane fiber-to-chip optical coupler 1101A is distributed to each of the optical waveguides 1101B-1, 1101B-2, 1101B-3. In some embodiments, the optical waveguides 1101B-1, 1101B-2, 1101B-3 are formed physically separate from each other, but close enough to each other so that light will evanescently couple between the optical waveguides 1101B-1, 1101B-2, 1101B-3. The optical waveguides 1101B-1, 1101B-2 are configured to extend from the out-of-plane fiber-to-chip optical coupler 1101A through multiple optical fiber attachment regions 207-1, 207-2 of the chip 100 designated to eventually have the optical fiber alignment structures 211-1, 211-2 fabricated therein, respectively, to facilitate positioning, alignment, and connection of optical fibers to the chip 100.

In the example embodiment of FIG. 11A, the optical waveguides 1101B-1, 1101B-2 extends across exterior edges 207B-1, 207B-2 of the multiple optical fiber attachment regions 207-1, 207-2 of the chip 100. The optical waveguides 1101B-1, 1101B-2, 1101B-3 are configured to extend from the out-of-plane fiber-to-chip optical coupler 1101A across multiple optical fiber attachment regions 207-1, 207-2, 207-3, 207-4, 207-5, 207-6 of the chip 100 designated to eventually have optical fiber alignment structures 211-1, 211-2, 211-3, 211-4, 211-5, 211-6, respectively, fabricated therein to facilitate positioning, alignment, and connection of optical fibers to the chip 100. In the example embodiment of FIG. 11A, the optical waveguides 1101B-1, 1101B-2, 1101B-3 extend across lateral edges of the multiple optical fiber attachment regions 207-1, 207-2, 207-3, 207-4, 207-5, 207-6 of the chip 100. However, it should be understood that in some embodiments, the optical waveguides 1101B-1, 1101B-2, 1101B-3 can be configured to extend across interior edges of the multiple optical fiber attachment regions 207-1, 207-2, 207-3, 207-4, 207-5, 207-6 of the chip 100, such as described with regard to FIG. 8A.

The optical waveguide 1101B-1 is positioned and configured to optically connect to the in-plane (edge) fiber-to-chip optical coupler 1107 formed with the chip 100 for the first transmitter photonic circuit TX1. In some embodiments, the optical waveguide 1101B-1 is formed to have an inverse optical waveguide taper 1101B1-1 that is positioned in an optically coupled manner with an inverse optical waveguide taper 1107A of the in-plane (edge) fiber-to-chip optical coupler 1107. Therefore, the sacrificial optical structure 1101 is configured to couple light into the in-plane (edge) fiber-to-chip optical coupler 1107 of the chip 100, with the chip 100 existing within the intact wafer 101. A portion of the light that is coupled into the out-of-plane fiber-to-chip optical coupler 1101A of the sacrificial optical structure 1101 is directed through the optical waveguide 1101B-1 and into the in-plane (edge) fiber-to-chip optical coupler 1107, which is connected to at least the optical input of the first transmitter photonic circuit TX1 within the chip 100.

Similarly, the optical waveguide 1101B-2 is positioned and configured to optically connect to the in-plane (edge) fiber-to-chip optical coupler 1111 formed with the chip 100. In some embodiments, the optical waveguide 1101B-2 is formed to have an inverse optical waveguide taper 1101B 1-2 that is positioned in an optically coupled manner with the inverse optical waveguide taper 1111A of the in-plane (edge) fiber-to-chip optical coupler 1111. Therefore, the sacrificial optical structure 1101 is configured to couple light into the in-plane (edge) fiber-to-chip optical coupler 1111 of the chip 100, with the chip 100 existing within the intact wafer 101. A portion of the light that is coupled into the out-of-plane fiber-to-chip optical coupler 1101A of the sacrificial optical structure 1101 is directed through the optical waveguide 1101B1-2 and into the in-plane (edge) fiber-to-chip optical coupler 1111, which is connected to at least the optical input of the second transmitter photonic circuit TX2 within the chip 100.

The light that is coupled into the out-of-plane fiber-to-chip optical coupler 1101A of the sacrificial optical structure 1101 is split into the optical waveguides 1101B-1, 1101B-2, such that portions of the light are respectively routed to the in-plane (edge) fiber-to-chip optical couplers 1107, 1111 to provide for photonic testing of at least the first and second transmitter photonic circuits TX1 and TX2, respectively, that are optically coupled to the in-plane (edge) fiber-to-chip optical couplers 1107, 1111 within the chip 100. In some embodiments, the sacrificial optical structure 1101 is configured such that a substantially equal portion of the light that is coupled into the out-of-plane fiber-to-chip optical coupler 1101A is directed into each of the optical waveguides 1101B-1, 1101B-2. In some embodiments, the sacrificial optical structure 1101 is configured such that prescribed portions of the light that is coupled into the out-of-plane fiber-to-chip optical coupler 1101A are directed into the optical waveguides 1101B-1, 1101B-2, respectively. In some embodiments, the sacrificial optical structure 1101 is configured such that different amounts of incoming light (the light that is coupled into the out-of-plane fiber-to-chip optical coupler 1101A) are directed into different ones of the optical waveguides 1101B-1, 1101B-2. It should be understood that the sacrificial optical structure 1101 enables wafer-level photonic testing of multiple photonic circuit(s)/device(s) on the chip 100 by coupling of light into the same out-of-plane fiber-to-chip optical coupler 1101A.

The out-of-plane fiber-to-chip optical coupler 1101A of the sacrificial optical structure 1101 is formed at least partially within a region of the chip 100 that is not designated for fabrication of an optical fiber alignment structure. Also, portions of the optical waveguides 1101B-1, 1101B-2 are formed to extend through optical fiber attachment regions 207-1, 207-2, 207-3, 207-4, 207-5, 207-6 of the chip 100 that are designated for formation of respective optical fiber alignment structures 211-1, 211-2, 211-3, 211-4, 211-5, 211-6 therein to facilitate positioning, alignment, and connection of an optical fibers to the chip 100. It should be understood that the sacrificial optical structure 1101 is formed and exists on the chip 100 before the optical fiber alignment structures 211-1, 211-2 are formed on the chip 100. Also, the sacrificial optical structure 1101 is formed such that the parts of the sacrificial optical structure 1101 that are located in the optical fiber attachment regions 207-1, 207-2, 207-3, 207-4, 207-5, 207-6 are removed from the chip 100 when the optical fiber alignment structures 211-1, 211-2, 211-3, 211-4, 211-5, 211-6 are formed on the chip 100. It should be understood that while the example embodiment of FIG. 11A shows the out-of-plane fiber-to-chip optical coupler 1101A of the sacrificial optical structure 1101 formed beside the optical fiber attachment region 207-1 of the chip 100, in other embodiments, the out-of-plane fiber-to-chip optical coupler 1101A of the sacrificial optical structure 1101 can be formed essentially anywhere on the chip 100, with the optical waveguides 1101B-1, 1101B-2, 1101B-3 connected to the out-of-plane fiber-to-chip optical coupler 1101A as needed.

The chip 100 also includes the sacrificial optical structure 1103, which is configured as an optical waveguide that extends from the optical output of the first transmitter photonic circuit TX1 to the optical input of the first receiver photonic circuit RX1. In some embodiments, the optical waveguide of the sacrificial optical structure 1103 is formed to have an inverse optical waveguide taper 1103A that is positioned in an optically coupled manner with the inverse optical waveguide taper 1108A of the in-plane (edge) fiber-to-chip optical coupler 1108. Also, in some embodiments, the optical waveguide of the sacrificial optical structure 1103 is formed to have an inverse optical waveguide taper 1103B that is positioned in an optically coupled manner with the inverse optical waveguide taper 1109A of the in-plane (edge) fiber-to-chip optical coupler 1109. In this manner, the optical waveguide of the sacrificial optical structure 1103 is configured to couple light from the optical output of the first transmitter photonic circuit TX1 to the optical input of the first receiver photonic circuit RX1, with the chip 100 existing within the intact wafer 101. The sacrificial optical structure 1103 is configured to extend through both of the optical fiber attachment regions 207-3 and 207-4 of the chip 100 that are designated for formation of respective optical fiber alignment structures 211-3 and 211-4 to facilitate positioning, alignment, and connection of an optical fibers to the chip 100. Therefore, parts of the sacrificial optical structure 1103 that are located in the optical fiber attachment regions 207-3, 207-4 of the chip 100 are removed from the chip 100 when the optical fiber alignment structures 211-3, 211-4 are formed on the chip 100.

The chip 100 also includes the sacrificial optical structure 1105, which is configured as an optical waveguide that extends from the optical output of the second transmitter photonic circuit TX2 to the optical input of the second receiver photonic circuit RX2. In some embodiments, the optical waveguide of the sacrificial optical structure 1105 is formed to have an inverse optical waveguide taper 1105A that is positioned in an optically coupled manner with the inverse optical waveguide taper 1112A of the in-plane (edge)

fiber-to-chip optical coupler 1112. Also, in some embodiments, the optical waveguide of the sacrificial optical structure 1105 is formed to have an inverse optical waveguide taper 1105B that is positioned in an optically coupled manner with the inverse optical waveguide taper 1113A of the in-plane (edge) fiber-to-chip optical coupler 1113. In this manner, the optical waveguide of the sacrificial optical structure 1105 is configured to couple light from the optical output of the second transmitter photonic circuit TX2 to the optical input of the second receiver photonic circuit RX2, with the chip 100 existing within the intact wafer 101. The sacrificial optical structure 1105 is configured to extend through both of the optical fiber attachment regions 207-5 and 207-6 of the chip 100 that are designated for formation of respective optical fiber attachment structures 211-5 and 211-6 to facilitate positioning, alignment, and connection of an optical fibers to the chip 100. Therefore, parts of the sacrificial optical structure 1105 that are located in the optical fiber attachment regions 207-5, 207-6 of the chip 100 are removed from the chip 100 when the optical fiber alignment structures 211-5, 211-6 are formed on the chip 100.

Figure 11B:
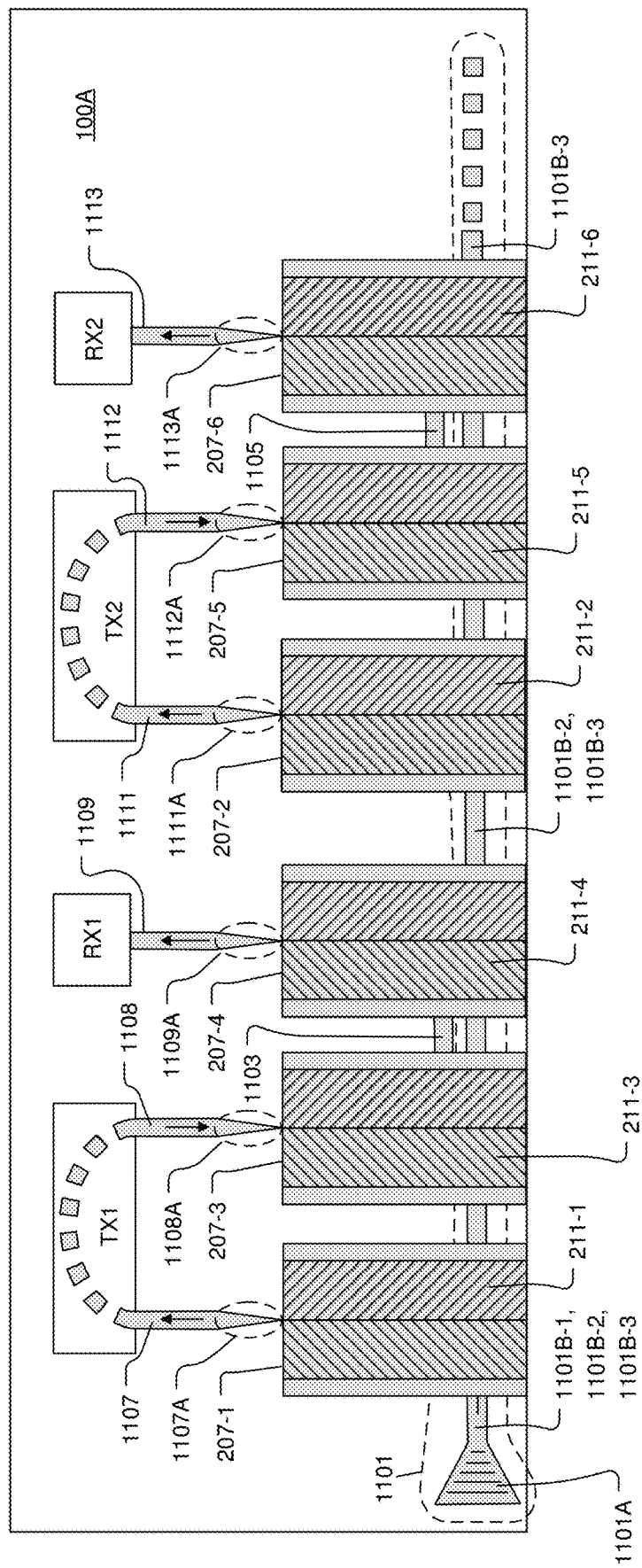
FIG. 11B shows the singulated chip corresponding to the chip of FIG. 11A after formation of the optical fiber alignment structures and singulation of the chip from the wafer, in accordance with some embodiments.

The sacrificial optical structures 1101, 1103, 1105 are used to perform wafer-level photonic testing on the chip 100. After the wafer-level photonic testing of the chip 100 is completed, the optical fiber alignment structures 211-1, 211-2, 211-3, 211-4, 211-5, 211-6 are formed within the optical fiber attachment regions 207-1, 207-2, 207-3, 207-4, 207-5, 207-6, respectively, of the chip 100. FIG. 11B shows the singulated chip 100A corresponding to the chip 100 of FIG. 11A after formation of the optical fiber alignment structures 211-1, 211-2, 211-3, 211-4, 211-5, 211-6, and singulation of the chip 100 from the wafer 101, in accordance with some embodiments. It should be understood that the fabrication process(es) that form the optical fiber alignment structures 211-1, 211-2, 211-3, 211-4, 211-5, 211-6 remove/eliminate portions of the optical waveguides 1101B-1, 1101B-2, 1101B-3 and portions of the sacrificial optical structures 1103 and 1105 that are located within the optical fiber attachment regions 207-1, 207-2, 207-3, 207-4, 207-5, 207-6. In some embodiments, after the optical fiber alignment structures 211-1, 211-2, 211-3, 211-4, 211-5, 211-6 are formed and fabrication of the chip 100 on the wafer is completed, the chip 100 is singulated from the wafer 101 to obtain the singulated chip 100A. In some embodiments, the chip 100 is singulated from the wafer 101 prior to formation of the optical fiber alignment structures 211-1, 211-2, 211-3, 211-4, 211-5, 211-6. Again, the optical fiber alignment structures 211-1, 211-2, 211-3, 211-4, 211-5, 211-6 are formed to facilitate positioning, alignment, and connection of optical fibers to the singulated chip 100A, such that when the optical fibers are properly positioned with the optical fiber alignment structures 211-1, 211-2, 211-3, 211-4, 211-5, 211-6, the cores of the optical fibers are respectively optically edge coupled to the in-plane (edge) fiber-to-chip optical couplers 1107, 1108, 1109, 1111, 1112, 1113 within the singulated chip 100A. In this manner, light can be coupled from the optical fibers into the in-plane (edge) fiber-to-chip optical couplers 1107, 1108, 1109, 1111, 1112, 1113, and/or vice-versa. It should be understood that while the example embodiment of FIG. 11A is described as including two transmitter circuits (Tx1 and Tx2) and two receiver circuits (Rx1 and Rx2), in other embodiments the chip 100 can include any number of transmitter and receiver circuits arranged in a manner similar to the transmitter circuits (TX1, TX2) and receiver circuits (RX1, RX2).

Figure 12A:
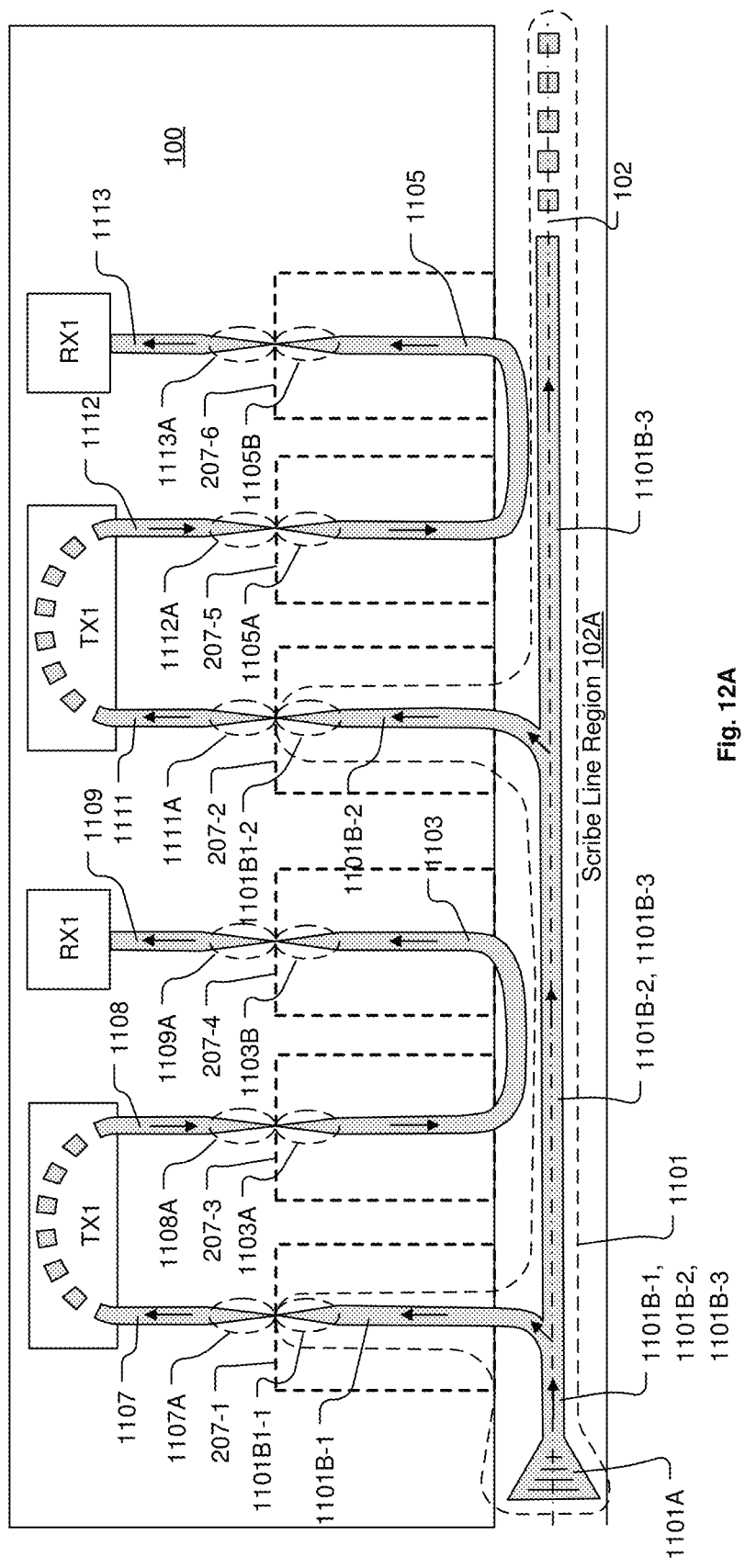
FIG. 12A shows a variation of the chip of FIG. 11A in which each of the sacrificial optical structures is configured to extend through the scribe line region, in accordance with some embodiments.

FIG. 12A shows a variation of the chip 100 of FIG. 11A in which each of the sacrificial optical structures 1101, 1103, 1105 is configured to extend through the scribe line region 102A, in accordance with some embodiments. More specifically, FIG. 12A shows a chip 100 having the sacrificial optical structures 1101, 1103, 1105 as shown in the chip 100 of FIG. 11A, with the exception that the sacrificial optical structures 1101, 1103, 1105 are configured and positioned within the scribe line region 102A and/or within one or more of the optical fiber attachment regions 207-1, 207-2, 207-3, 207-4, 207-5, 207-6 that are designated for subsequent formation of optical fiber alignment structures 211-1, 211-2, 211-3, 211-4, 211-5, 211-6, respectively, to facilitate alignment of optical fibers to the in-plane (edge) fiber-to-chip optical couplers 1107, 1108, 1109, 1111, 1112, 1113.

Figure 12B:
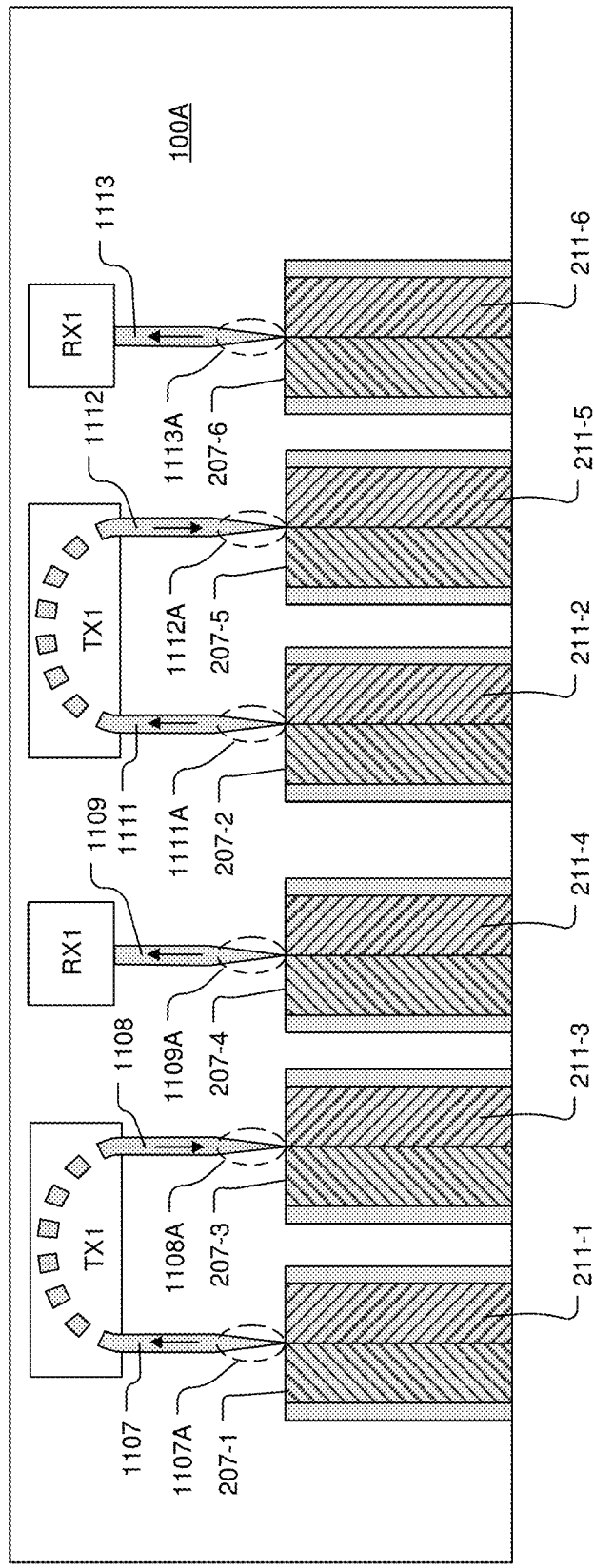
FIG. 12B shows the singulated chip corresponding to the chip of FIG. 12A after formation of the optical fiber alignment structures and singulation of the chip from the wafer, in accordance with some embodiments.

After the wafer-level photonic testing of the chip 100 is completed, the optical fiber alignment structures 211-1, 211-2, 211-3, 211-4, 211-5, 211-6 are formed within the optical fiber attachment regions 207-1, 207-2, 207-3, 207-4, 207-5, 207-6, respectively, of the chip 100. FIG. 12B shows the singulated chip 100A corresponding to the chip 100 of FIG. 12A after formation of the optical fiber alignment structures 211-1, 211-2, 211-3, 211-4, 211-5, 211-6, and singulation of the chip 100 from the wafer 101, in accordance with some embodiments. It should be understood that the fabrication processes that form the optical fiber alignment structures 211-1, 211-2, 211-3, 211-4, 211-5, 211-6 remove/eliminate portions of the optical waveguides 1101B-1, 1101B-2, 1101B-3 and portions of the sacrificial optical structures 1103 and 1105 that are located within the optical fiber attachment regions 207-1, 207-2, 207-3, 207-4, 207-5, 207-6 and within the scribe line region 102A. In some embodiments, after the optical fiber alignment structures 211-1, 211-2, 211-3, 211-4, 211-5, 211-6 are formed and fabrication of the chip 100 on the wafer 101 is completed, the chip 100 is singulated from the wafer 101 to obtain the singulated chip 100A. In some embodiments, the chip 100 is singulated from the wafer 101 prior to formation of the optical fiber alignment structures 211-1, 211-2, 211-3, 211-4, 211-5, 211-6. Singulation of the wafer 101 to obtain the singulated chip 100A includes cutting and/or etching and/or breaking the wafer 101 along the scribe line regions 102A, which eliminates the out-of-plane fiber-to-chip optical coupler 1101A, the portions of the optical waveguides 1101B-1, 1101B-2, 1101B-2, and the portions of the sacrificial optical structures 1103 and 1105 that exist within the scribe line region 102A. Again, the optical fiber alignment structures 211-1, 211-2, 211-3, 211-4, 211-5, 211-6 are formed to facilitate positioning, alignment, and connection of optical fibers to the singulated chip 100A, such that when the optical fibers are properly positioned with the optical fiber alignment structures 211-1, 211-2, 211-3, 211-4, 211-5, 211-6, the cores of the optical fibers are respectively optically edge coupled to the in-plane (edge) fiber-to-chip optical couplers 1107, 1108, 1109, 1111, 1112, 1113 of the singulated chip 100A. In this manner, light can be coupled from the optical fibers into the in-plane (edge) fiber-to-chip optical couplers 1107, 1108, 1109, 1111, 1112, 1113, and/or vice-versa. It should be understood that while the example embodiment of FIG. 12A is described as including two transmitter circuits (Tx1 and Tx2) and two receiver circuits (Rx1 and Rx2), in other embodiments the chip 100 can include any number of transmitter and receiver circuits arranged in a manner similar to the transmitter circuits (TX1, TX2) and receiver circuits (RX1, RX2).

Figure 13A:
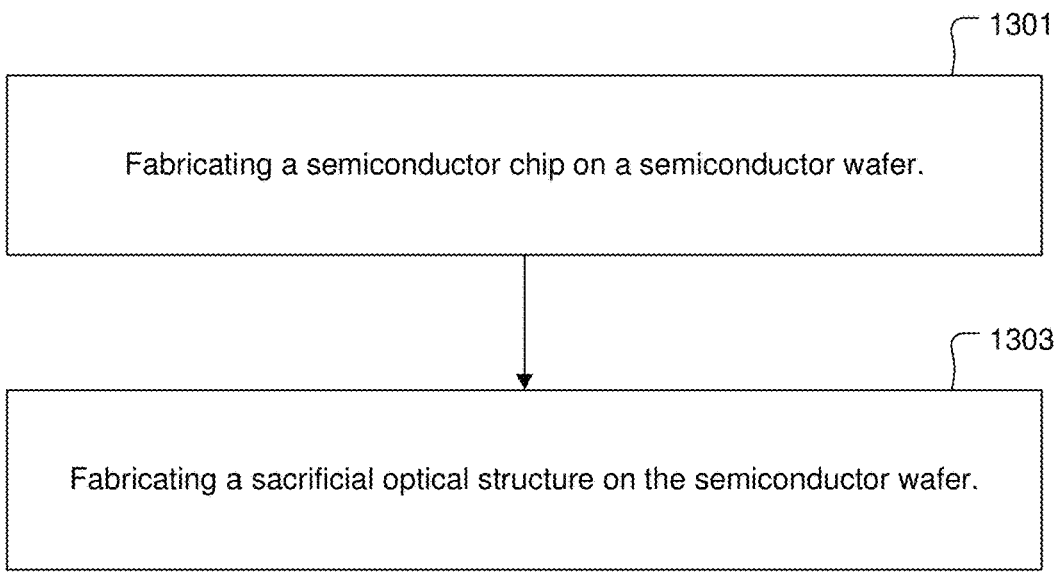
FIG. 13A shows a flowchart of a method for fabricating a semiconductor chip, in accordance with some embodiments.

FIG. 13A shows a flowchart of a method for fabricating a semiconductor chip, in accordance with some embodiments. The method includes an operation 1301 for fabricating a semiconductor chip (100) on a semiconductor wafer (101). The semiconductor chip (100) includes a photonic device (209, 209-x). The semiconductor chip (100) includes an optical fiber attachment region (207, 207-x) in which an optical fiber alignment structure (211, 211-x) is to be fabricated. The semiconductor chip (100) includes an in-plane fiber-to-chip optical coupler (205, 205-x) positioned at an edge of the optical fiber attachment region (207, 207-x). The in-plane fiber-to-chip optical coupler (205, 205-x) is optically connected to the photonic device (209, 209-x). The method also includes an operation 1303 for fabricating a sacrificial optical structure (201, 301, 401, 501, 601, 701, 801, 901, 1001, 1101) on the semiconductor wafer (101). The sacrificial optical structure (201, 301, 401, 501, 601, 701, 801, 901, 1001, 1101) is optically coupled to the in-plane fiber-to-chip optical coupler (205, 205-x). The sacrificial optical structure (201, 301, 401, 501, 601, 701, 801, 901, 1001, 1101) includes an out-of-plane optical coupler (201A, 301A, 401A, 501A, 601A, 701A, 801A, 901A, 1001A, 1101A) configured to receive input light from a light source external to the semiconductor chip (100). At least a portion of the sacrificial optical structure (201, 301, 401, 501, 601, 701, 801, 901, 1001, 1101) extends through the optical fiber attachment region (207, 207-x). The sacrificial optical structure (201, 301, 401, 501, 601, 701, 801, 901, 1001, 1101) is fabricated on the semiconductor wafer (101) before the optical fiber alignment structure (211, 211-x) is fabricated in the optical fiber attachment region (207, 207-x). In some embodiments, operation 1303 includes fabricating an optical waveguide (201B, 201B-x, 301B, 301B-x, 401B, 401B-x, 501B, 501B-x, 601B, 601B-x, 701B, 701B-x, 801B, 801B-x, 901B, 901B-x, 1001B, 1001B-x, 1101B, 1101B-x) that extends through the optical fiber attachment region (207, 207-x) from the out-of-plane optical coupler (201A, 301A, 401A, 501A, 601A, 701A, 801A, 901A, 1001A, 1101A) to the in-plane fiber-to-chip optical coupler (205, 205-x). In some embodiments, the optical waveguide (201B, 201B-x, 301B, 301B-x, 401B, 401B-x, 501B, 501B-x, 601B, 601B-x, 701B, 701B-x, 801B, 801B-x, 901B, 901B-x, 1001B, 1001B-x, 1101B, 1101B-x) and the in-plane fiber-to-chip optical coupler (205, 205-x) are fabricated to have a back-to-back inverse taper at an interface between the optical waveguide and the in-plane fiber-to-chip optical coupler. In some embodiments, the out-of-plane optical coupler (201A, 601A) is located within the optical fiber attachment region (207, 207-x). In some embodiments, an entirety of the optical waveguide (201B) is located within the optical fiber attachment region (207, 207-x).

In some embodiments, the optical fiber attachment region (207, 207-x) is a first optical fiber attachment region in which a first optical fiber alignment structure (211, 211-x) is to be fabricated. Also, the semiconductor chip (100) includes a second optical fiber attachment region (207, 207-x) in which a second optical fiber alignment structure (211, 211-x) is to be fabricated. Also, the sacrificial optical structure (201, 301, 401, 501, 601, 701, 801, 901, 1001, 1101) is fabricated on the semiconductor wafer (100) before the second optical fiber alignment structure (211, 211-x) is fabricated in the second optical fiber attachment region (207, 207-x). Also, the in-plane fiber-to-chip optical coupler (205, 205-x) is a first in-plane fiber-to-chip optical coupler (205, 205-x) optically connected to a first photonic device (209, 209-x) within the semiconductor chip (100). Also, the semiconductor chip (100) is fabricated to include a second in-plane fiber-to-chip optical coupler (205, 205-x) positioned at an edge of the second optical fiber attachment region (207, 207-x). The second in-plane fiber-to-chip optical coupler (205, 205-x) is optically connected to a second photonic device (209, 209-x) within the semiconductor chip (100). Also, the optical waveguide (201B, 201B-x, 301B, 301B-x, 401B, 401B-x, 501B, 501B-x, 601B, 601B-x, 701B, 701B-x, 801B, 801B-x, 901B, 901B-x, 1001B, 1001B-x, 1101B, 1101B-x) is fabricated to extend through the first optical fiber attachment region (207, 207-x) from the out-of-plane optical coupler (201A, 301A, 401A, 501A, 601A, 701A, 801A, 901A, 1001A, 1101A) to the first in-plane fiber-to-chip optical coupler (205, 205-x). Also, the optical waveguide (201B, 201B-x, 301B, 301B-x, 401B, 401B-x, 501B, 501B-x, 601B, 601B-x, 701B, 701B-x, 801B, 801B-x, 901B, 901B-x, 1001B, 1001B-x, 1101B, 1101B-x) is fabricated to extend through the second optical fiber attachment region (207, 207-x) from the out-of-plane optical coupler (201A, 301A, 401A, 501A, 601A, 701A, 801A, 901A, 1001A, 1101A) to the second in-plane fiber-to-chip optical coupler (205, 205-x). In some embodiments, the first optical fiber attachment region (207, 207-x) is separated from the second optical fiber attachment region (207, 207-x) by a distance (d2, d3) greater than zero. In some embodiments, a portion of the optical waveguide (201B, 201B-x, 301B, 301B-x, 401B-x, 501B, 501B-x, 601B, 601B-x, 701B, 701B-x, 801B, 801B-x, 901B, 901B-x, 1001B, 1001B-x, 1101B, 1101B-x) is fabricated to extend between the first optical fiber attachment region (207, 207-x) and the second optical fiber attachment region (207, 207-x).

In some embodiments, the out-of-plane optical coupler (301A, 401A, 501A, 701A, 801A, 901A, 1001A, 1101A) is located within a portion of the semiconductor wafer (101) outside of the optical fiber attachment region (207, 207-x). In some embodiments, the out-of-plane optical coupler (301A, 401A, 701A, 801A, 1101A) is located within a portion of the semiconductor chip (100) outside of the optical fiber attachment region (207, 207-x). In some embodiments, the edge of the optical fiber attachment region (207, 207-x) at which the in-plane fiber-to-chip optical coupler (205, 205-x) is positioned is an interior edge (207A, 207A-x) of the optical fiber attachment region (207, 207-x). Also, the optical fiber attachment region (207, 207-x) includes an exterior edge (207B, 207B-x) adjacent to a scribe line region (102A) of the semiconductor wafer (101). Also, the optical fiber attachment region (207, 207-x) includes a first lateral edge (207C, 207C-x) that extends between a first end of the interior edge (207A, 207A-x) and a first end of the exterior edge (207B, 207B-x). Also, the optical fiber attachment region (207, 207-x) includes a second lateral edge (207D, 207D-x) that extends between a second end of the interior edge (207A, 207A-x) and a second end of the exterior edge (207B, 207B-x). In some embodiments, the optical waveguide (301B, 301B-x, 701B, 701B-x, 1101B, 1101B-x) is fabricated to extend across at least one of the first lateral edge (207C, 207C-x) and the second lateral edge (207D, 207D-x) of the optical fiber attachment region (207, 207-x).

In some embodiments, the optical fiber attachment region (207, 207-x) is a first optical fiber attachment region (207, 207-x) in which a first optical fiber alignment structure (211, 211-x) is to be fabricated. Also, the semiconductor chip (100) includes a second optical fiber attachment region (207, 207-x) in which a second optical fiber alignment structure (211, 211-x) is to be fabricated. The sacrificial optical structure (701, 1101) is fabricated on the semiconductor wafer (101) before the second optical fiber alignment structure (211, 211-x) is fabricated in the second optical fiber attachment region (207, 207-*x*). Also, the in-plane fiber-to-chip optical coupler (205, 205-*x*) is a first in-plane fiber-to-chip optical coupler (205, 205-*x*) optically connected to a first photonic device (209, 209-*x*) within the semiconductor chip (100). The semiconductor chip (100) is fabricated to include a second in-plane fiber-to-chip optical coupler (205, 205-*x*) optically connected to a second photonic device (209, 209-*x*) within the semiconductor chip (100). Also, the second in-plane fiber-to-chip optical coupler (205, 205-*x*) is positioned at an interior edge (207A, 207A-x) of the second optical fiber attachment region (207, 207-*x*). The optical waveguide (701B, 701B-x, 1101B, 1101B-x) is fabricated to extend across at least one of the first lateral edge (207C, 207C-x) and the second lateral edge (207D, 207D-x) of the second optical fiber attachment region (207, 207-*x*). In some embodiments, the first optical fiber attachment region (207, 207-*x*) is separated from the second optical fiber attachment region (207, 207-*x*) by a distance (d2, d3) greater than zero. In some embodiments, a portion of the optical waveguide (701B, 701B-x, 1101B, 1101B-x) is fabricated to extend between the first optical fiber attachment region (207, 207-*x*) and the second optical fiber attachment region (207, 207-*x*).

In some embodiments, the semiconductor chip (100) includes a third optical fiber attachment region (207, 207-*x*) in which a third optical fiber alignment structure (211, 211-*x*) is to be fabricated. The sacrificial optical structure (1101) is fabricated on the semiconductor wafer (101) before the third optical fiber alignment structure (211, 211-*x*) is fabricated in the third optical fiber attachment region (207, 207-*x*). The semiconductor chip (100) is fabricated to include a third in-plane fiber-to-chip optical coupler (205, 205-*x*) optically connected to a third photonic device (209, 209-*x*) within the semiconductor chip (100). The third in-plane fiber-to-chip optical coupler (205, 205-*x*) is positioned at an interior edge (207A, 207A-x) of the third optical fiber attachment region (207, 207-*x*). Also, the semiconductor chip (100) includes a fourth optical fiber attachment region (207, 207-*x*) in which a fourth optical fiber alignment structure (211, 211-*x*) is to be fabricated. The sacrificial optical structure (1101) is fabricated on the semiconductor wafer (101) before the fourth optical fiber alignment structure (211, 211-*x*) is fabricated in the fourth optical fiber attachment region (207, 207-*x*). The semiconductor chip (100) is fabricated to include a fourth in-plane fiber-to-chip optical coupler (205, 205-*x*) optically connected to a fourth photonic device (209, 209-*x*) within the semiconductor chip (100). The fourth in-plane fiber-to-chip optical coupler (205, 205-*x*) is positioned at an interior edge (207A, 207A-x) of the fourth optical fiber attachment region (207, 207-*x*). The sacrificial optical structure (1101) is a first sacrificial optical structure (1101) and the optical waveguide (1101B, 1101B-x) is a first optical waveguide (1101B, 1101B-x). Also, the semiconductor chip (100) is fabricated to include a second sacrificial optical structure (1103, 1105) that includes a second optical waveguide. The second optical waveguide is fabricated to extend from the third in-plane fiber-to-chip optical coupler (205, 205-*x*) through both the third and fourth optical fiber attachment regions (207, 207-*x*) to the fourth in-plane fiber-to-chip optical coupler (205, 205-*x*). In some embodiments, the third optical fiber attachment region (207, 207-*x*) includes an exterior edge (207B, 207B-x) adjacent to the scribe line region (102A) of the semiconductor wafer (101). The second optical waveguide (1103, 1105) is fabricated to not extend across the exterior edge (207B, 207B-x) of the third optical fiber attachment region (207, 207-*x*). Also, the fourth optical fiber attachment region (207, 207-*x*) includes an exterior edge (207B, 207B-x) adjacent to the scribe line region (102A) of the semiconductor wafer (101). The second optical waveguide (1103, 1105) is fabricated to not extend across the exterior edge (207B, 207B-x) of the fourth optical fiber attachment region (207, 207-*x*). In some embodiments, the third optical fiber attachment region (207, 207-*x*) includes a first lateral edge (207C, 207C-x) that extends between a first end of the interior edge (207A, 207A-x) of the third optical fiber attachment region (207, 207-*x*) and a first end of the exterior edge (207B, 207B-x) of the third optical fiber attachment region (207, 207-*x*). The third optical fiber attachment region (207, 207-*x*) includes a second lateral edge (207D, 207D-x) that extends between a second end of the interior edge (207A, 207A-x) of the third optical fiber attachment region (207, 207-*x*) and a second end of the exterior edge (207B, 207B-x) of the third optical fiber attachment region (207, 207-*x*). Also, the fourth optical fiber attachment region (207, 207-*x*) includes a first lateral edge (207C, 207C-x) that extends between a first end of the interior edge (207A, 207A-x) of the fourth optical fiber attachment region (207, 207-*x*) and a first end of the exterior edge (207B, 207B-x) of the fourth optical fiber attachment region (207, 207-*x*). The fourth optical fiber attachment region (207, 207-*x*) includes a second lateral edge (207D, 207D-x) that extends between a second end of the interior edge (207A, 207A-x) of the fourth optical fiber attachment region (207, 207-*x*) and a second end of the exterior edge (207B, 207B-x) of the fourth optical fiber attachment region (207, 207-*x*). Also, the second optical waveguide (1103, 1105) is fabricated to extend across at least one of the first lateral edge (207C, 207C-x) and the second lateral edge (207D, 207D-x) of the third optical fiber attachment region (207, 207-*x*). Also, the second optical waveguide (1103, 1105) is fabricated to extend across at least one of the first lateral edge (207C, 207C-x) and the second lateral edge (207D, 207D-x) of the fourth optical fiber attachment region (207, 207-*x*).

In some embodiments, the optical waveguide (401B, 401B-x, 801B, 801B-x) is fabricated to extend across the interior edge (207A, 207A-x) of the optical fiber attachment region (207, 207-*x*). In some embodiments, the optical waveguide (401B, 401B-x, 801B, 801B-x) is fabricated to not extend across the exterior edge (207B, 207B-x) of the optical fiber attachment region (207, 207-*x*). In some embodiments, the optical waveguide (401B, 401B-x, 801B, 801B-x) is fabricated to not extend across the first lateral edge (207C, 207C-x) of the optical fiber attachment region (207, 207-*x*). Also, the optical waveguide (401B, 401B-x, 801B, 801B-x) is fabricated to not extend across the second lateral edge (207D, 207D-x) of the optical fiber attachment region (207, 207-*x*).

In some embodiments, the optical fiber attachment region (207, 207-*x*) is a first optical fiber attachment region (207, 207-*x*) in which a first optical fiber alignment structure (211, 211-*x*) is to be fabricated. The semiconductor chip (100) includes a second optical fiber attachment region (207, 207-*x*) in which a second optical fiber alignment structure (211, 211-*x*) is to be fabricated. The sacrificial optical structure (801) is fabricated on the semiconductor wafer (101) before the second optical fiber alignment structure (211, 211-*x*) is fabricated in the second optical fiber attachment region (207, 207-*x*). Also, the in-plane fiber-to-chip optical coupler (205, 205-*x*) is a first in-plane fiber-to-chip optical coupler (205, 205-*x*) optically connected to a first photonic device (209, 209-*x*) within the semiconductor chip (100). The semiconductor chip (100) is fabricated to include a second in-plane fiber-to-chip optical coupler (205, 205-*x*) optically connected to a second photonic device (209, 209-*x*)

within the semiconductor chip (100). Also, the second in-plane fiber-to-chip optical coupler (205, 205-*x*) is positioned at an interior edge (207A, 207A-*x*) of the second optical fiber attachment region (207, 207-*x*). Also, optical waveguide (801B, 801B-*x*) is fabricated to extend across the interior edge (207A, 207A-*x*) of the second optical fiber attachment region (207, 207-*x*). In some embodiments, the second optical fiber attachment region (207, 207-*x*) includes an exterior edge (207B, 207B-*x*) adjacent to the scribe line region (102A) of the semiconductor wafer (101). The optical waveguide (801B, 801B-*x*) is fabricated to not extend across the exterior edge (207B, 207B-*x*) of the second optical fiber attachment region (207, 207-*x*). In some embodiments, the second optical fiber attachment region (207, 207-*x*) includes a first lateral edge (207C, 207C-*x*) that extends between a first end of the interior edge (207A, 207A-*x*) of the second optical fiber attachment region (207, 207-*x*) and a first end of the exterior edge (207B, 207B-*x*) of the second optical fiber attachment region (207, 207-*x*). The second optical fiber attachment region (207, 207-*x*) includes a second lateral edge (207D, 207D-*x*) that extends between a second end of the interior edge (207A, 207A-*x*) of the second optical fiber attachment region (207, 207-*x*) and a second end of the exterior edge (207B, 207B-*x*) of the second optical fiber attachment region (207, 207-*x*). Also, the optical waveguide (801B, 801B-*x*) is fabricated to not extend across the first lateral edge (207C, 207C-*x*) of the second optical fiber attachment region (207, 207-*x*). Also, the optical waveguide (801B, 801B-*x*) is fabricated to not extend across the second lateral edge (207D, 207D-*x*) of the second optical fiber attachment region (207, 207-*x*).

In some embodiments, the out-of-plane optical coupler (501A, 901A, 1001A, 1101A) is located within a scribe line region (102A) of the semiconductor wafer (101). In some embodiments, the edge of the optical fiber attachment region (207, 207-*x*) at which the in-plane fiber-to-chip optical coupler (205, 205-*x*) is positioned is an interior edge (207A, 207A-*x*) of the optical fiber attachment region (207, 207-*x*). The optical fiber attachment region (207, 207-*x*) includes an exterior edge (207B, 207B-*x*) adjacent to a scribe line region (102A) of the semiconductor wafer (101). The optical waveguide (501B, 501B-*x*, 901B, 901B-*x*, 1001B, 1001B-*x*, 1101B, 1101B-*x*) is fabricated to extend across the exterior edge (207B, 207B-*x*) of the optical fiber attachment region (207, 207-*x*). In some embodiments, the optical fiber attachment region (207, 207-*x*) includes a first lateral edge (207C, 207C-*x*) that extends between a first end of the interior edge (207A, 207A-*x*) and a first end of the exterior edge (207B, 207B-*x*). The optical fiber attachment region (207, 207-*x*) includes a second lateral edge (207D, 207D-*x*) that extends between a second end of the interior edge (207A, 207A-*x*) and a second end of the exterior edge (207B, 207B-*x*). Also, the optical waveguide (501B, 501B-*x*, 901B, 901B-*x*, 1001B, 1001B-*x*, 1101B, 1101B-*x*) is fabricated to not extend across either the first lateral edge (207C, 207C-*x*) or the second lateral edge (207D, 207D-*x*) of the optical fiber attachment region (207, 207-*x*).

In some embodiments, the optical fiber attachment region (207, 207-*x*) is a first optical fiber attachment region (207, 207-*x*) in which a first optical fiber alignment structure (211, 211-*x*) is to be fabricated. And, the semiconductor chip (100) includes a second optical fiber attachment region (207, 207-*x*) in which a second optical fiber alignment structure (211, 211-*x*) is to be fabricated. The sacrificial optical structure (901, 1101) is fabricated on the semiconductor wafer (101) before the second optical fiber alignment structure (211, 211-*x*) is fabricated in the second optical fiber attachment region (207, 207-*x*). Also, the in-plane fiber-to-chip optical coupler (205, 205-*x*) is a first in-plane fiber-to-chip optical coupler (205, 205-*x*) optically connected to a first photonic device (209, 209-*x*) within the semiconductor chip (100). Also, the semiconductor chip (100) is fabricated to include a second in-plane fiber-to-chip optical coupler (205, 205-*x*) positioned at an interior edge (207A, 207A-*x*) of the second optical fiber attachment region (207, 207-*x*). The second in-plane fiber-to-chip optical coupler (205, 205-*x*) optically connected to a second photonic device (209, 209-*x*) within the semiconductor chip (100). Also, the optical waveguide (901B, 901B-*x*, 1101B, 1101B-*x*) is fabricated to extend from the out-of-plane optical coupler (901A, 1101A) across an exterior edge (207B, 207B-*x*) of the second optical fiber attachment region (207, 207-*x*) and through the second optical fiber attachment region (207, 207-*x*) to the second in-plane fiber-to-chip optical coupler (205, 205-*x*). In some embodiments, the second optical fiber attachment region (207, 207-*x*) includes a first lateral edge (207C, 207C-*x*) that extends between a first end of the interior edge (207A, 207A-*x*) of the second optical fiber attachment region (207, 207-*x*) and a first end of the exterior edge (207B, 207B-*x*) of the second optical fiber attachment region (207, 207-*x*). The second optical fiber attachment region (207, 207-*x*) includes a second lateral edge (207D, 207D-*x*) that extends between a second end of the interior edge (207A, 207A-*x*) of the second optical fiber attachment region (207, 207-*x*) and a second end of the exterior edge (207B, 207B-*x*) of the second optical fiber attachment region (207, 207-*x*). Also, the optical waveguide (901B, 901B-*x*, 1101B, 1101B-*x*) is fabricated to not extend across either the first lateral edge (207C, 207C-*x*) or the second lateral edge (207D, 207D-*x*) of the second optical fiber attachment region (207, 207-*x*).

In some embodiments, the semiconductor chip (100) includes a third optical fiber attachment region (207, 207-*x*) in which a third optical fiber alignment structure (211, 211-*x*) is to be fabricated. The sacrificial optical structure (1101) is fabricated on the semiconductor wafer (101) before the third optical fiber alignment structure (211, 211-*x*) is fabricated in the third optical fiber attachment region (207, 207-*x*). The semiconductor chip (100) is fabricated to include a third in-plane fiber-to-chip optical coupler (205, 205-*x*) optically connected to a third photonic device (209, 209-*x*) within the semiconductor chip (100). The third in-plane fiber-to-chip optical coupler (205, 205-*x*) is positioned at an interior edge (207A, 207A-*x*) of the third optical fiber attachment region (207, 207-*x*). Also, the semiconductor chip (100) includes a fourth optical fiber attachment region (207, 207-*x*) in which a fourth optical fiber alignment structure (211, 211-*x*) is to be fabricated. The sacrificial optical structure (1101) is fabricated on the semiconductor wafer (101) before the fourth optical fiber alignment structure (211, 211-*x*) is fabricated in the fourth optical fiber attachment region (207, 207-*x*). The semiconductor chip (100) is fabricated to include a fourth in-plane fiber-to-chip optical coupler (205, 205-*x*) optically connected to a fourth photonic device (209, 209-*x*) within the semiconductor chip (100). The fourth in-plane fiber-to-chip optical coupler (205, 205-*x*) is positioned at an interior edge (207A, 207A-*x*) of the fourth optical fiber attachment region (207, 207-*x*). Also, the sacrificial optical structure (1101) is a first sacrificial optical structure (1101) and the optical waveguide (1101B, 1101B-*x*) is a first optical waveguide (1101B, 1101B-*x*). The semiconductor chip (100) is fabricated to include a second sacrificial optical structure (1103, 1105) that includes a second optical waveguide fabricated to extend from the third in-plane fiber-to-chip optical coupler (205, 205-x) through both the third and fourth optical fiber attachment regions (207, 207-x) to the fourth in-plane fiber-to-chip optical coupler (205, 205-x). In some embodiments, the third optical fiber attachment region (207, 207-x) includes an exterior edge (207B, 207B-x) adjacent to the scribe line region (102A) of the semiconductor wafer (101). The fourth optical fiber attachment region (207, 207-x) includes an exterior edge (207B, 207B-x) adjacent to the scribe line region (102A) of the semiconductor wafer (101). The second optical waveguide is fabricated to extend across the exterior edge (207B, 207B-x) of the third optical fiber attachment region (207, 207-x), through the scribe line region (102A), and across the exterior edge (207B, 207B-x) of the fourth optical fiber attachment region (207, 207-x). In some embodiments, the third optical fiber attachment region (207, 207-x) includes a first lateral edge (207C, 207C-x) that extends between a first end of the interior edge (207A, 207A-x) of the third optical fiber attachment region (207, 207-x) and a first end of the exterior edge (207B, 207B-x) of the third optical fiber attachment region (207, 207-x). The third optical fiber attachment region (207, 207-x) includes a second lateral edge (207D, 207D-x) that extends between a second end of the interior edge (207A, 207A-x) of the third optical fiber attachment region (207, 207-x) and a second end of the exterior edge (207B, 207B-x) of the third optical fiber attachment region (207, 207-x). The fourth optical fiber attachment region (207, 207-x) includes a first lateral edge (207C, 207C-x) that extends between a first end of the interior edge (207A, 207A-x) of the fourth optical fiber attachment region (207, 207-x) and a first end of the exterior edge (207B, 207B-x) of the fourth optical fiber attachment region (207, 207-x). The fourth optical fiber attachment region (207, 207-x) includes a second lateral edge (207D, 207D-x) that extends between a second end of the interior edge (207A, 207A-x) of the fourth optical fiber attachment region (207, 207-x) and a second end of the exterior edge (207B, 207B-x) of the fourth optical fiber attachment region (207, 207-x). The second optical waveguide is fabricated to not extend across either of the first lateral edge (207C, 207C-x) or the second lateral edge (207D, 207D-x) of the third optical fiber attachment region (207, 207-x). Also, the second optical waveguide is fabricated to not extend across either of the first lateral edge (207C, 207C-x) or the second lateral edge (207D, 207D-x) of the fourth optical fiber attachment region (207, 207-x).

In some embodiments, the semiconductor chip (100) is a first semiconductor chip (100-1) and the photonic device (209, 209-x) is a first photonic device (209, 209-x). The optical fiber attachment region (207, 207-x) is a first optical fiber attachment region (207, 207-x) and the optical fiber alignment structure (211, 211-x) is a first optical fiber alignment structure (211, 211-x). The in-plane fiber-to-chip optical coupler (205, 205-x) is a first in-plane fiber-to-chip optical coupler (205, 205-x). In some embodiments, the method further includes fabricating a second semiconductor chip (100-2) on the semiconductor wafer (101). The second semiconductor chip (100-2) is fabricated to include a second photonic device (209, 209-x). The second semiconductor chip (100-2) including a second optical fiber attachment region (207, 207-x) in which a second optical fiber alignment structure (211, 211-x) is to be fabricated. The sacrificial optical structure (1001) is fabricated on the semiconductor wafer (101) before the second optical fiber alignment structure (211, 211-x) is fabricated in the second optical fiber attachment region (207, 207-x). The second semiconductor chip (100-2) is fabricated to include a second in-plane fiber-to-chip optical coupler (205, 205-x) positioned at an interior edge (207A, 207A-x) of the second optical fiber attachment region (207, 207-x). The second in-plane fiber-to-chip optical coupler (205, 205-x) is optically connected to the second photonic device (209, 209-x). The second optical fiber attachment region (207, 207-x) includes an exterior edge (207B, 207B-x) adjacent to the scribe line region (102A) of the semiconductor wafer (101). The optical waveguide (1001B, 1001B-x) is fabricated to extend across the exterior edge (207B, 207B-x) of the second optical fiber attachment region (207, 207-x). In some embodiments, the second optical fiber attachment region (207, 207-x) includes a first lateral edge (207C, 207C-x) that extends between a first end of the interior edge (207A, 207A-x) of the second optical fiber attachment region (207, 207-x) and a first end of the exterior edge (207B, 207B-x) of the second optical fiber attachment region (207, 207-x). The second optical fiber attachment region (207, 207-x) includes a second lateral edge (207D, 207D-x) that extends between a second end of the interior edge (207A, 207A-x) of the second optical fiber attachment region (207, 207-x) and a second end of the exterior edge (207B, 207B-x) of the second optical fiber attachment region (207, 207-x). The optical waveguide (1001B, 1001B-x) is fabricated to not extend across either the first lateral edge (207C, 207C-x) or the second lateral edge (207D, 207D-x) of the second optical fiber attachment region (207, 207-x).

Figure 13B:
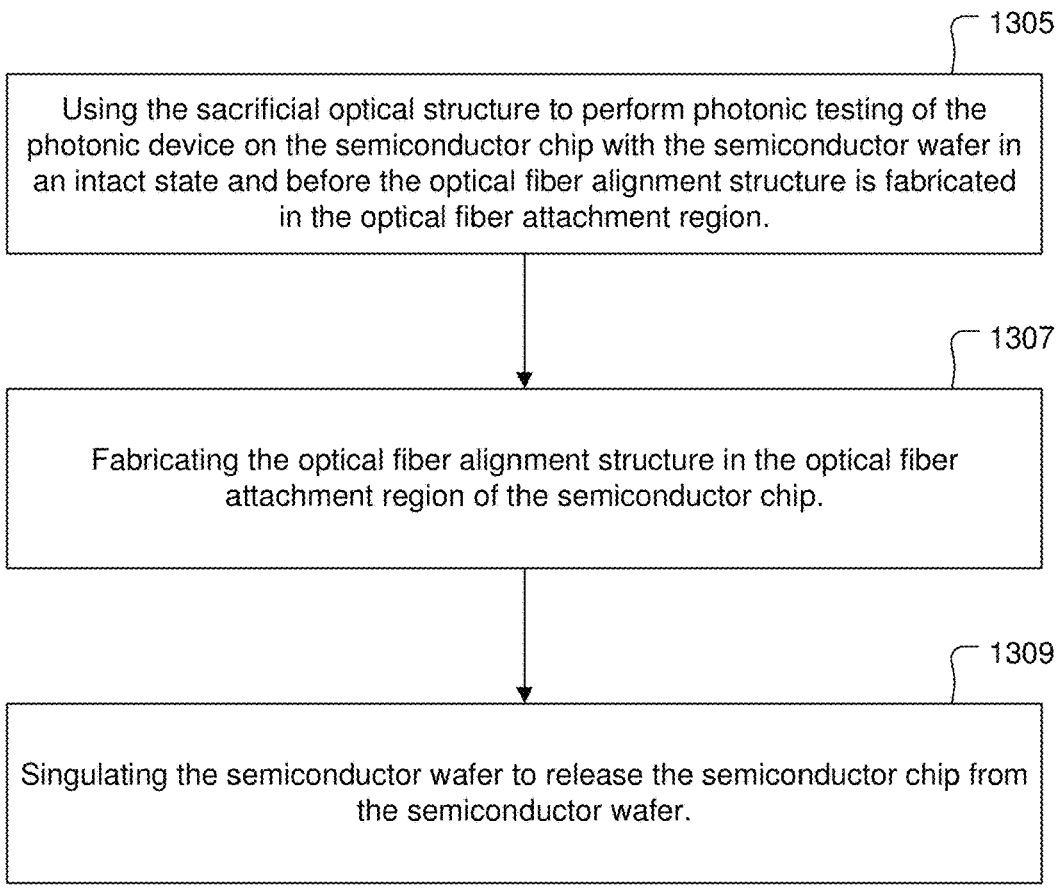
FIG. 13B shows a flowchart of a continuation of the method of FIG. 13A for fabricating the semiconductor chip, in accordance with some embodiments.

FIG. 13B shows a flowchart of a continuation of the method of FIG. 13A for fabricating the semiconductor chip, in accordance with some embodiments. The method includes an operation 1305 for using the sacrificial optical structure (201, 301, 401, 501, 601, 701, 801, 901, 1001, 1101) to perform photonic testing of the photonic device (209, 209-x) on the semiconductor chip (100) with the semiconductor wafer (101) in an intact state and before the optical fiber alignment structure (211, 211-x) is fabricated in the optical fiber attachment region (207, 207-x). The method also includes an operation 1307 for fabricating the optical fiber alignment structure (211, 211-x) in the optical fiber attachment region (207, 207-x) of the semiconductor chip (100). The operation 1307 is performed after the operation 1305. In some embodiments, fabricating the optical fiber alignment structure (211, 211-x) in the optical fiber attachment region (207, 207-x) of the semiconductor chip (100) disables the sacrificial optical structure (201, 301, 401, 501, 601, 701, 801, 901, 1001, 1101). In some embodiments, fabricating the optical fiber alignment structure (211, 211-x) in the optical fiber attachment region (207, 207-x) of the semiconductor chip (100) eliminates at least a portion of the sacrificial optical structure (201, 301, 401, 501, 601, 701, 801, 901, 1001, 1101). The method further includes an operation 1309 for singulating the semiconductor wafer (101) to release the semiconductor chip (100) from the semiconductor wafer (101). In some embodiments, the operation 1309 is performed after using the sacrificial optical structure (201, 301, 401, 501, 601, 701, 801, 901, 1001, 1101) to perform photonic testing of the photonic device (209, 209-x) on the semiconductor chip (100). In some embodiments, singulating the semiconductor wafer (101) in operation 1309 disables the sacrificial optical structure (201, 301, 401, 501, 601, 701, 801, 901, 1001, 1101). In some embodiments, singulating the semiconductor wafer (101) in operation 1309 eliminates at least a portion of the sacrificial optical structure (201, 301, 401, 501, 601, 701, 801, 901, 1001, 1101).

It should be understood that any of the embodiments disclosed herein can be combined and used together on a same wafer 101. Also, it should be understood that any of the sacrificial optical structures described herein can be modified to extend to any number of photonics circuits on either the same chip 100 or on different chips 100. Also, in some embodiments, any of the sacrificial optical structures described herein can be modified to include both portion(s) that extend through one or more scribe line regions 102A and portion(s) that extend through one or more chips 100. Additionally, in some embodiments, any of the sacrificial optical structures described herein can include one or more portions that exist within a region of the wafer 101 that is not designated as a chip 100 or as a scribe line region 102A. For example, in some embodiments, any of the sacrificial optical structures described herein can include one or more portions that exist within so-called "unused" region(s) of the wafer 101, where "unused" refers to not used for fabrication of a completely viable chip 100.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A method for fabricating a semiconductor chip, comprising:
    fabricating a semiconductor chip on a semiconductor wafer, the semiconductor chip including a photonic device, the semiconductor chip including an optical fiber attachment region in which an optical fiber alignment structure is to be fabricated, the semiconductor chip including an in-plane fiber-to-chip optical coupler positioned at an edge of the optical fiber attachment region, the in-plane fiber-to-chip optical coupler optically connected to the photonic device; and
    fabricating a sacrificial optical structure on the semiconductor wafer, the sacrificial optical structure optically coupled to the in-plane fiber-to-chip optical coupler, the sacrificial optical structure including an out-of-plane optical coupler formed in a portion of the semiconductor wafer outside of the optical fiber attachment region, the out-of-plane optical coupler configured to receive input light from a light source external to the semiconductor chip, at least a portion of the sacrificial optical structure extending through the optical fiber attachment region, wherein the sacrificial optical structure is fabricated on the semiconductor wafer before the optical fiber alignment structure is fabricated in the optical fiber attachment region.

2. The method as recited in claim 1, further comprising:
    using the sacrificial optical structure to perform photonic testing of the photonic device on the semiconductor chip with the semiconductor wafer in an intact state and before the optical fiber alignment structure is fabricated in the optical fiber attachment region.

3. The method as recited in claim 2, further comprising:
    after using the sacrificial optical structure to perform photonic testing of the photonic device on the semiconductor chip, fabricating the optical fiber alignment structure in the optical fiber attachment region of the semiconductor chip.

4. The method as recited in claim 3, wherein fabricating the optical fiber alignment structure in the optical fiber attachment region of the semiconductor chip disables the sacrificial optical structure.

5. The method as recited in claim 4, wherein fabricating the optical fiber alignment structure in the optical fiber attachment region of the semiconductor chip eliminates at least a portion of the sacrificial optical structure.

6. The method as recited in claim 2, further comprising:
    after using the sacrificial optical structure to perform photonic testing of the photonic device on the semiconductor chip, singulating the semiconductor wafer to release the semiconductor chip from the semiconductor wafer.

7. The method as recited in claim 6, wherein singulating the semiconductor wafer disables the sacrificial optical structure.

8. The method as recited in claim 7, wherein singulating the semiconductor wafer eliminates at least a portion of the sacrificial optical structure.

9. The method as recited in claim 1, wherein fabricating the sacrificial optical structure includes fabricating an optical waveguide that extends through the optical fiber attachment region from the out-of-plane optical coupler to the in-plane fiber-to-chip optical coupler.

10. The method as recited in claim 9, wherein the out-of-plane optical coupler is located within the optical fiber attachment region.

11. The method as recited in claim 10, wherein an entirety of the optical waveguide is located within the optical fiber attachment region.

12. The method as recited in claim 10, wherein the optical fiber attachment region is a first optical fiber attachment region in which a first optical fiber alignment structure is to be fabricated, wherein the semiconductor chip includes a second optical fiber attachment region in which a second optical fiber alignment structure is to be fabricated, wherein the sacrificial optical structure is fabricated on the semiconductor wafer before the second optical fiber alignment structure is fabricated in the second optical fiber attachment region,
    wherein the in-plane fiber-to-chip optical coupler is a first in-plane fiber-to-chip optical coupler optically connected to a first photonic device within the semiconductor chip, wherein the semiconductor chip is fabricated to include a second in-plane fiber-to-chip optical coupler positioned at an edge of the second optical fiber attachment region, the second in-plane fiber-to-chip optical coupler optically connected to a second photonic device within the semiconductor chip,
    wherein the optical waveguide is fabricated to extend through the first optical fiber attachment region from the out-of-plane optical coupler to the first in-plane fiber-to-chip optical coupler, and wherein the optical waveguide is fabricated to extend through the second optical fiber attachment region from the out-of-plane optical coupler to the second in-plane fiber-to-chip optical coupler.

13. The method as recited in claim 12, wherein the first optical fiber attachment region is separated from the second optical fiber attachment region by a distance greater than zero.

14. The method as recited in claim 13, wherein a portion of the optical waveguide is fabricated to extend between the first optical fiber attachment region and the second optical fiber attachment region.

15. The method as recited in claim 9, wherein the out-of-plane optical coupler is located within a portion of the semiconductor wafer outside of the optical fiber attachment region.

16. The method as recited in claim 15, wherein the optical waveguide is fabricated to extend through a scribe line region of the semiconductor wafer.

17. The method as recited in claim 15, wherein the out-of-plane optical coupler is located within a scribe line region of the semiconductor wafer.

18. The method as recited in claim 17, wherein the edge of the optical fiber attachment region at which the in-plane fiber-to-chip optical coupler is positioned is an interior edge of the optical fiber attachment region, wherein the optical fiber attachment region includes an exterior edge adjacent to the scribe line region of the semiconductor wafer, wherein the optical waveguide is fabricated to extend across the exterior edge of the optical fiber attachment region.

19. The method as recited in claim 18, wherein the semiconductor chip is a first semiconductor chip and the photonic device is a first photonic device, wherein the optical fiber attachment region is a first optical fiber attachment region and the optical fiber alignment structure is a first optical fiber alignment structure, wherein the in-plane fiber-to-chip optical coupler is a first in-plane fiber-to-chip optical coupler, wherein the method further includes fabricating a second semiconductor chip on the semiconductor wafer, the second semiconductor chip fabricated to include a second photonic device, the second semiconductor chip including a second optical fiber attachment region in which a second optical fiber alignment structure is to be fabricated, wherein the sacrificial optical structure is fabricated on the semiconductor wafer before the second optical fiber alignment structure is fabricated in the second optical fiber attachment region, wherein the second semiconductor chip is fabricated to include a second in-plane fiber-to-chip optical coupler positioned at an interior edge of the second optical fiber attachment region, the second in-plane fiber-to-chip optical coupler optically connected to the second photonic device, wherein the second optical fiber attachment region includes an exterior edge adjacent to the scribe line region of the semiconductor wafer, wherein the optical waveguide is fabricated to extend across the exterior edge of the second optical fiber attachment region.

20. The method as recited in claim 19, wherein the second optical fiber attachment region includes a first lateral edge that extends between a first end of the interior edge of the second optical fiber attachment region and a first end of the exterior edge of the second optical fiber attachment region, wherein the second optical fiber attachment region includes a second lateral edge that extends between a second end of the interior edge of the second optical fiber attachment region and a second end of the exterior edge of the second optical fiber attachment region, and wherein the optical waveguide is fabricated to not extend across either the first lateral edge or the second lateral edge of the second optical fiber attachment region.

* * * * *